(12) United States Patent
Huang et al.

(10) Patent No.: US 12,550,383 B2
(45) Date of Patent: Feb. 10, 2026

(54) DOUBLE GATE FERROELECTRIC FIELD EFFECT TRANSISTOR DEVICES AND METHODS FOR FORMING THE SAME

(71) Applicant: Taiwan Semiconductor Manufacturing Company Limited, Hsinchu (TW)

(72) Inventors: Yen-Chieh Huang, Changhua County (TW); Song-Fu Liao, Taipei (TW); Po-Ting Lin, Taichung (TW); Hai-Ching Chen, Hsinchu (TW); Sai-Hooi Yeong, Hsinchu (TW); Yu-Ming Lin, Hsinchu (TW); Chung-Te Lin, Taiwan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 55 days.

(21) Appl. No.: 18/366,826

(22) Filed: Aug. 8, 2023

(65) Prior Publication Data
US 2023/0411522 A1     Dec. 21, 2023

Related U.S. Application Data

(62) Division of application No. 17/480,463, filed on Sep. 21, 2021, now Pat. No. 11,908,936.
(Continued)

(51) Int. Cl.
H10D 30/69     (2025.01)
H10D 30/60     (2025.01)
(Continued)

(52) U.S. Cl.
CPC ......... *H10D 30/701* (2025.01); *H10D 30/611* (2025.01); *H10D 30/6755* (2025.01);
(Continued)

(58) Field of Classification Search
CPC ............ H10D 30/701; H10D 30/0415; H10D 30/611; H10D 64/033; H10D 64/689
See application file for complete search history.

(56) References Cited

U.S. PATENT DOCUMENTS

2002/0054522 A1* 5/2002 Inoue .................... H10D 86/00
257/E21.663
2010/0140589 A1* 6/2010 Ionescu ............ H10D 30/0415
257/295

(Continued)

OTHER PUBLICATIONS

Korean Patent and Trademark Office, Application No. 10-2022-0049668; Office Action, mailed May 13, 2024, 12 pages.
(Continued)

*Primary Examiner* — Vincent Wall
(74) *Attorney, Agent, or Firm* — The Marbury Law Group, PLLC

(57) ABSTRACT

A ferroelectric field effect transistor (FeFET) having a double-gate structure includes a first gate electrode, a first ferroelectric material layer over the first gate electrode, a semiconductor channel layer over the first ferroelectric material layer, source and drain electrodes contacting the semiconductor channel layer, a second ferroelectric material layer over the semiconductor channel layer, and a second gate electrode over the second ferroelectric material layer.

20 Claims, 46 Drawing Sheets

Related U.S. Application Data

(60) Provisional application No. 63/180,245, filed on Apr. 27, 2021.

(51) Int. Cl.
*H10D 30/67* (2025.01)
*H10D 64/23* (2025.01)
*H10D 64/68* (2025.01)
*H10D 99/00* (2025.01)

(52) U.S. Cl.
CPC ......... *H10D 64/258* (2025.01); *H10D 64/691* (2025.01); *H10D 99/00* (2025.01)

(56) References Cited

U.S. PATENT DOCUMENTS

| | | | | |
|---|---|---|---|---|
| 2012/0276694 | A1* | 11/2012 | Koezuka | H01L 21/02609 |
| | | | | 438/151 |
| 2014/0266324 | A1* | 9/2014 | Teo | H10D 62/8503 |
| | | | | 327/109 |
| 2014/0355328 | A1* | 12/2014 | Muller | G11C 11/2275 |
| | | | | 257/295 |
| 2016/0141366 | A1* | 5/2016 | Lai | H10D 30/6757 |
| | | | | 438/157 |
| 2019/0165120 | A1* | 5/2019 | Sato | H10D 64/685 |
| 2020/0105940 | A1 | 4/2020 | Majhi et al. | |
| 2020/0203381 | A1 | 6/2020 | Rabkin et al. | |
| 2020/0235244 | A1* | 7/2020 | Doyle | H10D 30/701 |
| 2020/0388685 | A1* | 12/2020 | Sharma | H10D 62/83 |
| 2020/0411695 | A1* | 12/2020 | Sung | H10D 64/689 |
| 2021/0020433 | A1* | 1/2021 | Yoon | H01L 21/02181 |
| 2021/0184025 | A1* | 6/2021 | Xu | H10D 62/822 |
| 2021/0249539 | A1* | 8/2021 | Zhu | H10D 64/689 |
| 2022/0344513 | A1* | 10/2022 | Huang | H10D 30/611 |

OTHER PUBLICATIONS

Sibylle Gemming et al., Materials for Tomorrow, Springer Series in Materials Science(SSMATERIALS, vol. 93), 208 pages, Dec. 2013, https://www.researchgate.net/publication/227059514.

Taiwanese Patent and Trademark Office, Application No. 111108990, Office Action, mailed Jan. 13, 2023, 5 pages.

Korean Patent and Trademark Office, Application No. 10-2022-0049668; Office Action, mailed Aug. 31, 2023, 7 pages.

Cho et al. "Achieving a Low-Voltage, High-Mobility IGZO Transistor through an ALD-Derived Bilayer Channel and a Hafnia-Based Gate Dielectric Stack", ACS Applied Materials & Interfaces; www.acsami.org; ACS Appl. Mater. Interfaces 2021, 13, 16628-16640 (13 pages).

Estandia et al. "Domain-Matching Epitaxy of Ferroelectric Hf0.5Zr0.5O2(111) on La2/3Sr1/3MnO3(001)"; Crystal Growth & Design; Cryst. Growth Des. 2020, 20, 3801-3806 (6 pages).

CN Patent and Trademark Office; CN Application No. 202210278564.6; Office Action mailed Nov. 5, 2025; 12 pages.

\* cited by examiner

DOUBLE GATE FERROELECTRIC FIELD EFFECT TRANSISTOR DEVICES AND METHODS FOR FORMING THE SAME

RELATED APPLICATIONS

This application is a divisional application of U.S. patent application Ser. No. 17/480,463 entitled "Double Gate Ferroelectric Field Effect Transistor Devices and Methods of Forming the Same," filed on Sep. 21, 2021, which claims priority from U.S. Provisional Patent Application No. 63/180,245 entitled "Double Gate FEFET Memory Structure," filed on Apr. 27, 2021, the entire contents both of which are hereby incorporated by reference for all purposes.

BACKGROUND

Ferroelectric (FE) memory is a candidate for next generation non-volatile memory benefits due to its fast write/read speed, low power consumption and small size. However, it may be difficult to integrate FE materials with commonly utilized semiconductor device materials and structures while maintaining suitable ferroelectric properties and device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
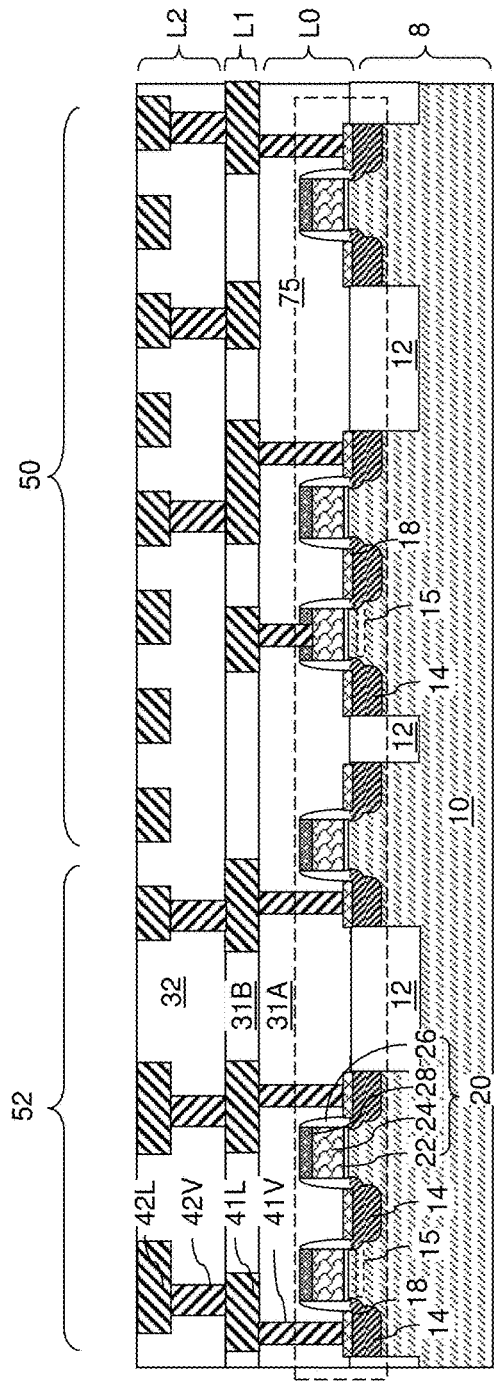
FIG. 1A is a vertical cross-sectional view of a first exemplary structure prior to formation of an array of memory devices according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to ferroelectric (FE) structures, including metal-ferroelectric-semiconductor (MFS) structures, and specifically, to memory cells, transistors, and memory structures that include FE materials.

Various embodiments are directed to ferroelectric field effect transistor (FeFET) structures and methods for making the same. FeFETs are emerging devices, in which a FE layer is utilized as a gate insulating layer between a gate electrode and a channel region of a semiconductor material layer. Permanent electrical field polarization in the FE layer causes this type of device to retain the transistor's state (on or off) in the absence of any electrical bias.

A ferroelectric material is a material that may have spontaneous nonzero electrical polarization (i.e., non-zero total electrical dipole moment) when the external electrical field is zero. The spontaneous electrical polarization may be reversed by a strong external electric field applied in the opposite direction. The electrical polarization is dependent not only on the external electrical field at the time of measurement, but also on the history of the external electrical field, and thus, has a hysteresis loop. The maximum of the electrical polarization is referred to as saturation polarization. The electrical polarization that remains after an external electrical field that induces saturation polarization is no longer applied (i.e., turned off) is referred to as remnant polarization. The magnitude of the electrical field that needs to be applied in the opposite direction of the remnant polarization in order to achieve zero polarization is referred to as coercive electrical field.

In some embodiments, a ferroelectric (FE) structure, such as a FeFET structure, may form a memory cell of a memory array. In a FeFET-based memory cell, the FE material located between the gate electrode and the channel region of the semiconductor material layer may have two stable remnant polarization states. In one remnant polarization state, the FeFET may be permanently in an "on" state, and in the other remnant polarization state, the FeFET may be permanently in an "off" state. Thus, the polarization state of the FE layer may be used to encode information (i.e., bits) in a non-volatile manner. The logic state of the FeFET-based memory cell may be read non-destructively by sensing the resistance across the terminals (e.g., source and drain terminals) of the FeFET. The difference between the threshold voltage of the FeFET in the "on" state and in the "off" state may be referred to as the "memory window" (MW) of the FeFET-based memory cell.

To re-program the FeFET-based memory cell, a sufficiently high voltage may be applied to the FeFET to induce the polarization state of the FE material to reverse and thereby change the logic state of the FeFET memory cell.

For the purposes of forming ferroelectric-based memory devices, it is generally desirable to have high remnant polarization and high coercive electrical field. High remnant polarization may increase the magnitude of an electrical signal. A high coercive electrical field makes the memory devices more stable against perturbations caused by noise-level electrical field and interferences. It is also desirable to have ferroelectric-based memory devices, such as FeFET-based memory devices, having a relatively large memory window (MW) and a high on-current, $I_{on}$, to help ensure that the logic states of the memory cells are correctly interpreted during a read operation.

The fabrication of FeFETs using thin film transistor (TFT) technologies and structures, including the use of oxide semiconductors, is an attractive option for back-end-of-line (BEOL) integration since TFTs may be processed at low temperatures and thus, will not damage previously fabricated devices. However, to date it has proven difficult to integrate ferroelectric gate oxides with oxide semiconductor channels while maintaining adequate ferroelectric properties and device performance.

Accordingly, various embodiments provide ferroelectric structures, including ferroelectric field effect transistors (FeFETs), and methods of forming ferroelectric structures, having improved ferroelectric properties and device performance. In particular, various embodiments include FeFET devices having a double gate structure including a first ferroelectric material layer disposed between a first gate electrode and a first side of a channel layer, and a second ferroelectric material layer disposed between a second gate electrode and a second side of the channel layer that is opposite the first side of the channel layer. In various embodiments, the channel layer may be a metal oxide semiconductor channel layer.

In various embodiments, a FeFET device having a double gate structure may be operated in a common gate control mode in which a common gate voltage may be simultaneously applied to both the first gate electrode and the second gate electrode. This may provide a FeFET-based memory device having increased polarization, memory window, and on-current, $I_{on}$.

Alternatively or in addition, a FeFET device having a double gate structure may be operated in a separated gate control mode in which different voltages may be selectively applied to the first gate electrode and the second gate electrode. In various embodiments, a first pair of source and drain electrodes may electrically contact the first side of the channel layer, and a second pair of source and drain electrodes may electrically contact the second side of the channel layer. The first gate electrode, the first ferroelectric material layer, the first pair of source and drain electrodes, and the channel layer may provide a first FeFET memory cell, and the second gate electrode, the second ferroelectric material layer, the second pair of source and drain electrodes and the channel layer may provide a second FeFET memory cell. In some embodiments, the first FeFET memory cell may be a primary memory cell and the second FeFET memory cell may be a secondary or back-up memory cell. In instances in which the first (i.e., primary) FeFET memory cell fails or loses functionality, a FeFET device operating in a separated gate control mode may utilize the second (i.e., back-up) memory cell to store and/or retrieve logic state information. This may provide a memory device having improved reliability and performance.

Referring to FIG. 1A, a vertical cross-sectional view of a first exemplary structure according to an embodiment of the present disclosure is illustrated prior to formation of an array of memory structures, according to various embodiments of the present disclosure. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 50 in which at least one array of non-volatile memory cells may be subsequently formed.

The exemplary structure may also include a peripheral logic region 52 in which electrical connections between each array of non-volatile memory cells and a peripheral circuit including field effect transistors may be subsequently formed. Areas of the memory array region 50 and the logic region 52 may be employed to form various elements of the peripheral circuit.

Semiconductor devices such as field effect transistors (FETs) may be formed on, and/or in, the semiconductor material layer 10 during a front-end-of-line (FEOL) operation. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. Complementary metal-oxide-semiconductor (CMOS) circuits 75 may be provided on the semiconductor material layer 10, which may include a periphery circuit for the array(s) of transistors, such as thin film transistors (TFTs), and memory devices to be subsequently formed.

Various interconnect-level structures may be subsequently formed, which are formed prior to formation of an array of fin back gate field effect transistors and are herein referred to as lower interconnect-level structures (L0, L1, L2). In case a two-dimensional array of TFTs and memory devices are to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric (ILD) layer 31B and first metal lines 41L formed within the first ILD layer 31B. The first ILD layer 31B is also referred to as a first line-level dielectric layer. The first metal lines 41L may contact a respective one of the contact via structures 41V. The second interconnect-level structure L2 includes a second ILD layer 32, which may include a stack of a first via-level dielectric material layer and a second line-level dielectric material layer or a line-and-via-level dielectric material layer. The second ILD layer 32 may have formed there within second interconnect-level metal interconnect structures (42V, 42L), which includes first metal via structures 42V and second metal lines 42L. Top surfaces of the second metal lines 42L may be coplanar with the top surface of the second ILD layer 32.

Figure 1B:
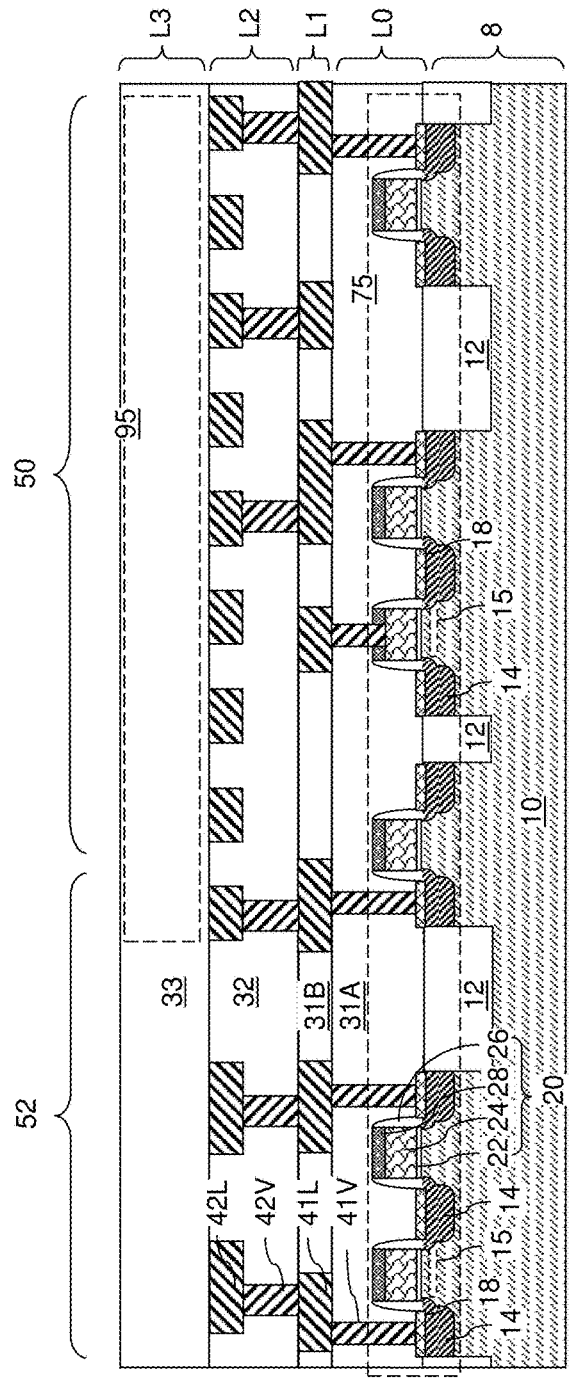
FIG. 1B is a vertical cross-sectional view of the first exemplary structure during formation of the array of memory devices according to an embodiment of the present disclosure.

FIG. 1B is a vertical cross-sectional view of the first exemplary structure during formation of an array of ferroelectric-based devices, such as TFT FeFET memory cells, according to an embodiment of the present disclosure. Referring to FIG. 1B, an array 95 of non-volatile memory cells, such as TFT FeFET devices, may be formed in the memory array region 50 over the second interconnect-level structure L2. The details for the structure and the processing steps for the array 95 of non-volatile memory cells are subsequently described in detail below. A third ILD layer 33 may be formed during formation of the array 95 of non-volatile memory cells. The set of all structures formed at the level of the array 95 of non-volatile memory cells is herein referred to as a third interconnect-level structure L3.

Figure 1C:
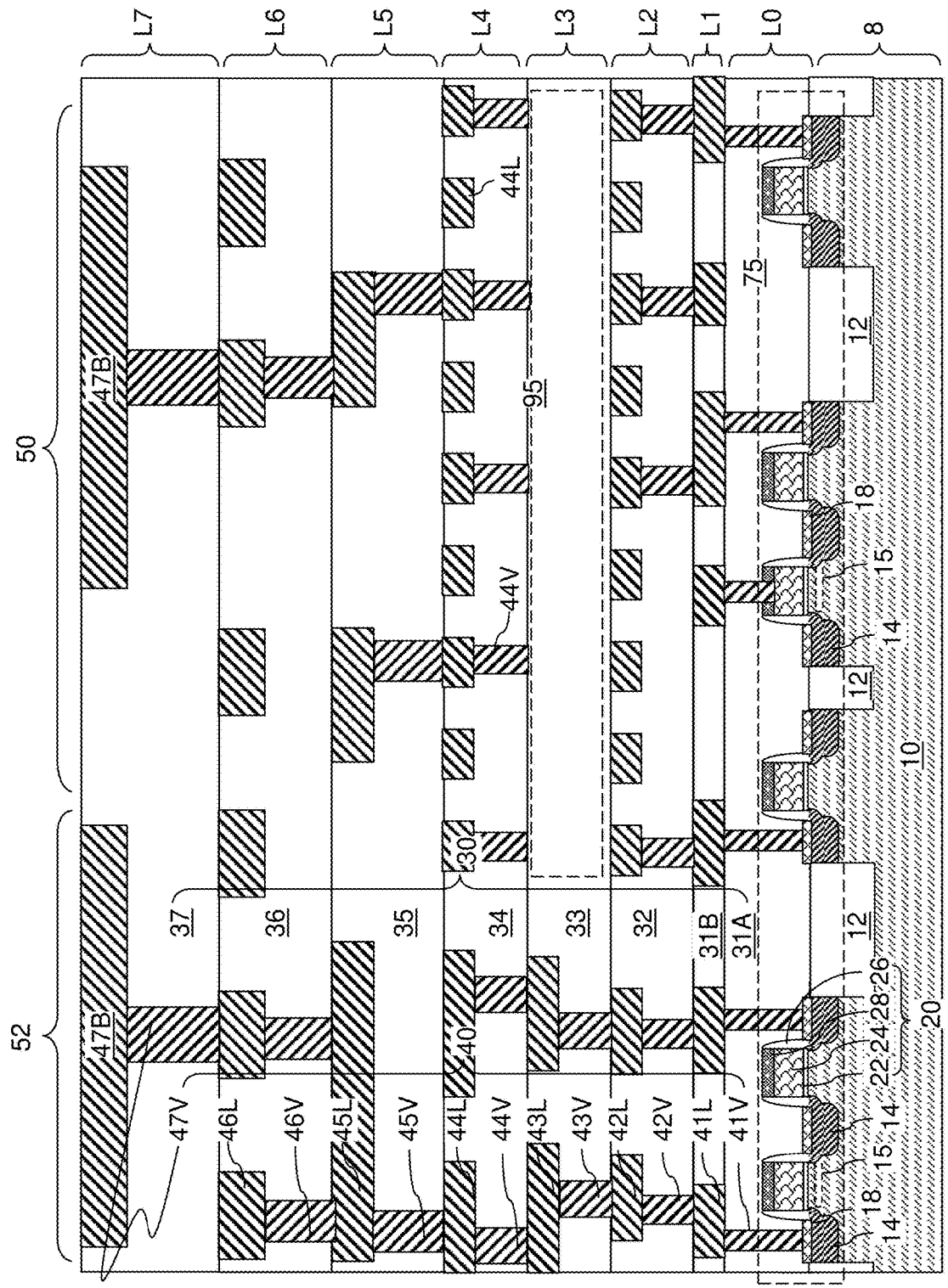
FIG. 1C is a vertical cross-sectional view of the first exemplary intermediate structure after formation of upper-level metal interconnect structures according to an embodiment of the present disclosure.

FIG. 1C is a vertical cross-sectional view of the first exemplary structure after formation of upper-level metal interconnect structures according to an embodiment of the present disclosure. Referring to FIG. 1C, third interconnect-level metal interconnect structures (43V, 43L) may be formed in the third ILD layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth ILD layer 34 having formed therein fourth interconnect-level metal interconnect structures (44V, 44L), which may include third metal via structures 44V and fourth metal lines 44L. The fifth interconnect-level structure L5 may include a fifth ILD layer 35 having formed therein fifth interconnect-level metal interconnect structures (45V, 45L), which may include fourth metal via structures 45V and fifth metal lines 45L. The sixth interconnect-level structure L6 may include a sixth ILD layer 36 having formed therein sixth interconnect-level metal interconnect structures (46V, 46L), which may include fifth metal via structures 46V and sixth metal lines 46L. The seventh interconnect-level structure L7 may include a seventh ILD layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each ILD layer may be referred to as an ILD layer 30. Each of the interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nanometers (nm) to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of non-volatile memory cells, such as TFT FeFET devices, may be formed as a component of a third interconnect-level structure L3, embodiments are expressly contemplated herein in which the array 95 of non-volatile memory cells may be formed as components of any other interconnect-level structure (e.g., L1-L7). Further, while the present disclosure is described using an embodiment in which a set of eight interconnect-level structures are formed, embodiments are expressly contemplated herein in which a different number of interconnect-level structures is used. In addition, embodiments are expressly contemplated herein in which two or more arrays 95 of non-volatile memory cells may be provided within multiple interconnect-level structures in the memory array region 50. While the present disclosure is described employing an embodiment in which an array 95 of non-volatile memory cells may be formed in a single interconnect-level structure, embodiments are expressly contemplated herein in which an array 95 of non-volatile memory cells may be formed over two vertically adjoining interconnect-level structures. Furthermore, embodiments are expressly contemplated herein in which an array 95 of non-volatile memory cells may be formed on or within the semiconductor material layer 10 (e.g., in a front-end-of-line (FEOL) operation).

Figure 2:
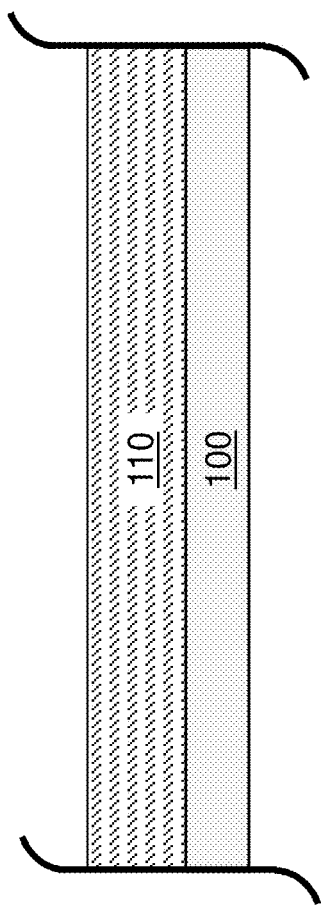
FIG. 2 is a vertical cross-sectional view of an exemplary intermediate structure during a process of forming a FeFET device including a first dielectric layer deposited over a substrate.

FIGS. 2-9 and 11-21 are sequential vertical cross-sectional views of an exemplary structure during a process of forming a FeFET device, such as a TFT FeFET device, according to various embodiments of the present disclosure. The FeFET device may form a memory cell that is a part of an array 95 of memory cells such as shown in FIG. 1C. Referring to FIG. 2, a first dielectric layer 110 may be deposited over a substrate 100. The substrate 100 may be any suitable substrate, such as a semiconductor device substrate, and may include control elements formed during FEOL processes. In some embodiments, one or more additional dielectric layers, such as ILD layers, may be deposited between the substrate 100 and the first dielectric layer 110. In such embodiments, the first dielectric layer 110 may be omitted. For example, ILD layer 33 discussed above with respect to FIGS. 1B and 1C may be deposited over or substituted for substrate 100.

The first dielectric layer 110 may be formed of any suitable dielectric material such as silicon oxide ($SiO_2$), or the like, or high-k dielectric materials such as silicon nitride ($SiN_4$), hafnium oxide ($HfO_2$), hafnium silicon oxide (HfSiO), hafnium tantalum oxide (HfTaO), hafnium titanium oxide (HMO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), or the like. In some embodiments, the first dielectric layer 110 may be a native oxide layer formed on the substrate 100. Other suitable dielectric materials may also be within the contemplated scope of disclosure.

The first dielectric layer 110 may be deposited using any suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like.

Figure 3:
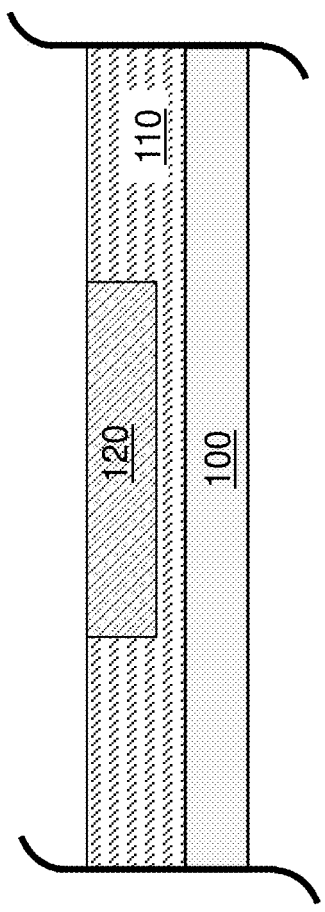
FIG. 3 is a vertical cross-section view of an exemplary intermediate structure during a process of forming a FeFET device illustrating a bottom electrode layer embedded in a first dielectric layer.

FIG. 3 is a vertical cross-section view of an exemplary intermediate structure showing a bottom gate electrode layer 120 formed within the first dielectric layer 110. Referring to FIG. 3, a bottom gate electrode layer 120 may be deposited on the first dielectric layer 110. In embodiments, the bottom gate electrode layer 120 may be embedded in the first dielectric layer 110. For example, a photoresist layer (not shown) may be deposited over the first dielectric layer 110 and patterned using photolithographic techniques. The pattern of the photoresist layer may be transferred to the first dielectric layer 110 and thus, the first dielectric layer 110 may be patterned to form trenches. An electrically conductive material may be deposited in the trenches, and a planarization process may be performed to planarize upper surfaces of the bottom gate electrode layer 120 and the first dielectric layer 110.

Alternatively, the bottom gate electrode layer 120 may be deposited as a continuous electrode layer on the upper surface of the first dielectric layer 110, such that the continuous electrode layer contacts an upper surface of the first dielectric layer 110. Selected portions of the continuous electrode may be removed (e.g., by etching the continuous electrode layer through a patterned mask formed using photolithographic processes) to form one or more discrete patterned electrode layers 120 on the first dielectric layer 100. Then, additional dielectric material may be formed over the exposed surfaces of the first dielectric layer 110, the side surfaces of the patterned electrode layer, and optionally over the upper surface of the bottom gate electrode layer(s) 120 to embed the bottom gate electrode layer(s) 120 within the dielectric material. A planarization process may then be performed to planarize the upper surfaces of the bottom gate electrode layer 120 and the first dielectric layer 110 to provide a bottom gate electrode layer 120 embedded in a first dielectric layer 110 as shown in FIG. 3.

In other embodiments, the bottom gate electrode layer 120 may be embedded in a semiconductor material layer, such as semiconductor material layer 10 shown in FIGS. 1A-1C.

The bottom gate electrode layer 120 may include any suitable electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. Other suitable electrically conductive materials for the bottom gate electrode layer 120 are within the contemplated scope of disclosure. In some embodiments, the material of the bottom gate electrode layer 120 may optionally have a lower coefficient of thermal expansion (CTE) than the CTE of a ferroelectric (FE) material layer that is subsequently formed over the bottom gate electrode layer 120. Utilizing a bottom gate electrode layer 120 having a lower CTE than the CTE of an overlying FE material layer may impart tensile stress on the FE material layer and improve ferroelectric properties of the FE material layer, as discussed in further detail below. In embodiments, the CTE of the material of the bottom gate electrode layer 120 may be less than $14 \times 10^{-6}$/K.

The bottom gate electrode layer 120 may be deposited using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof. The thickness of the bottom gate electrode layer 120 may be in a range from 10 nm to 100 nm, although lesser and greater thicknesses may also be used.

Figure 4:
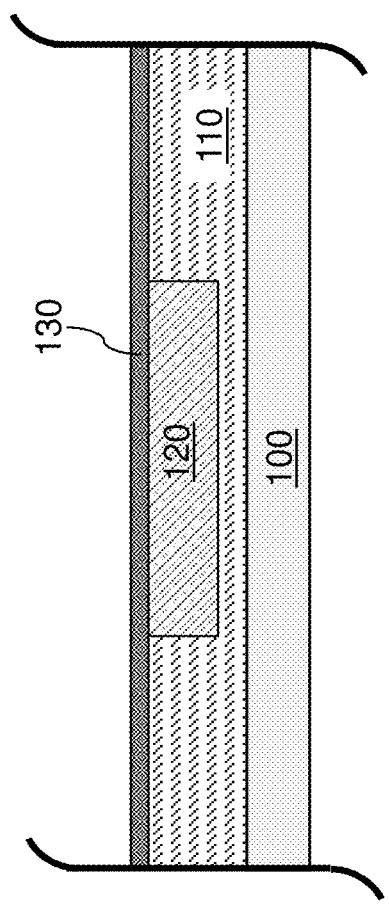
FIG. 4 is a vertical cross-section view of an exemplary intermediate structure during a process of forming a FeFET device illustrating an optional stress layer deposited over the upper surfaces of a bottom electrode layer and a first dielectric layer.

FIG. 4 is a vertical cross-section view of an exemplary intermediate structure showing an optional stress layer 130 deposited over the upper surfaces of the bottom gate electrode layer 120 and the first dielectric layer 110. Referring to FIG. 4, the optional stress layer 130 may include a metal oxide material that may function as a buffer layer for a ferroelectric material layer that is subsequently formed over the stress layer 130. The optional stress layer 130 may be a material having a lattice mismatch with the ferroelectric material that is subsequently formed over the stress layer 130 such that a tensile strain is induced in the ferromagnetic material layer. It is known that in many FE materials, such as hafnium zirconium oxide ($Hf_xZr_{1-x}O_y$, also referred to as "HZO"), small changes in the lattice parameters may result in a larger portion of the FE material having a desirable crystalline phase, such as an orthorhombic crystal phase, relative to other crystal phases, such as a monoclinic crystal phase. Tensile strain due to lattice mismatch between the stress layer 130 and the FE layer may provide a FE layer having improved ferroelectric properties, such as increased remnant polarization, $P_r$.

The optional stress layer 130 may include a metal oxide material such as $Ta_2O_5$, $K_2O$, $Rb_2O$, $SrO$, $BaO$, a-$V_2O_3$, a-$Cr_2O_3$, a-$Ga_2O_3$, a-$Fe_2O_3$, a-$Ti_2O_3$, a-$In_2O_3$, $YAlO_3$, $Bi_2O_3$, $Yb_2O_3$, $Dy_2O_3$, $Gd_2O_3$, $SrTiO_3$, $DyScO_3$, $TbScO_3$, $GdScO_3$, $NdScO_3$, $NdGaO_3$, $LaSrAlTaO_3$ (LSAT), and combinations of the same. In various embodiments, the stress layer 130 may include a multi-layer structure, including at least one layer comprised of $LaSrMnO_3$ (LMSO). For example, the stress layer 130 may include a bi-layer structure such as LSMO/$SrTiO_3$, LSMO/$DyScO_3$, LSMO/$TbScO_3$, LSMO/$GdScO_3$, LSMO/$NdScO_3$, LSMO/$NdGaO_3$, and LSMO/LSAT. Other suitable materials for the stress layer 130 are within the contemplated scope of disclosure. In various embodiments, the lattice constant $a_0$ of the optional stress layer 130 may be larger than the in-plane lattice constant of the material of the ferroelectric (FE) material layer that is subsequently formed over the stress layer 130 in order to induce tensile strain in the FE material layer.

The optional stress layer 130 may be deposited using any suitable deposition process. In various embodiments, the optional stress layer 130 may be deposited using atomic layer deposition (ALD) or pulsed laser deposition (PLD). In some embodiments, the optional stress layer 130 may be thermally annealed for 30 seconds to minutes at temperatures between 300° C. and 700° C. to increase the crystallinity of the stress layer 130. Longer or shorter annealing times as well as higher or lower annealing temperatures may also be used. Alternatively or in addition, the stress layer 130 may be deposited as a quasi-single crystal metal oxide material using a suitable deposition technique (e.g., PLD). The thickness of the optional stress layer 130 may be in a range from 0.5 nm to 5 nm, although lesser and greater thicknesses may also be used.

Figure 5:
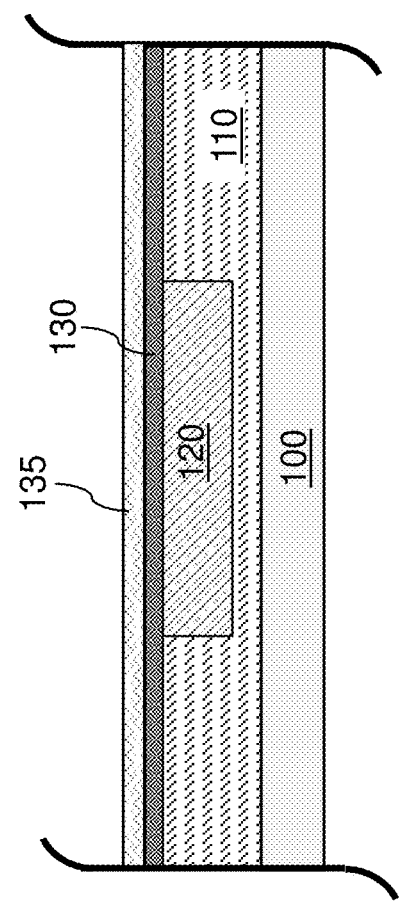
FIG. 5 is a vertical cross-section view of an exemplary intermediate structure during a process of forming a FeFET device illustrating an optional seed layer deposited over the upper surface of an optional stress layer.

FIG. 5 is a vertical cross-section view of an exemplary structure showing an optional seed layer 135 deposited over the upper surface of the optional stress layer 130. In embodiments in which the optional stress layer 130 is not present, the optional seed layer 135 may be deposited over the upper surfaces of the bottom gate electrode layer 120 and the first dielectric layer 110. The optional seed layer 135 (also referred to as a ferroelectrical promotional layer) may include a material configured to promote the formation of a desired crystal structure in a FE material layer that is subsequently formed thereon. For example, the seed layer 135 may promote the formation of cubic (c-phase), tetragonal (t-phase) and/or orthorhombic (o-phase) crystal phases relative to monoclinic crystal phases (m-phase) in the subsequently-formed FE material layer, and may also inhibit the transformation of t-phase crystal structures to m-phase crystal structures in the FE material layer. This may result in an FE material layer having improved ferroelectric properties, such as increased remnant polarization, $P_r$.

In various embodiments, the optional seed layer 135 may be a metal oxide material, such as zirconium oxide ($ZrO_2$), zirconium-yttrium oxide ($ZrO_2$—$Y_2O_3$), hafnium oxide ($HfO_2$), aluminum oxide ($Al_2O_3$), and hafnium zirconium oxide ($Hf_xZr_{1-x}O_2$, where $0 \leq x \leq 1$), and combinations of the same. Other suitable materials for the seed layer 135 are within the contemplated scope of disclosure. The seed layer 135 may include a single layer of metal oxide material, or multiple layers of metal oxide materials which may have different compositions. In various embodiments, the seed layer material may have a crystal structure including cubic, tetragonal and/or orthorhombic crystal phases.

The optional seed layer 135 may be deposited using any suitable deposition process. In various embodiments, the optional seed layer 135 may be deposited using atomic layer deposition (ALD) or pulsed laser deposition (PLD). In some embodiments, the optional seed layer 135 may be thermally annealed for 30 seconds to 10 minutes at temperatures between 300° C. and 700° C. to increase the crystallinity of the seed layer 135. In embodiments in which an optional stress layer 130 is present, the stress layer 130 and the seed layer 135 may be annealed at the same time or may be annealed in separate annealing steps. Alternatively or in addition, the seed layer 135 may be deposited as a quasi-single crystal metal oxide material using a suitable deposition technique (e.g., PLD). The thickness of the optional seed layer 135 may be in a range from 0.1 nm to 5 nm, although lesser and greater thicknesses may also be used.

Figure 6:
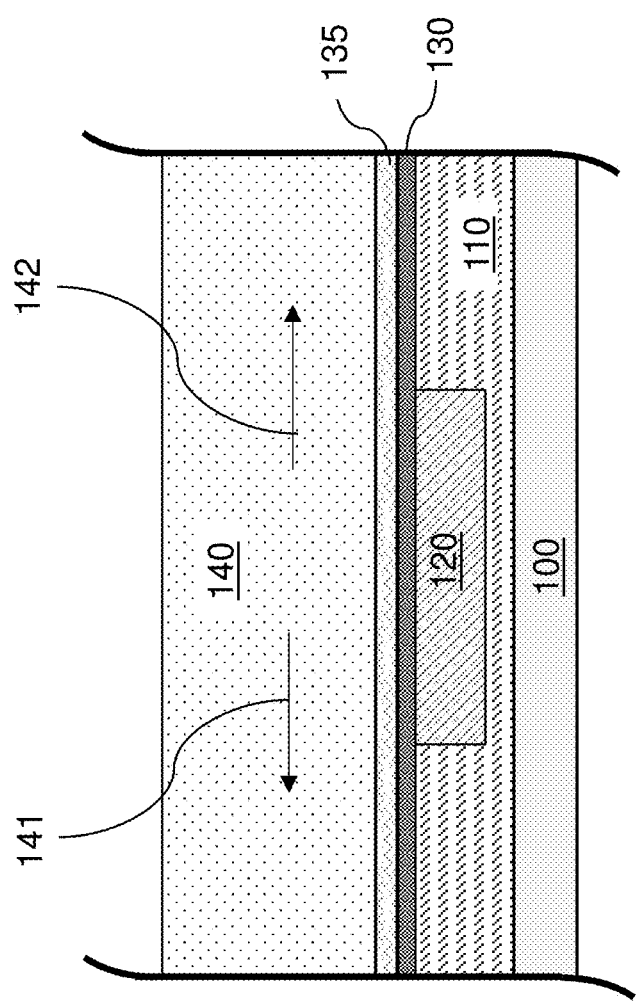
FIG. 6 is a vertical cross-section view of an exemplary intermediate structure during a process of forming a FeFET device illustrating a ferroelectric (FE) material layer formed over the upper surface of an optional seed layer.

FIG. 6 is a vertical cross-section view of an exemplary structure showing a ferroelectric (FE) material layer 140 deposited over the upper surface of the optional seed layer 135. In embodiments in which the optional seed layer 135 is not present, the FE material layer 140 may be deposited over the upper surface of the optional stress layer 130. In embodiments in which neither the optional seed layer 135 nor the optional stress layer 130 are present, the FE material layer 140 may be deposited over the upper surfaces of the bottom gate electrode layer 120 and the first dielectric layer 110.

The FE material layer 140 may be formed of any suitable ferroelectric material. In various embodiments, the FE material layer 140 may be hafnium oxide-based ferroelectric material, such as $Hf_xZr_{1-x}O_y$, where $0 \leq x \leq 1$ (e.g., $Hf_{0.5}Zr_{0.5}O_2$), $HfO_2$, HfSiO, HfLaO, etc. In various embodiments, the FE material layer 140 may be hafnium zirconium oxide (HZO) doped with atoms having a smaller ionic radius than hafnium (e.g., Al, Si, etc.) and/or doped with atoms having a larger ionic radius than hafnium (e.g., La, Sc, Ca, Ba, Gd, Y, Sr, etc.). The dopant(s) may be at a concentration configured to improve a ferroelectric property of the FE material layer 140, such as increasing the remnant polarization. In various embodiments, dopants having a smaller ionic radius than hafnium and/or dopants having a larger ionic radius than hafnium may have a doping concentration that is between about 1 mol. % and about 20 mol. %. In some embodiments, the FE material of the FE material layer 140 may include oxygen vacancies. Oxygen vacancies in the FE material may promote the formation of orthorhombic (o-phase) crystal phases in the FE material layer 140.

In some embodiments, the FE material of the FE material layer 140 may include MN that is doped with Sc. Other suitable materials for the FE material layer 140 are within the contemplated scope of disclosure, including, without limitation, $ZrO_2$, $PbZrO_3$, $Pb[Zr_xTi_{1-x}]O_3$, ($0 \leq x \leq 1$) (PZT), $Pb_{1-x}La_xZr_{1-y}Ti_yO_3$ (PLZT), $BaTiO_3$, $PbTiO_3$, $PbNb_2O_6$, $LiNbO_3$, $LiTaO_3$, $PbMg_{1/3}Nb_{2/3}O_3$ (PMN), $PbSc_{1/2}Ta_{1/2}O_3$ (PST), $SrBi_2Ta_2O_9$ (SBT), $Bi_{1/2}Na_{1/2}TiO_3$, and combinations thereof.

In some embodiments, the FE material layer 140 may include a single layer of FE material, or multiple layers of FE materials which may have different compositions. In various embodiments, the FE material layer 140 may have a crystal structure including cubic, tetragonal and/or orthorhombic crystal phases. In embodiments, the FE material layer 140 may include a hafnium oxide-based ferroelectric material, such as $Hf_xZr_{1-x}O_y$, and may have a structure such that a volume of the FE material having a cubic, tetragonal and/or orthorhombic crystal structure is more than 50% greater than a volume of the FE material having a monoclinic crystal structure.

The FE material layer 140 may be deposited using any suitable deposition process. In various embodiments, the FE material layer 140 may be deposited using atomic layer deposition (ALD). The thickness of the FE material layer 140 may be in a range from 0.1 nm to 100 nm, although lesser and greater thicknesses may also be used.

In various embodiments, the FE material layer 140 may optionally be under a tensile strain in a direction that is parallel to the top and/or bottom surfaces of the FE material layer 140 (illustrated schematically by arrows 141 and 142 in FIG. 6). In some embodiments, the FE material layer 140 may be subject to a tensile strain of between 1.5% and 3.0% over at least a portion of the FE material layer 140. As discussed above, subjecting the FE material layer 140 to a tensile strain may promote the formation and stability of crystal structures, such as orthorhombic crystal phases, that may increase the ferroelectric properties of the material, relative to other structures such as monoclinic crystal phases that may degrade the ferroelectric properties of the material. In various embodiments in which the optional stress layer 130 is present, tensile strain on the FE material layer 140 may be induced, at least in part, by a lattice mismatch between the stress layer 130 and the FE material layer 140. As discussed above, the lattice constant $a_0$ of the optional stress layer 130 may be larger than the in-plane lattice constant of the material of the ferroelectric (FE) material layer 140 in order to induce tensile strain in the FE material layer.

Alternatively, or in addition, tensile strain on the FE material layer 140 may be induced, at least in part, by a mismatch of the coefficient of thermal expansion (CTE) between the bottom gate electrode layer 120 and the FE material layer 140. As discussed above, in various embodiments the material of the bottom gate electrode layer 120 may have a lower CTE than the CTE of the material of the FE layer 140. For example, in embodiments in which the FE material layer 140 includes hafnium zirconium oxide (HZO), which has a CTE of $14 \times 10^{-6}$/K, the bottom gate electrode layer 120 may include material(s) having a CTE that is less than $14 \times 10^{-6}$/K. Suitable electrically conductive materials having a comparatively lower CTE include, without limitation, platinum (Pt), titanium (Ti), titanium nitride (TiN), tungsten (W), tantalum (Ta), tantalum nitride (TaN), iron (Fe), nickel (Ni), beryllium (Be), chromium (Cr), cobalt (Co), antimony (Sb), iridium (Ir), molybdenum (Mo), osmium (Os), thorium (Th), vanadium (V), alloys thereof, and combinations of the same. In various embodiments, tensile strain may be induced in the FE material layer 140 by subjecting the intermediate structure shown in FIG. 6 to an annealing process, which may include annealing the intermediate structure at a temperature between 400° C. and 700° C. for between 30 seconds and 5 minutes, followed by a cool down period. During the cool down period, the FE material layer 140 may shrink to a greater extent than the bottom gate electrode 120 due to the differential in CTE. This may stretch the FE material layer 140 in the direction of arrows 141 and 142 and thus subject the FE material layer 140 to a permanent tensile strain.

Figure 7:
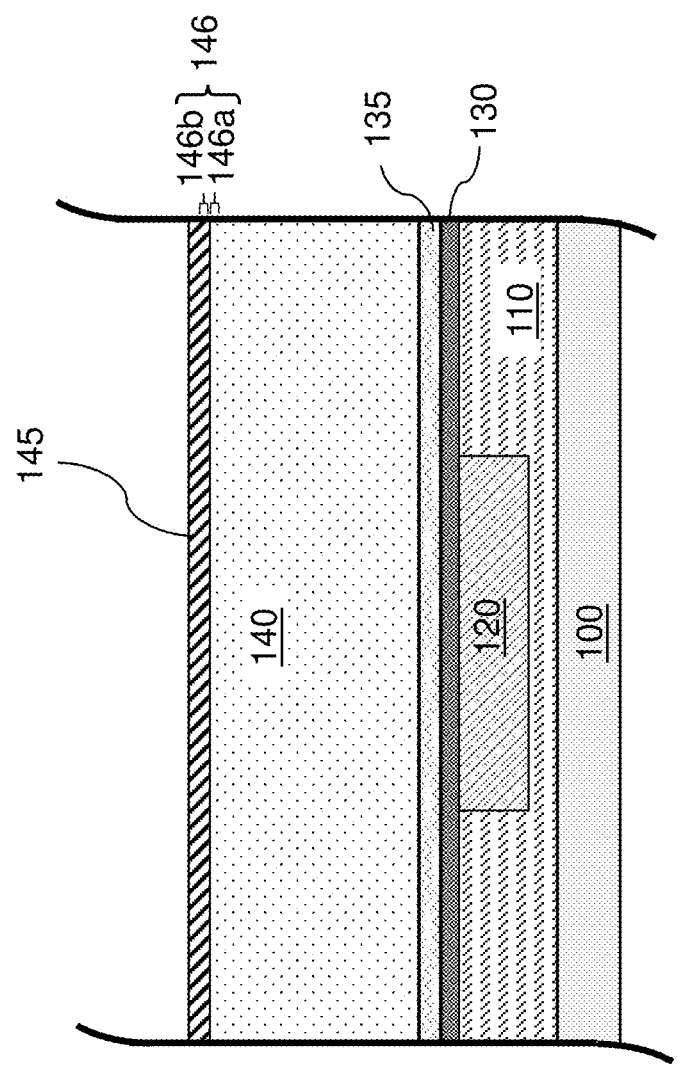
FIG. 7 is a vertical cross-section view of an exemplary intermediate structure during a process of forming a FeFET device illustrating an optional insulating layer deposited over the upper surface of a FE material layer.

FIG. 7 is a vertical cross-section view of an exemplary intermediate structure showing an optional insulating layer 145 deposited over the upper surface of the FE material layer 140. Referring to FIG. 7, the optional insulating layer 145 (also referred to as a "blocking" layer) may include a layer of dielectric material, such as a high-k dielectric material. Herein, high-k dielectric materials have a dielectric constant greater than 3.9 and may include, but are not limited to, hafnium oxide ($HfO_2$), hafnium silicon oxide ($HfSiO_4$), zirconium silicate ($ZrSiO_4$) hafnium tantalum oxide (HfTaO), hafnium titanium oxide (HfTiO), hafnium zirconium oxide ($Hf_xZr_{x-1}O_y$) (HZO)), silicon nitride ($SiN_x$), tantalum oxide ($Ta_2O_5$), aluminum oxide ($Al_2O_3$), lanthanum aluminate ($LaAlO_3$), hafnium dioxide-alumina ($HfO_2$—$Al_2O_3$), zirconium oxide ($ZrO_2$), magnesium oxide (MgO), yttrium oxide ($Y_2O_3$), lanthanum oxide ($La_2O_3$), strontium oxide (SrO), gadolinium oxide ($Gd_2O_3$), calcium oxide (CaO), scandium oxide ($Sc_2O_3$), combinations thereof, or the like. In embodiments, the optional insulating layer 145 may include Si, Mg, Al, $Y_2O_3$, La, Sr, Gd, N, Sc, Ca etc., including any combination compound of Si, Mg, Al, $Y_2O_3$, La, Sr, Gd, N, Sc, Ca etc. Other suitable dielectric materials are within the scope of the present disclosure.

The optional insulating layer 145 may be deposited using any suitable deposition processes, as described above. In various embodiments, the optional insulating layer 145 may be deposited using atomic layer deposition (ALD). The thickness of the optional insulating layer 145 may be in a range from 0.1 nm to 10 nm, although lesser and greater thicknesses may also be used.

The optional insulating layer 145 may function as a barrier between the FE material layer 140 and a semiconductor channel layer that may be subsequently formed over the insulating layer 145. The optional insulating layer 145 may help to reduce surface state density ($D_{it}$) and inhibit carrier (i.e., electron and/or hole) injection from the semiconductor channel layer. In various embodiments, the material of the optional insulating layer 145 may have a higher band gap ($E_g$) than the band gap of the subsequently-formed semiconductor channel layer. For example, where the subsequently formed semiconductor channel layer is amorphous $InGaZnO_4$ (a-IGZO), having a band gap $E_g$ of ~3.16 eV, the material of the optional insulating layer 145 may have a larger band gap (e.g., $E_g \geq 3.5$ eV, such as $E_g \geq 5.0$ eV). Further, the conduction band offset ($E_{CBO}$) and the valence band offset ($E_{VBO}$) between the material of the insulating layer 145 and the semiconductor channel layer may be sufficiently large (e.g., $E_{CBO}>1$ eV, $E_{VBO}>1$ eV) to block charge carriers, including both electrons and holes, from being injected into the insulating layer 145 and thereby minimize current leakage from the semiconductor channel layer. In various embodiments, the optional insulating layer 145 may include silicon-doped hafnium oxide, such as $Hf_{1-x}Si_xO_y$, where x>0.1 and y>0.

In some embodiments, the FE material layer 140 may include hafnium zirconium oxide (HZO) and the optional insulating layer 145 may include a hafnium-containing dielectric material, such as silicon-doped hafnium oxide. An interface region 146 adjacent to the interface between the FE material layer 140 and the optional insulating layer 145 may include a first interface region portion 146a located within the FE material layer 140, and a second interface region portion 146b, adjacent to the first interface region portion 146a, located within the optional insulating layer 145. Each of the first interface region portion 146a and the second interface region portion 146b may have a thickness of at least 1 nm. In various embodiments, within the interface region 146, a ratio of the atomic percentage of oxygen to the atomic percentage of zirconium may be greater than or equal to ($\geq$)1, and a ratio of the atomic percentage of oxygen to the atomic percentage of hafnium may be greater (>) 1.

Figure 8:
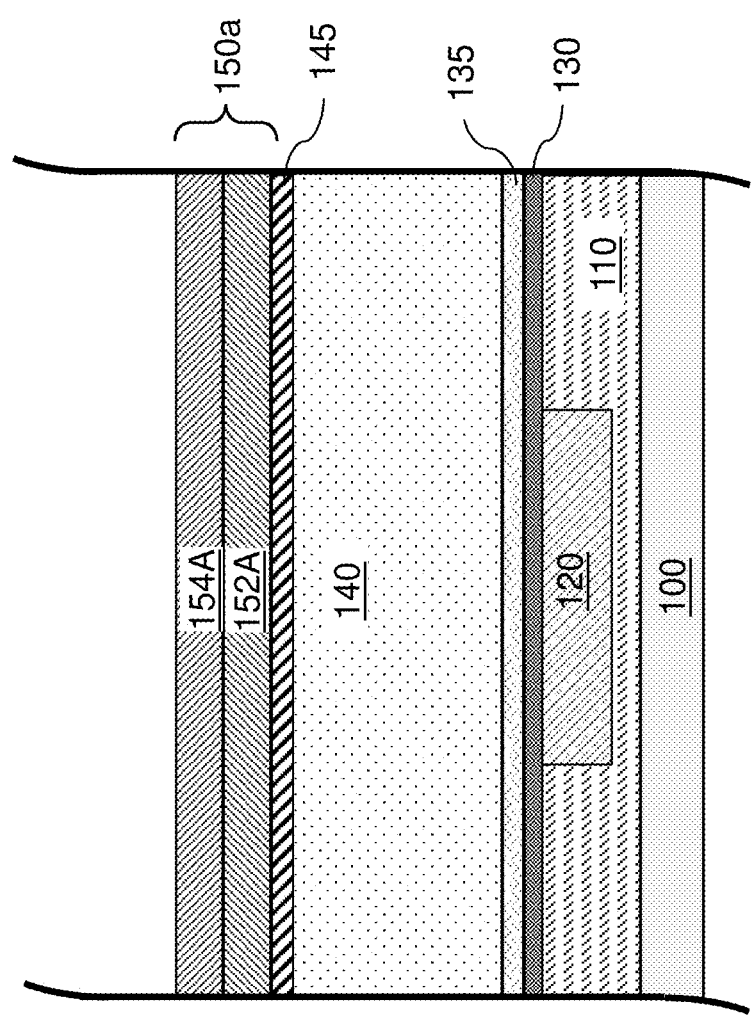
FIG. 8 is a vertical cross-section view of an exemplary intermediate structure during a process of forming a FeFET device illustrating portions of an in-progress channel layer deposited over the upper surface of an optional insulating layer.

FIG. 8 is a vertical cross-section view of an exemplary intermediate structure showing an in-progress channel layer 150a deposited over the upper surface of optional insulating layer 145. In embodiments in which the optional insulating layer 145 is not present, the in-progress channel layer 150a may be deposited over the upper surface of the FE material layer 140. The in-progress channel layer 150a may be composed of an oxide semiconductor material, such as $M_xM'_yZn_zO$, where 0<(x, y, z)<1. M may be a metal selected from the group consisting of indium (In) and tin (Sn) or combinations thereof, and M' may be a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof. In some embodiments, the in-progress channel layer 150a may be amorphous indium gallium zinc oxide (a-IGZO). In other embodiments, indium may be partially or fully substituted by another metal, such as tin (Sn), that may be configured to provide high carrier mobility within the channel layer 150a. Alternatively, or in addition, gallium may be partially or fully substituted by another metal, such as one or more of hafnium (Hf), zirconium (Zr), titanium (Ti), aluminum (Al), strontium (Sr), barium (Ba), scandium (Sc), magnesium (Mg), lanthanum (La), or gadolinium (Gd), that may be configured to reduce oxygen vacancies and lower surface states ($d_{it}$).

The in-progress channel layer 150a may be formed by depositing a series of sub-layers over the upper surface of optional insulating layer 145, or in embodiments in which the optional insulating layer 145 is not present, over the upper surface of the FE material layer 140. Referring again to FIG. 8, a first sublayer 152A of the in-progress channel layer 150a may include a combination of a first metal oxide material and a second metal oxide material. The first metal oxide material may be composed of $MO_x$, where M is a metal selected from the group consisting of indium (In) and tin (Sn) or combinations thereof. The second metal oxide material may be composed of $M'O_x$, where M' is a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof. In various embodiments, the first sublayer 152A may include a combination of $InO_x$ and $GaO_x$. The first sublayer 152A may be deposited using any suitable deposition process. In various embodiments, the first sublayer 152A may be deposited using atomic layer deposition (ALD).

Referring again to FIG. 8, a second sublayer 154A of the in-progress channel layer 150a may be deposited over the upper surface of the first sublayer 152A. The second sublayer 154A of the in-progress channel layer 150a may include zinc oxide ($ZnO_x$). The second sublayer 154A may be deposited using any suitable deposition process. In various embodiments, the second sublayer 154A may be deposited using atomic layer deposition (ALD).

In various embodiments, deposition of zinc oxide directly onto the gate dielectric material (i.e., the optional insulating layer 145 in FIG. 8, or the FE material layer 140 in embodiments in which the optional insulating layer 145 is not present) may result in increased surface roughness at the interface between the in-progress channel layer 150a and the gate dielectric due to the propensity for zinc oxide to form polycrystalline grain structures. Thus, in various embodiments, a first sublayer 152A of the in-progress channel layer 150a that is formed over the gate dielectric 145/140 may include may a combination of a first metal oxide material and a second metal oxide material, and a second sublayer 154A including zinc oxide may be formed over the first sublayer 152A. In various embodiments, the first sublayer 152A may be essentially free of zinc oxide. Further, in various embodiments the first sublayer 152A may include a combination of a first metal oxide material, such as indium oxide ($InO_x$), that may promote higher carrier (e.g., electron) mobility, and a second metal oxide material, such as gallium oxide ($GaO_x$) that may reduce oxygen vacancies and lower surface state density ($D_{it}$) in the in-progress channel layer 150a.

Figure 9:
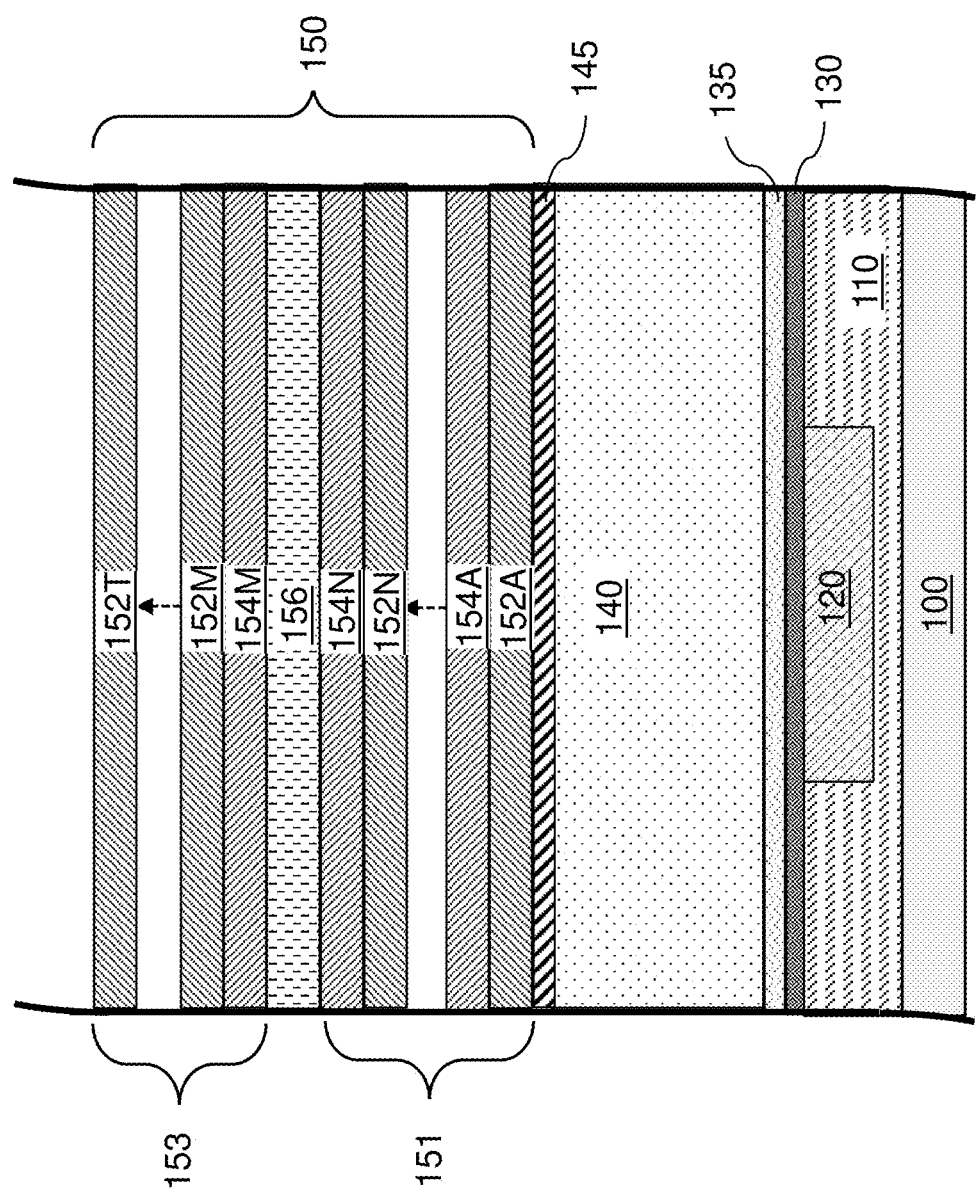
FIG. 9 is a vertical cross-section view of an exemplary intermediate structure during a process of forming a FeFET device illustrating a completed channel layer deposited over the upper surface of an optional insulating layer.

FIG. 9 is a vertical cross-section view of an exemplary intermediate structure showing a completed channel layer 150 deposited over the upper surface of optional insulating layer 145. Referring to FIG. 9, the completed channel layer 150 may be formed by depositing a plurality of sub-layers, including a plurality of first sublayers 152A, 152N, 152M, 152T, a plurality of second sublayers 154A, 154N, 154M, and at least one third sublayer 156.

In various embodiments, each of the first sublayers 152A, 152N, 152M and 152T may include a combination of a first metal oxide material and a second metal oxide material. The first metal oxide material may be composed of $MO_x$, where M is a metal selected from the group consisting of indium (In) and tin (Sn) or combinations thereof. The second metal oxide material may be composed of $M'O_x$, where M' is a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof. In various embodiments, each of the first sublayers 152A, 152N, 152M and 152T may include a combination of $InO_x$ and $GaO_x$. In some embodiments, each of the first sublayers 152A, 152N, 152M and 152T of the channel layer 150 may have an identical composition. In other embodiments, the first sublayers 152A, 152N, 152M and 152T may have different compositions. For example, a ratio of M:M' in at least one of the first sublayers 152A, 152N, 152M and 152T may be different than the ratio of M:M' in at least one other first sublayer 152A, 152N, 152M and 152T. Alternatively, or in addition, the metal material(s), M and/or M', of at least one of the first sublayers 152A, 152N, 152M and 152T may be different than the metal material(s), M and/or M', of at least one other first sublayer 152A, 152N, 152M and 152T.

In various embodiments, each of the second sublayers 154A, 154N, 154M of the channel layer 150 may include zinc oxide ($ZnO_x$). As shown in FIG. 9, the channel layer 150 may include a first alternating stack 151 of first and second sublayers 152, 154, including a set of first sublayers 152A, . . . 152N that each include a combination of a first metal oxide material and a second metal oxide material (e.g., $InO_x$ and $GaO_x$), and a set of second sublayers 154A, . . . 154N, that include zinc oxide. In embodiments, the first alternating stack 151 of sublayers may include at least two sublayers 152, 154, such as at least four sublayers 152, 154 (e.g., eight or more sublayers 152, 154). The first and second sublayers 152, 154 may alternate, such that each first sublayer 152 of the first alternating stack 151 may contact at least one second sublayer 154 of the first alternating stack 151, and each second sublayer 154 of the first alternating stack 151 may contact at least one first sublayer 152 of the alternating stack 151. In various embodiments, the uppermost sublayer of the first alternating stack 151 of sublayers may be a second sublayer 154N containing zinc oxide. Alternatively, the uppermost sublayer of the first alternating stack 151 of sublayers may be a first sublayer 152N that includes a combination of a first metal oxide material and a second metal oxide material (e.g., $InO_x$ and $GaO_x$).

Referring again to FIG. 9, a third sublayer 156 may be deposited over the uppermost layer of the first alternating stack 151 of first and second sublayers 152, 154. In embodiments, the third sublayer 156 may include a combination of a first metal oxide material ($MO_x$), a second metal oxide material ($M'O_x$), and zinc oxide ($ZnO_x$). The first metal oxide material may be composed of $MO_x$, where M is a metal selected from the group consisting of indium (In) and tin (Sn) or combinations thereof. The second metal oxide material may be composed of $M'O_x$, where M' is a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof. In various embodiments, the third sublayer 156 may include a combination of $InO_x$, $GaO_x$ and $ZnO_x$. The third sublayer 156 may be deposited using any suitable deposition process. In various embodiments, the third sublayer 156 may be deposited using atomic layer deposition (ALD).

Referring again to FIG. 9, the channel layer 150 may further include a second alternating stack 153 of first and second sublayers 152, 154 disposed over the third sublayer 156. The second alternating stack 153 of first and second sublayers 152, 154 may include a set of first sublayers 152M, . . . 152T that each include a combination of a first metal oxide material and a second metal oxide material (e.g., $InO_x$ and $GaO_x$), and a set of second sublayers 154M that include zinc oxide. In embodiments, the second alternating stack 153 of sublayers 152, 154 may include at least two sublayers 152, 154, such as at least four sublayers 152, 154 (e.g., eight or more sublayers 152, 154). The first and second sublayers 152, 154 may alternate, such that each first sublayer 152 of the second alternating stack 153 may contact at least one second sublayer 154 of the second alternating stack 153, and each second sublayer 154 of the second alternating stack 153 may contact at least one first sublayer 152 of the second alternating stack 153. In various embodiments, the lowermost sublayer of the second alternating stack 153 contacting the third sublayer 156 may be a second sublayer 154M containing zinc oxide. Alternatively, the lowermost sublayer of the second alternating stack 153 may be a first sublayer 152M that includes a combination of a first metal oxide material and a second metal oxide material (e.g., $InO_x$ and $GaO_x$).

In various embodiments, the uppermost sublayer of the second alternating stack 153 of sublayers may be a first sublayer 152T that includes a combination of a first metal oxide material and a second metal oxide material (e.g., $InO_x$ and $GaO_x$). Alternatively, the uppermost sublayer of the second alternating stack 153 may be a second sublayer 154 containing zinc oxide.

In various embodiments, the channel layer 150 may have a symmetrical structure that includes a first alternating stack 151 of first and second sublayers 152, 154, a third sublayer 156 over the first alternating stack 151, and a second alternating stack 153 of first and second sublayers 152, 154 over the third sublayer 156. In some embodiments, the first alternating stack 151 and the second alternating stack 153 may include an identical number of sublayers 152, 154. In some embodiments, the lowermost and uppermost sublayers 152A, 152T of the channel layer 150 may be first sublayers 152 including a combination of a first metal oxide material and a second metal oxide material (e.g., $InO_x$ and $GaO_x$). The third sublayer 156 may include a combination of a first metal oxide material, a second metal oxide material and zinc oxide. The third sublayer 156 may be contacted on its lower and upper surfaces by second sublayers 154N, 154M containing zinc oxide.

In various embodiments, the channel layer 150 including the first alternating stack 151 of first and second sublayers 152, 154, the at least one third sublayer 156, and the second alternating stack 153 of first and second sublayers 152, 154, may have a total thickness between 1 and 100 nm (e.g., between 2 nm and 70 nm), although greater or lesser thicknesses may be used. The channel layer 150 may be composed of an oxide semiconductor material, such as $M_xM'_yZn_zO$, where $0<(x, y, z)<1$. M may be a first metal selected from the group consisting of indium (In) and tin (Sn) or combinations thereof, and M' may be a second metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof. In some embodiments, the channel layer 150 may be amorphous indium gallium zinc oxide (a-IGZO).

Figure 10A:
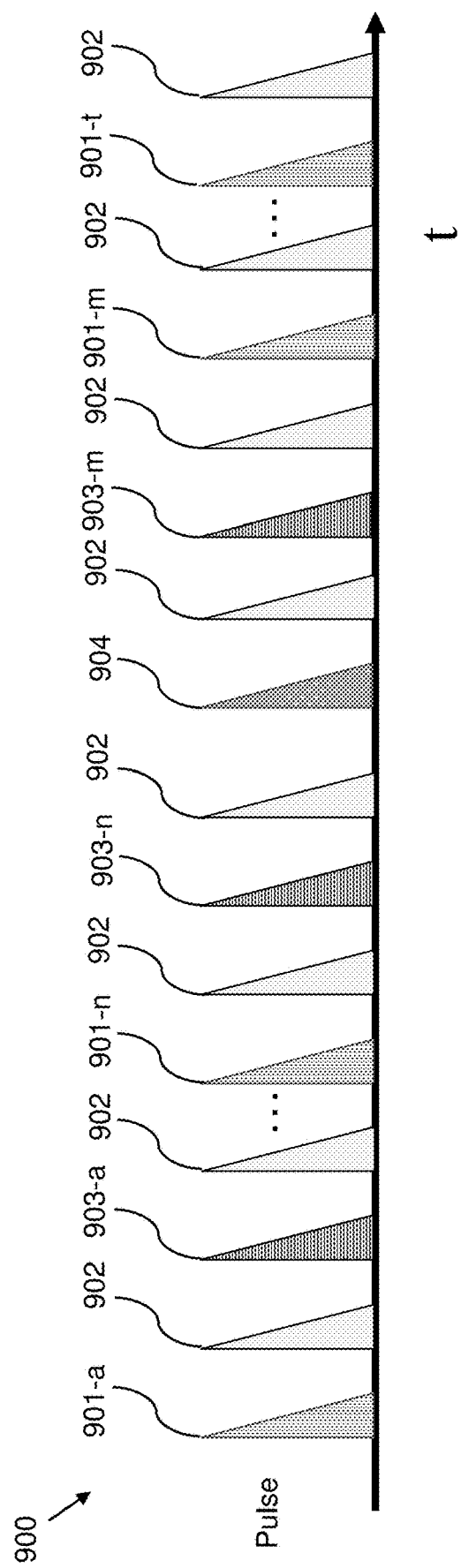
FIG. 10A is a plot showing a pulse sequence for an atomic layer deposition (ALD) system that may be used to form an amorphous oxide semiconductor (AOS) channel layer made from a plurality of sublayers according to various embodiments of the present disclosure.

FIG. 10A is a plot showing a pulse sequence 900 for an atomic layer deposition (ALD) system that may be used to form an amorphous oxide semiconductor (AOS) channel layer 150 made from a plurality of sublayers 152, 154, 156 according to various embodiments of the present disclosure. Referring to FIG. 10A, a sequence of ALD precursor pulses introduced into the ALD reaction chamber is schematically illustrated over time, t. A first pulse 901-a may be a precursor mixture including precursors containing a first metal, M, and a second metal, M'. The first metal, M, may be a metal selected from the group consisting of indium (In) and tin (Sn) or combinations thereof. The second metal, M', may be a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof. In one non-limiting example, the first metal, M, may be indium, and the precursor of the first metal may be trimethyl-indium (TMIn). The second metal, M', may be gallium, and the precursor of the second metal may be triethylgallium, $Ga(C_2H_5)_3$ (TEG/TEGa). Other suitable precursors are within the contemplated scope of disclosure. In various embodiments, the precursor mixture may be a solid precursor including a mixture (also referred to as a "cocktail") of solid precursors containing metals M and M'. The solid precursor "cocktail" mix may be vaporized using a low pressure vessel (LPV) and the resulting vaporized precursor mixture may be introduced (i.e., pulsed) into an ALD reaction chamber containing an intermediate structure such as shown in FIG. 7. The precursor mixture may react with the gate dielectric material (i.e., the optional insulating layer 145 in FIG. 7, or the FE material layer 140 in embodiments in which the optional insulating layer 145 is not present) to deposit the first metal M and the second metal M' on the gate dielectric material.

Referring again to FIG. 10A, following the introduction of the first pulse 901-a, the ALD reaction chamber may optionally be purged using an inert gas (e.g., N2, Ar, etc.) and a second pulse 902 including a counter-reactant precursor may be introduced into the ALD reaction chamber. In various embodiments, the counter-reactant precursor may be an oxygen precursor, such as water vapor ($H_2O$), oxygen gas ($O_2$), or ozone ($O_3$). The counter-reactant precursor may react with the first metal, M, and the second metal, M', to form a first channel sublayer 152A including a combination of a first metal oxide material and a second metal oxide material (e.g., $InO_x$ and $GaO_x$).

Following the introduction of the second pulse 902, the ALD reaction chamber may optionally be purged using an inert gas, and a third pulse 903-a may be introduced into the ALD reaction chamber. The third pulse 903-a may include a zinc precursor. In embodiments, the zinc precursor may include diethylzinc $(C_2H_5)_2Zn$ (DEZ) and/or dimethylzinc $Zn(CH_3)_2$ (DMZ). Other suitable precursors are within the contemplated scope of disclosure. The zinc precursor may react with the metal oxide materials of the first channel sublayer 152A to deposit zinc on the first channel sublayer 152A. The ALD reaction chamber may again optionally be purged using an inert gas, and a pulse 902 including a counter-reactant precursor (e.g., an oxygen precursor, such as $H_2O$) may be introduced into the ALD reaction chamber. The counter-reactant precursor may react with the zinc to form a second channel sublayer 154A including zinc oxide.

This sequence may then be repeated by introducing an additional pulse 901 of the precursor mixture containing metals M and M' (e.g., pulse 901-n), followed by a pulse 902 of the counter-reactant precursor, a pulse 903 of the zinc precursor (e.g., pulse 903-n), and a pulse 902 of the counter-reactant precursor, and so forth, to form a first alternating stack 151 of sublayers 152A, 154A . . . 152N, 154N of the semiconductor channel layer 150.

Following the deposition of the first alternating stack 151, the ALD reaction chamber may optionally be purged using an inert gas, and an additional pulse 904 may be introduced into the ALD reaction chamber. The additional pulse 904 may be a precursor mixture including precursors containing a first metal, M, a second metal, M', and zinc. The first metal, M, may be a metal selected from the group consisting of indium (In) and tin (Sn) or combinations thereof. The second metal, M', may be a metal selected from the group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof. In one non-limiting example, the first metal, M, may be indium, and the precursor of the first metal may be trimethyl-indium (TMIn). The second metal, M', may be gallium, and the precursor of the second metal may be triethylgallium, $Ga(C_2H_5)_3$ (TEG/TEGa). The zinc precursor may include diethylzinc $(C_2H_5)_2Zn$ (DEZ) and/or dimethylzinc $Zn(CH_3)_2$ (DMZ). Other suitable precursors are within the contemplated scope of disclosure. In various embodiments, the precursor mixture may be a solid precursor including a mixture (also referred to as a "cocktail") of solid precursors containing metals M, M', and zinc. The solid precursor "cocktail" mix may be vaporized using a low pressure vessel (LPV) and the resulting vaporized precursor mixture may be introduced (i.e., pulsed) into the ALD reaction chamber. The precursor mixture may react with the uppermost sublayer 154N of the first alternating stack 151 to deposit the first metal M, the second metal M', and zinc on sublayer 154N.

The ALD reaction chamber may again optionally be purged using an inert gas, and a pulse 902 including a counter-reactant precursor (e.g., an oxygen precursor, such as $H_2O$) may be introduced into the ALD reaction chamber. The counter-reactant precursor may react with the first metal M, the second metal M', and zinc to form a sublayer 156 that includes a combination of a first metal oxide material (e.g., $InO_x$), a second metal oxide material (e.g., $GaO_x$), and zinc oxide ($ZnO_x$).

The ALD reaction chamber may again optionally be purged using an inert gas, and an additional pulse 903-m of the zinc precursor may be introduced, followed by a pulse 902 of the counter-reactant precursor, a pulse 901-m of the precursor mixture containing metals M and M', and a pulse 902 of the counter-reactant precursor. This sequence may then be repeated one or more times to form a second alternating stack 153 of sublayers 154M, 152M . . . 154T, 152T of the semiconductor channel layer 150.

Figure 10B:
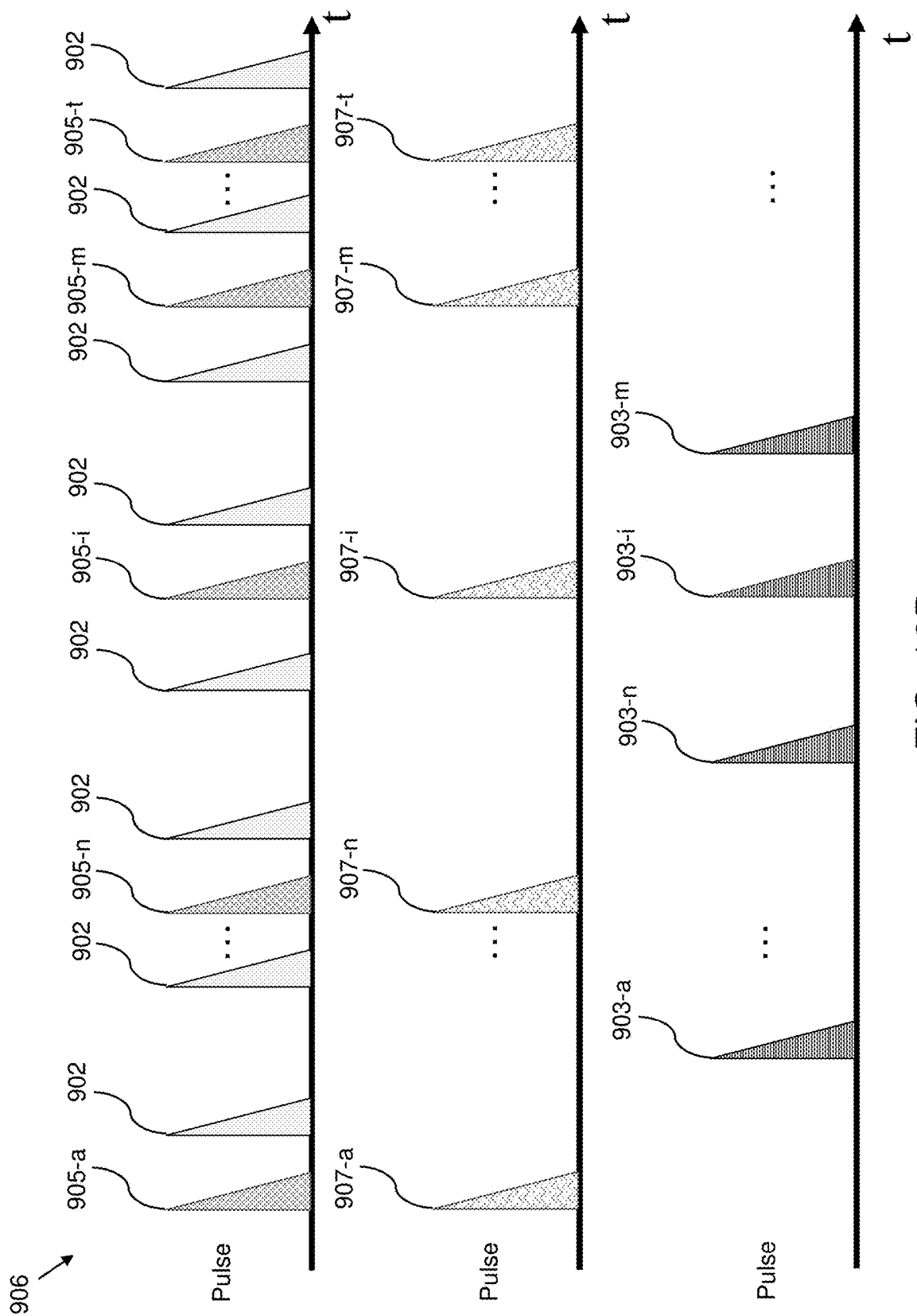
FIG. 10B is a plot showing an alternative pulse sequence for an atomic layer deposition (ALD) system that may be used to form an amorphous oxide semiconductor (AOS) channel layer made of a plurality of sublayers according to various embodiments of the present disclosure.

FIG. 10B is a plot showing an alternative pulse sequence 906 for an atomic layer deposition (ALD) system that may be used to form an amorphous oxide semiconductor (AOS) channel layer 150 made of a plurality of sublayers 152, 154, 156 according to various embodiments of the present disclosure. Referring to FIG. 10B, the pulse sequence 906 in this embodiment is similar to the pulse sequence 900 shown in FIG. 10A, except that that instead of introducing a single pulse 901-a of a precursor mixture including precursors containing a first metal, M, and a second metal, M', the ALD system may be operated in a co-pulse mode in which a first precursor pulse 905-a and a second precursor pulse 907-a may be introduced into the ALD reaction chamber at the same time. The first precursor pulse 905-a may include a precursor containing the first metal, M, and the second precursor pulse 907-a may include a precursor containing second metal, M'. The respective precursors may mix within the ALD reaction chamber and react with the gate dielectric material to deposit the first metal, M, and the second metal, M', on the gate dielectric material. Then, a pulse 902 of a counter-reactant precursor (e.g., an oxygen precursor, such as $H_2O$) may be introduced into the ALD reaction chamber, and may react with the first metal, M, and the second metal, M', to form a channel sublayer 152A including a combination of a first metal oxide material and a second metal oxide material (e.g., $InO_x$ and $GaO_x$). The process may continue similar to the process described above with reference to FIG. 10A, including introducing a pulse 903 of the zinc precursor (e.g., pulse 903-a), a pulse 902 of the counter-reactant precursor, followed by a simultaneous introduction of pulses 905, 907 of the precursors of the first metal M and the second metal M', followed by another pulse 902 of the counter-reactant precursor, and so forth, to form a first alternating stack 151 of sublayers 152A, 154A ... 152N, 154N of the semiconductor channel layer 150.

Referring again to FIG. 10B, following the formation of the first alternating stack 151, a first precursor pulse 905-i, a second precursor pulse 907-i, and a third precursor pulse 903-i may be introduced into the ALD reaction chamber at the same time. The first precursor pulse 905-i may include a precursor containing the first metal, M, the second precursor pulse 907-i may include a precursor containing second metal, M', and the third precursor pulse 903-i may include a precursor containing zinc. The precursor pulses 905-i, 907-i and 903-i may react with the uppermost sublayer 154N of the first alternating stack 151 to deposit the first metal M, the second metal M', and zinc on sublayer 154N. Then, a pulse 902 of a counter-reactant precursor (e.g., an oxygen precursor, such as $H_2O$) may be introduced into the ALD reaction chamber, and may react with the first metal, M, the second metal, M', and zinc, to form a sublayer 156 that includes a combination of a first metal oxide material (e.g., $InO_x$), a second metal oxide material (e.g., $GaO_x$), and zinc oxide ($ZnO_x$). A second alternating stack 153 of sublayers 154M, 152M ... 154T, 152T may then be formed over sublayer 156 using a similar process that was used to form the first alternating stack 151.

Figure 11:
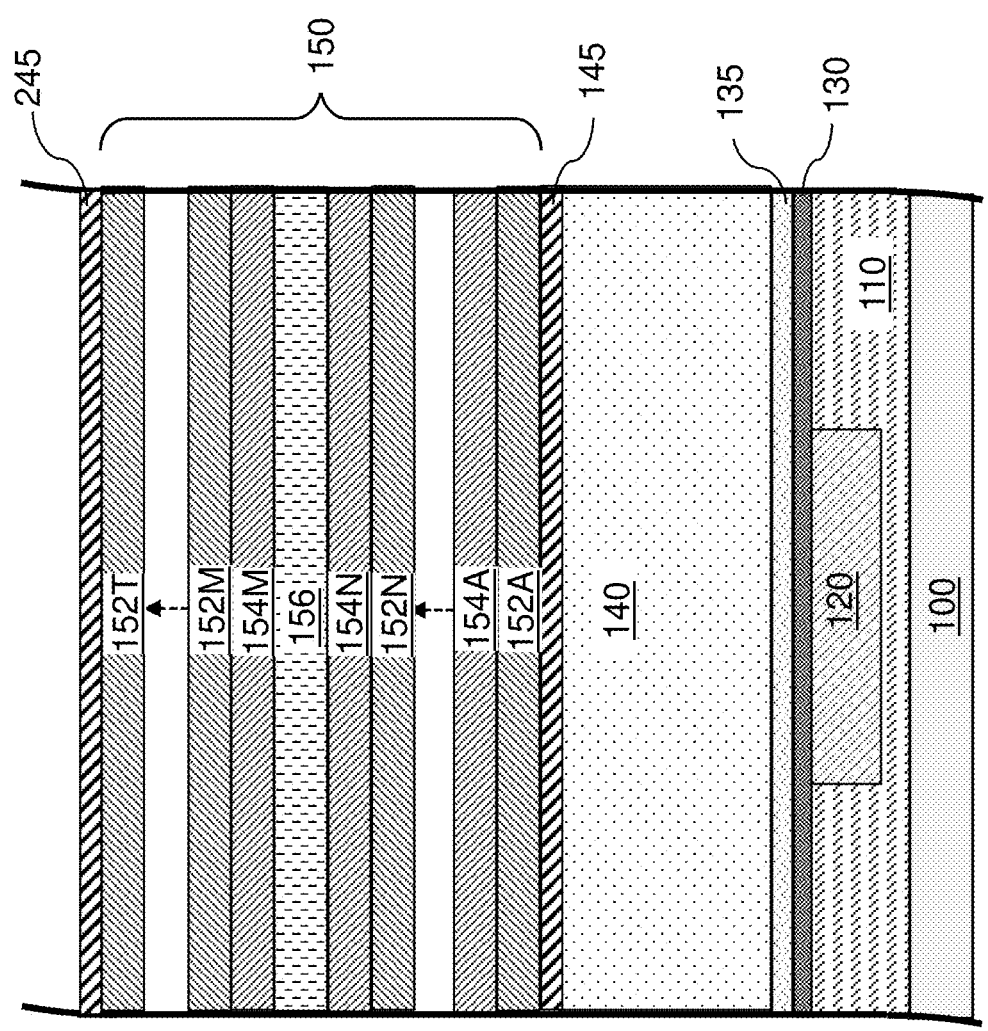
FIG. 11 is a vertical cross-section view of an exemplary intermediate structure during a process of forming a FeFET device illustrating an optional second insulating layer deposited over the upper surface of a channel layer.

FIG. 11 is a vertical cross-section view of an exemplary structure showing an optional second insulating layer 245 deposited over the upper surface of the channel layer 150. Referring to FIG. 11, the optional second insulating layer 245 (also referred to as a "blocking" layer) may include a layer of dielectric material, such as any of the dielectric materials of optional insulating layer 145 described above with reference to FIG. 7. Other suitable dielectric materials are within the scope of the present disclosure. In some embodiments, the optional second insulating layer 245 may be composed of the same material(s) as optional insulating layer 145. Alternatively, optional second insulating layer 245 may be composed of different material(s) than optional insulating layer 145. The optional second insulating layer 245 may be deposited using any suitable deposition processes, as described above. In various embodiments, the optional second insulating layer 245 may be deposited using atomic layer deposition (ALD). The thickness of the optional second insulating layer 245 may be in a range from 0.1 nm to 10 nm, although lesser and greater thicknesses may also be used.

The optional second insulating layer 245 may function as a barrier between the channel layer 150 and a ferroelectric (FE) material layer that may be subsequently formed over the insulating layer 245. The optional second insulating layer 245 may help to reduce surface state density ($D_{it}$) and inhibit carrier (i.e., electron and/or hole) injection from the semiconductor channel layer 150. In various embodiments, the material of the optional second insulating layer 245 may have a higher band gap ($E_g$) than the band gap of the semiconductor channel layer 150. For example, where the semiconductor channel layer 150 is amorphous $InGaZnO_4$ (a-IGZO), having a band gap $E_g$ of ~3.16 eV, the material of the optional second insulating layer 245 may have a larger band gap (e.g., $E_g \geq 3.5$ eV, such as $E_g \geq 5.0$ eV). Further, the conduction band offset ($E_{CBO}$) and the valence band offset ($E_{VBO}$) between the material of the optional second insulating layer 245 and the semiconductor channel layer 150 may be sufficiently large (e.g., $E_{CBO}$>1 eV, $E_{VBO}$>1 eV) to block charge carriers, including both electrons and holes, from being injected into the optional second insulating layer 245 and thereby minimize current leakage from the semiconductor channel layer 150. In various embodiments, the optional second insulating layer 245 may include silicon-doped hafnium oxide, such as $Hf_{1-x}Si_xO_y$, where x>0.1.

Figure 12:
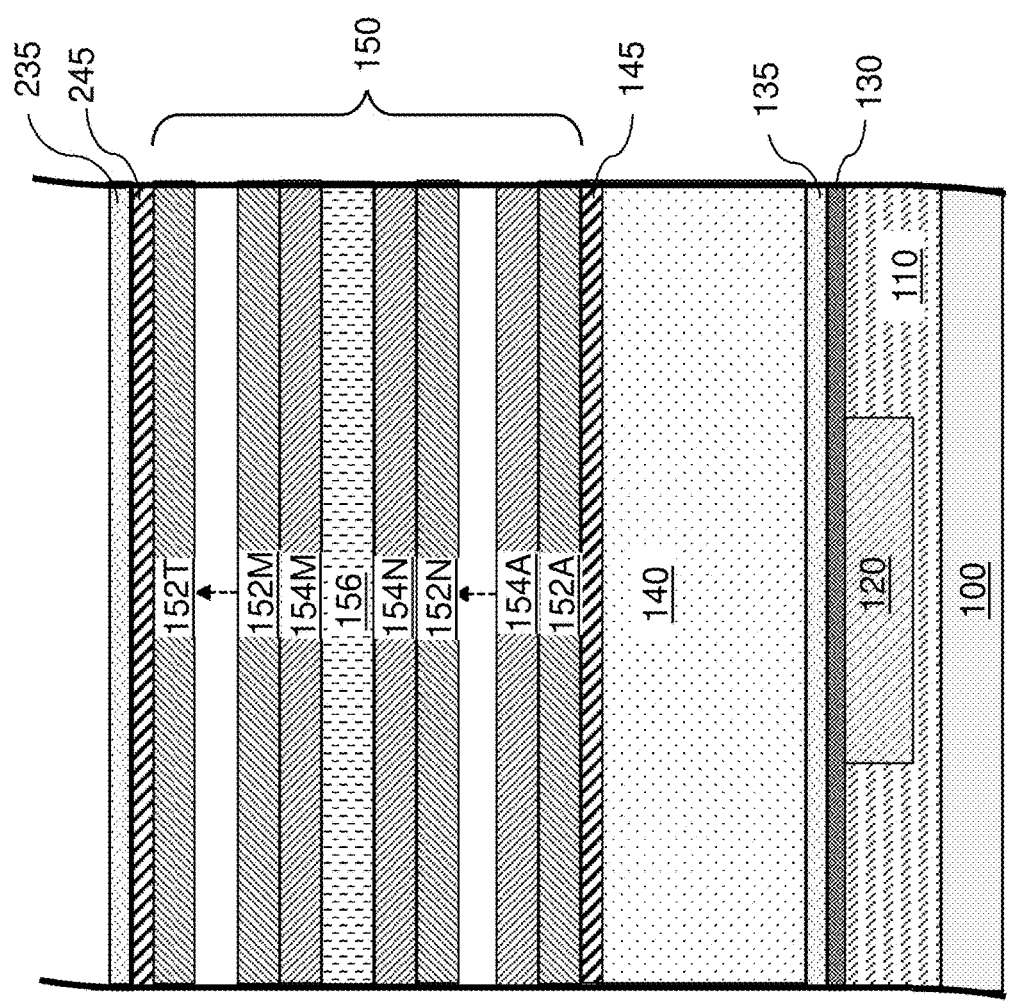
FIG. 12 is a vertical cross-section view of an exemplary intermediate structure during a process of forming a FeFET device illustrating an optional second seed layer deposited over the upper surface of an optional second insulating layer.

FIG. 12 is a vertical cross-section view of an exemplary structure showing an optional second seed layer 235 deposited over the upper surface of the optional second insulating layer 245. In embodiments in which the optional second insulating layer 245 is not present, the optional second seed layer 235 may be deposited over the upper surface of the semiconductor channel layer 150. The optional second seed layer 235 (also referred to as a ferroelectrical promotional layer) may include a material configured to promote the formation of a desired crystal structure in a FE material layer that is subsequently formed thereon. For example, the optional second seed layer 235 may promote the formation of cubic (c-phase), tetragonal (t-phase) and/or orthorhombic (o-phase) crystal phases relative to monoclinic crystal phases (m-phase) in the subsequently-formed FE material layer, and may also inhibit the transformation of t-phase crystal structures to m-phase crystal structures in the FE material layer. This may result in an FE material layer having improved ferroelectric properties, such as increased remnant polarization, Pr.

In various embodiments, the optional second seed layer 235 may include a metal oxide material, such as any of the materials of the optional seed layer 135 described above with reference to FIG. 5. Other suitable materials for the optional second seed layer 235 are within the contemplated scope of disclosure. In some embodiments, the optional second seed layer 235 may be composed of the same material(s) as optional seed layer 135. Alternatively, optional second seed layer 235 may be composed of different material(s) than optional seed layer 135. The optional second seed layer 235 may include a single layer of metal oxide material, or multiple layers of metal oxide materials which may have different compositions. In various embodiments, the seed layer material may have a crystal structure including cubic, tetragonal and/or orthorhombic crystal phases.

The optional second seed layer 235 may be deposited using any suitable deposition process. In various embodiments, the optional second seed layer 235 may be deposited using atomic layer deposition (ALD) or pulsed laser deposition (PLD). In some embodiments, the optional second seed layer 235 may be thermally annealed for 30 seconds to 10 minutes at temperatures between 300° C. and 700° C. to increase the crystallinity of the optional second seed layer 235. Alternatively or in addition, the optional second seed layer 235 may be deposited as a quasi-single crystal metal oxide material using a suitable deposition technique (e.g., PLD). The thickness of the optional second seed layer 235 may be in a range from 0.1 nm to 5 nm, although lesser and greater thicknesses may also be used.

Figure 13:
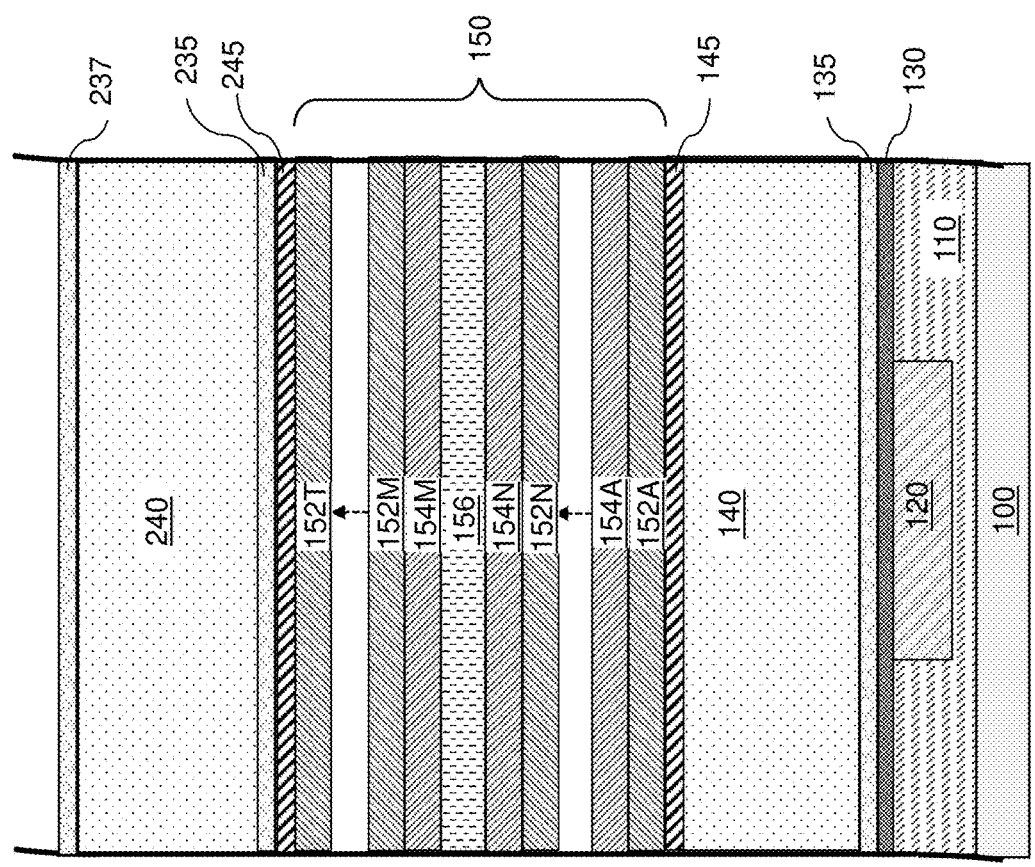
FIG. 13 is a vertical cross-section view of an exemplary intermediate structure during a process of forming a FeFET device illustrating a second ferroelectric (FE) material layer formed over an optional second seed layer and an optional third seed layer deposited over the upper surface of the second FE material layer.

FIG. 13 is a vertical cross-section view of an exemplary structure showing a second ferroelectric (FE) material layer 240 formed over the optional second seed layer 235 and an optional third seed layer 237 deposited over the upper surface of the second FE material layer 240. In embodiments in which the optional second seed layer 235 is not present, the second FE material layer 240 may be deposited over the upper surface of the optional second insulating layer 245. In embodiments in which neither the optional second seed layer 235 nor the optional second insulating layer 245 are present, the second FE material layer 240 may be deposited over the upper surface of the semiconductor channel layer 150.

Referring to FIG. 13, the second FE material layer 240 may be formed of any suitable ferroelectric material, including any of the ferroelectric materials of FE material layer 140 described above with reference to FIG. 6. Other suitable materials for the second FE material layer 240 are within the contemplated scope of disclosure. In some embodiments, the second FE material layer 240 may be composed of the same material(s) as the FE material layer 140. Alternatively, the second FE material layer 240 may be composed of different material(s) than the FE material layer 140.

In embodiments, the second FE material layer 240 may include a single layer of FE material, or multiple layers of FE materials which may have different compositions. In various embodiments, the second FE material layer 240 may have a crystal structure including cubic, tetragonal and/or orthorhombic crystal phases. In embodiments, the second FE material layer 240 may include a hafnium oxide-based ferroelectric material, such as $Hf_xZr_{1-x}O_y$, and may have a structure such that a volume of the FE material having a cubic, tetragonal and/or orthorhombic crystal structure is more than 50% greater than a volume of the FE material having a monoclinic crystal structure.

The second FE material layer 240 may be deposited using any suitable deposition process. In various embodiments, the second FE material layer 240 may be deposited using atomic layer deposition (ALD). The thickness of the second FE material layer 240 may be in a range from 0.1 nm to 100 nm, although lesser and greater thicknesses may also be used.

Referring again to FIG. 13, an optional third seed layer 237 may be deposited over an upper surface of the second FE material layer 240. The optional third seed layer 237 (also referred to as a ferroelectrical promotional layer) may include a material configured to promote the formation and maintenance of a desired crystal structure in the underlying second FE material layer 240. For example, the optional third seed layer 237 may promote the formation and/or maintenance of cubic (c-phase), tetragonal (t-phase) and/or orthorhombic (o-phase) crystal phases relative to monoclinic crystal phases (m-phase) in the second FE material layer 240, and may also inhibit the transformation of t-phase crystal structures to m-phase crystal structures in the second FE material layer 240. This may result in an FE material layer having improved ferroelectric properties, such as increased remnant polarization, Pr.

In various embodiments, the optional third seed layer 237 may include a metal oxide material, such as any of the materials of the optional seed layer 135 described above with reference to FIG. 5. Other suitable materials for the optional third seed layer 237 are within the contemplated scope of disclosure. In some embodiments, the optional third seed layer 237 may be composed of the same material(s) as optional seed layer 135 and/or optional second seed layer 235. Alternatively, optional third seed layer 237 may be composed of different material(s) than optional seed layer 135 and/or optional second seed layer 235. The optional third seed layer 237 may include a single layer of metal oxide material, or multiple layers of metal oxide materials which may have different compositions. In various embodiments, the seed layer material may have a crystal structure including cubic, tetragonal and/or orthorhombic crystal phases.

The optional third seed layer 237 may be deposited using any suitable deposition process. In various embodiments, the optional third seed layer 237 may be deposited using atomic layer deposition (ALD) or pulsed laser deposition (PLD). In some embodiments, the optional third seed layer 237 may be thermally annealed for 30 seconds to 10 minutes at temperatures between 300° C. and 700° C. to increase the crystallinity of the optional third seed layer 237. Alternatively or in addition, the optional third seed layer 237 may be deposited as a quasi-single crystal metal oxide material using a suitable deposition technique (e.g., PLD). The thickness of the optional third seed layer 237 may be in a range from 0.1 nm to 5 nm, although lesser and greater thicknesses may also be used.

Figure 14:
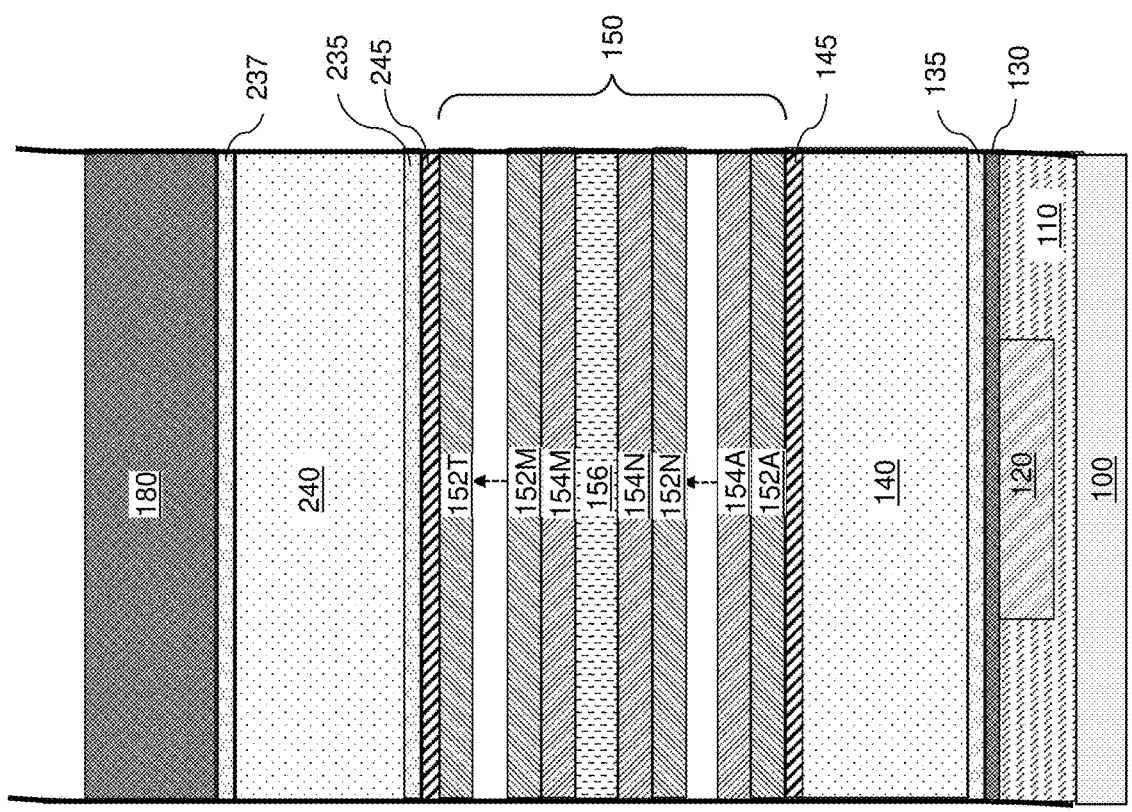
FIG. 14 is a vertical cross-section view of an exemplary intermediate structure during a process of forming a FeFET device illustrating a dielectric material layer formed over an optional third seed layer.

FIG. 14 is a vertical cross-section view of an exemplary structure showing a dielectric material layer 180 formed over the optional third seed layer 237. In embodiments in which the optional third seed layer 237 is not present, the dielectric material layer 180 may be deposited over the upper surface of the second FE material layer 240. Referring to FIG. 14, the dielectric material layer 180 may be composed of a suitable dielectric material, such as aluminum oxide or silicon oxide. Other materials are within the contemplated scope of disclosure. In some embodiments, the dielectric material layer 180 may be a low-k dielectric material. The dielectric material layer 180 may be deposited using a suitable deposition method as described above.

Figure 15:
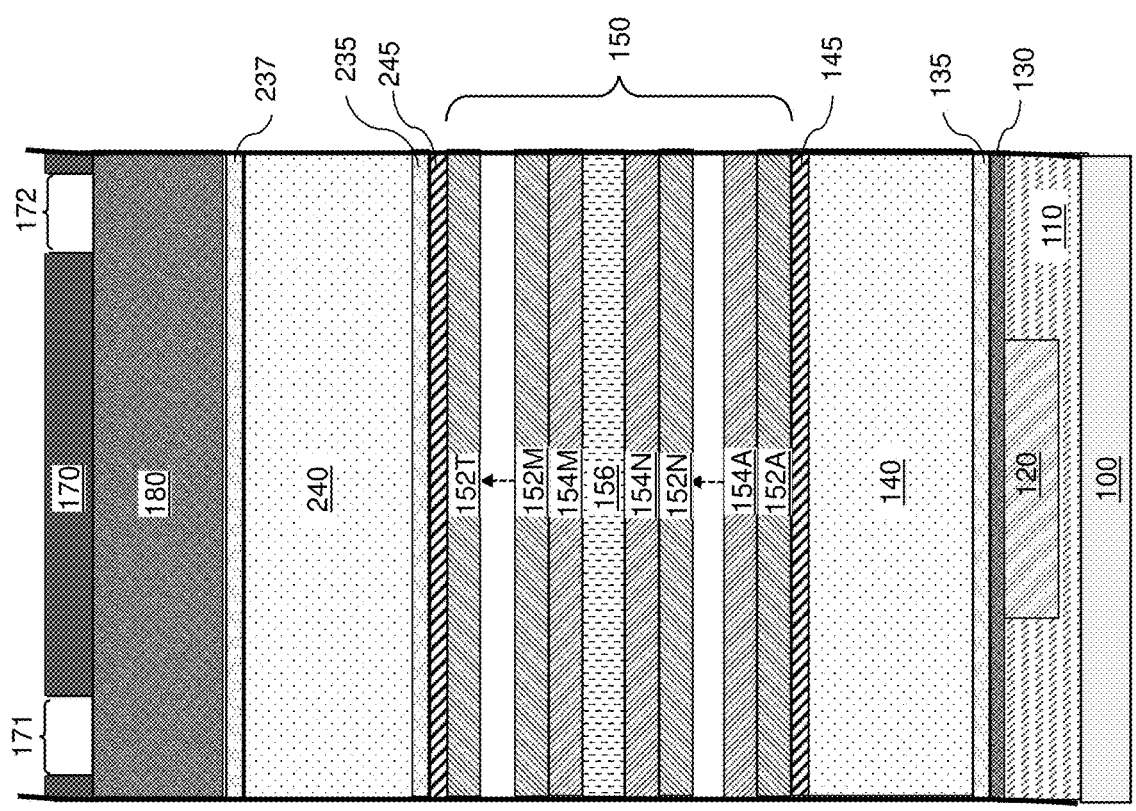
FIG. 15 is a vertical cross-section view of an exemplary intermediate structure during a process of forming a FeFET device illustrating a patterned mask over the upper surface of a dielectric material layer.

FIG. 15 is a vertical cross-section view of an exemplary structure during a process of forming a FeFET device showing a patterned mask 170 over the upper surfaces of the dielectric material layer 180. The patterned mask 170 may be patterned using photolithography to remove portions of the mask material and expose regions 171 and 172 of the upper surface of the dielectric material layer 180. The exposed regions 171 and 172 of the dielectric material layer 180 may correspond to the locations of source and drain regions, respectively, that may be subsequently formed.

Figure 16:
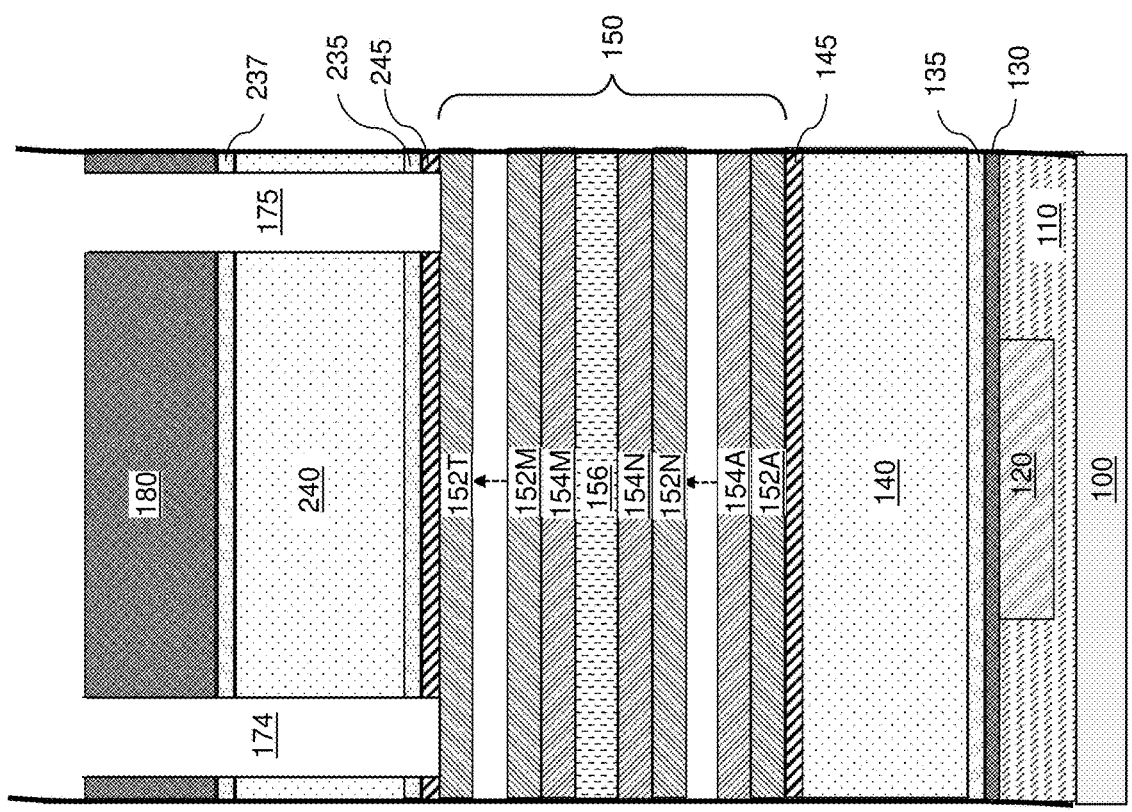
FIG. 16 is a vertical cross-section view of an exemplary intermediate structure during a process of forming a FeFET device illustrating openings formed through a dielectric material layer, an optional third seed layer, a second FE material layer, an optional second seed layer, and an optional second insulating layer to expose the upper surface of a channel layer.

FIG. 16 is a vertical cross-section view of an exemplary structure during a process of forming a FeFET device showing openings 174 and 175 formed through the dielectric material layer 180, the optional third seed layer 237, the second FE material layer 240, the optional second seed layer 235, and the optional second insulating layer 245 to expose the upper surface of the channel layer 150. Referring to FIG. 16, the exemplary intermediate structure may be etched through the patterned mask 170 to remove portions of the dielectric material layer 180, the optional third seed layer 237, the second FE material layer 240, the optional second seed layer 235, and the optional second insulating layer 245 and expose the upper surface of the channel layer 150. The regions of the channel layer 150 exposed through the openings 174 and 175 may correspond to source and drain regions, respectively, of the FeFET device. Following the etching process, the patterned mask 170 may be removed using a suitable process, such as by ashing or by dissolution using a solvent.

Figure 17:
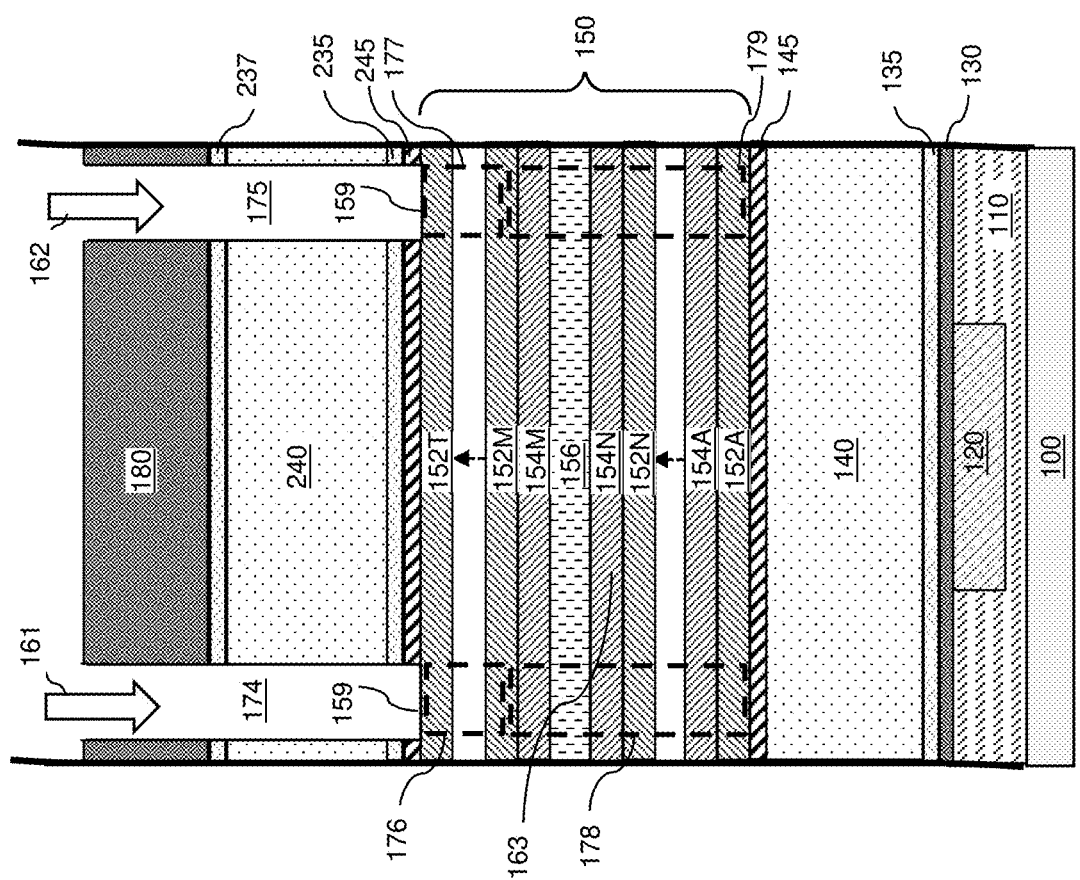
FIG. 17 is a vertical cross-section view of an exemplary intermediate structure during a process of forming a FeFET device illustrating a plasma treatment of source and drain regions and of a channel layer.

FIG. 17 is a vertical cross-section view of an exemplary structure during a process of forming a FeFET device showing a plasma treatment of source and drain regions 176 and 177 of the channel layer 150. Referring to FIG. 17, the source and drain regions 176 and 177 of the channel layer 150 may be subjected to a plasma treatment (indicated schematically by arrows 161 and 162). In embodiments, the plasma treatment may be a helium (He) plasma treatment. The plasma treatment of the source and drain regions 176 and 177 of the channel layer 150 may be conducted for between 5 seconds and 5 minutes, such as between 30 and 120 seconds (e.g., ~60 seconds). The plasma treatment may be conducted with a power density that is greater than 0.3 W/cm$^2$, such as between 0.8 and 1.2 W/cm$^2$ (e.g., ~0.98 W/cm$^2$).

In embodiments, the plasma treatment may lower the contact resistance at the source and drain regions 176 and 177. In various embodiments, the plasma treatment may result in regions that are comparatively rich in the first metal, M, of the channel layer 150 (e.g. In), which may promote a reduction in contact resistance. The plasma treatment may also produce regions 178, 179 of the channel layer 150 beneath the source and drain regions 176 and 177 that may be comparatively rich in oxygen vacancies. In embodiments, the oxygen-vacancy rich regions 178 and 179 may be located at a depth of at least about 0.5 nm beneath the upper surface 159 of the channel layer 150, and may extend to a depth of up to about 70 nm beneath the upper surface 159 of the channel layer 150. In various embodiments, a concentration of oxygen vacancies in regions 178, 179 beneath the source and drain regions 176, 177 may be greater than a concentration of oxygen vacancies within a central region 163 of the channel layer located between regions 178 and 179. The oxygen-vacancy rich regions 178 and 179 of the channel layer 150 may reduce the source-gate and drain-gate resistance of the channel layer 150.

Figure 18:
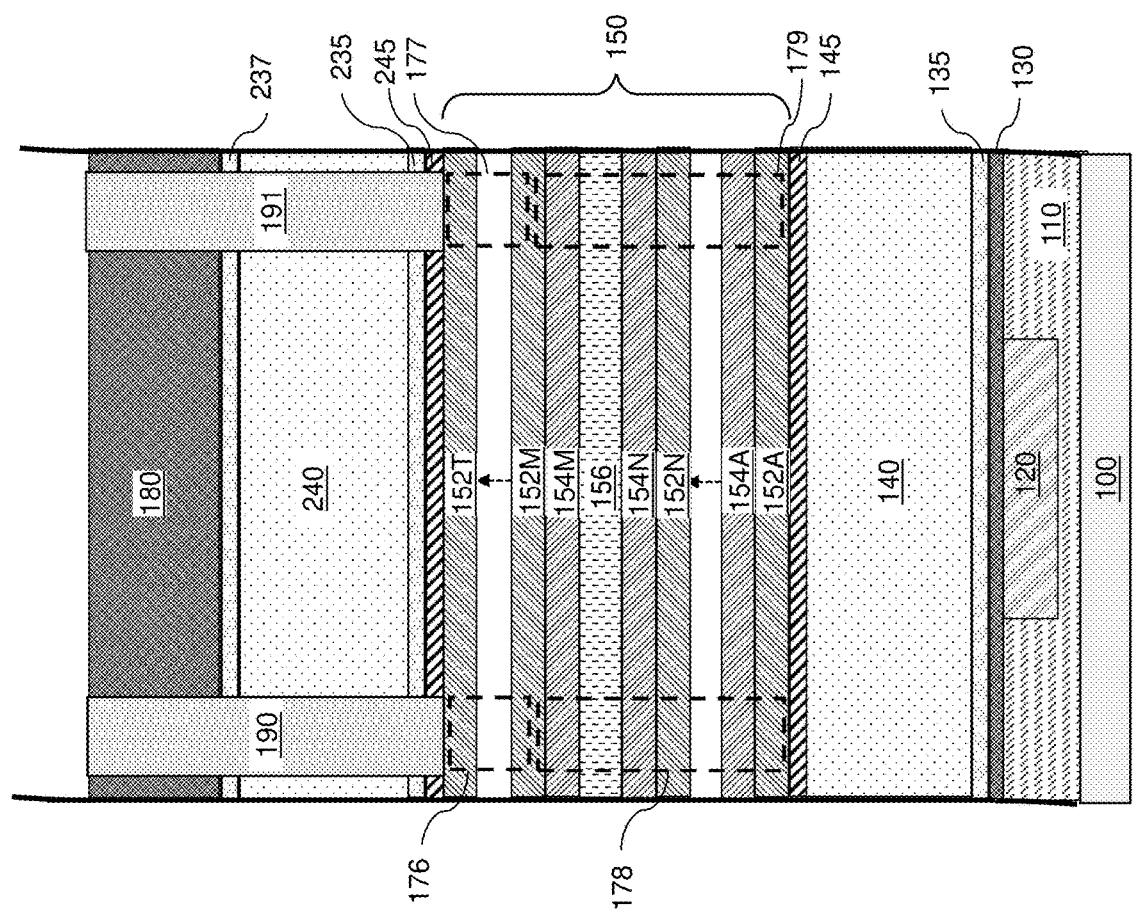
FIG. 18 is a vertical cross-section view of an exemplary intermediate structure during a process of forming a FeFET device including source and drain electrodes formed over source and drain regions of a channel layer.

FIG. 18 is a vertical cross-section view of an exemplary structure during a process of forming a FeFET device including source and drain electrodes 190 and 191 formed over the source region 176 and drain region 177 of the channel layer 150. Referring to FIG. 18, the source electrode 190 and drain electrode 191 may include any suitable electrically conductive material, such as titanium nitride (TiN), molybdenum (Mo), copper (Cu), aluminum (Al), zirconium (Zr), titanium (Ti), tungsten (W), tantalum (Ta), tantalum nitride (TaN), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. Other suitable electrode materials are within the scope of disclosure. The source and drain electrodes 190 and 191 may electrically contact the source region 176 and drain region 177, respectively, of the channel layer 150. The source electrode 190 and drain electrode 191 may be deposited using any suitable deposition method, such as physical vapor deposition (PVD), sputtering, chemical vapor deposition (CVD), atomic layer deposition (ALD), plasma-enhanced chemical vapor deposition (PECVD), or combinations thereof. In embodiments, the source electrode 190 and drain electrode 191 may be deposited via atomic layer deposition (ALD). In various embodiments, the source electrode 190 and drain electrode 191 may be formed by depositing a layer of an electrically conductive material over the upper surfaces of the dielectric material layer 180 and within the openings 174, 175 through the dielectric material layer 180, the optional third seed layer 237, the second FE material layer 240, the optional second seed layer 235, and the optional second insulating layer 245. Then, a planarization process, such as a chemical mechanical planarization (CMP) process, may be used to remove portions of the electrically conductive material from above the upper surface of the dielectric material layer 180 and provide discrete source and drain electrodes 190 and 191 contacting the upper surface of the channel layer 150. In embodiments, the upper surfaces of the source and drain electrodes 190 and 191 may be co-planar with the upper surface of the dielectric material layer 180. In embodiments, the source electrode 190 and drain electrode 191 may have a thickness between lower and upper surfaces of the source electrode 190 and drain electrode 191 that is between about 50 nm and about 1000 nm.

Figure 19:
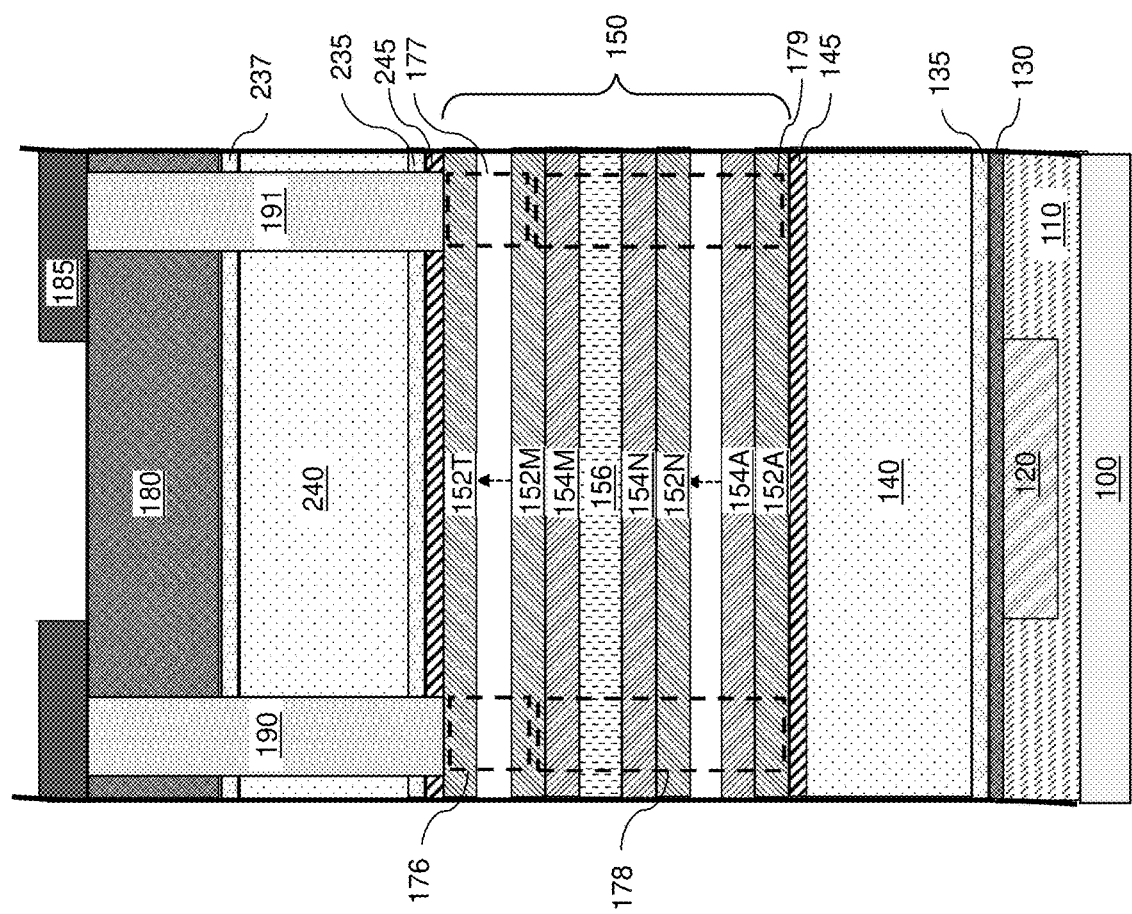
FIG. 19 is a vertical cross-section view of an exemplary intermediate structure during a process of forming a FeFET device showing a patterned mask over the upper surfaces of a dielectric material layer and source and drain electrodes.

FIG. 19 is a vertical cross-section view of an exemplary structure during a process of forming a FeFET device showing a patterned mask 185 over the upper surfaces of the dielectric material layer 180 and the source and drain electrodes 190 and 191. The patterned mask 185 may be patterned using photolighography to remove portions of the mask material and expose a portion of the upper surface of the dielectric material layer 180. The exposed portion of the upper surface of the dielectric material layer 180 may correspond to the location of an upper gate electrode that may be subsequently formed.

Figure 20:
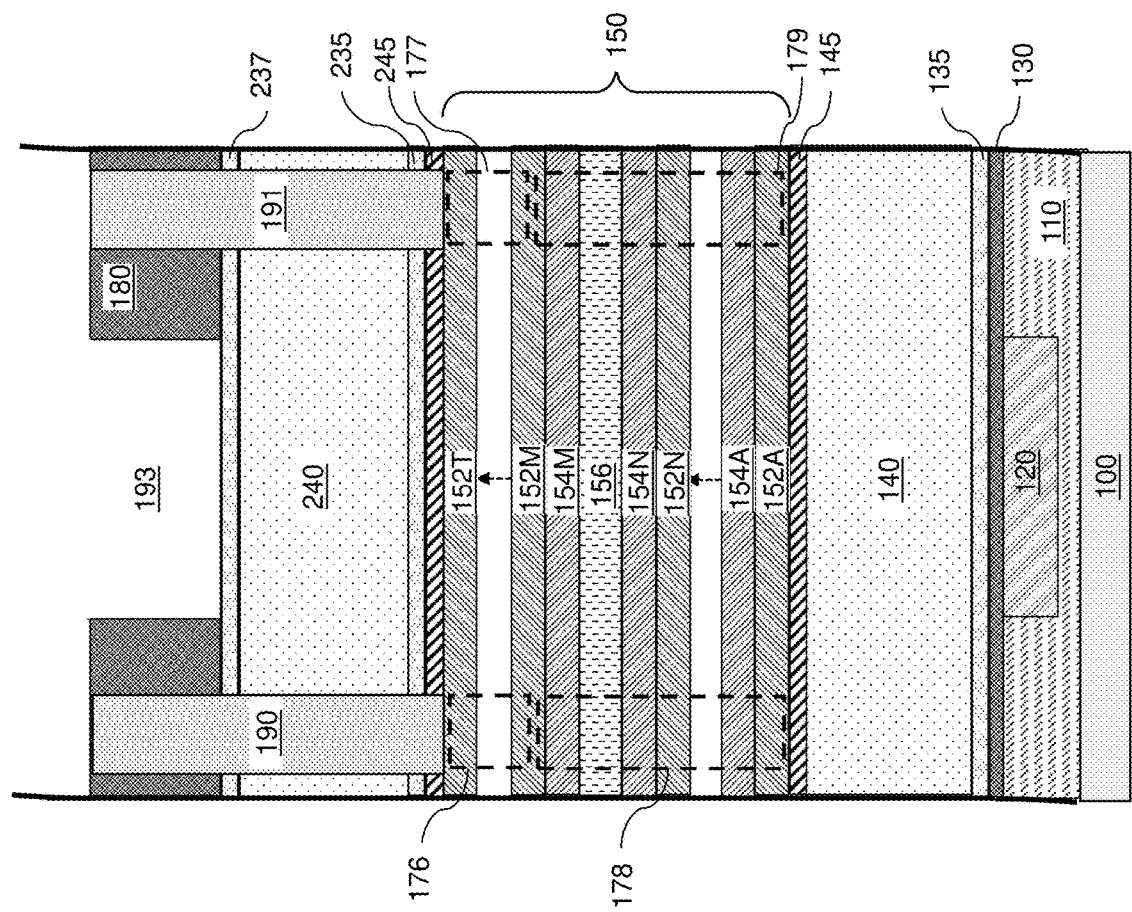
FIG. 20 is a vertical cross-section view of an exemplary structure during a process of forming a FeFET device showing an opening formed through a dielectric material layer to expose the upper surface of an optional third seed layer.

FIG. 20 is a vertical cross-section view of an exemplary structure during a process of forming a FeFET device showing an opening 193 formed through the dielectric material layer 180 to expose the upper surface of the optional third seed layer 237. Referring to FIG. 20, the exemplary intermediate structure may be etched through the patterned mask 185 to remove portions of the dielectric material layer 180 and expose the upper surface of the optional third seed layer 237. In embodiments in which the optional third seed layer 237 is not present, the etching process may expose the upper surface of the second FE material layer 240. Following the etching process, the patterned mask 185 may be removed using a suitable process, such as by ashing or by dissolution using a solvent.

Figure 21:
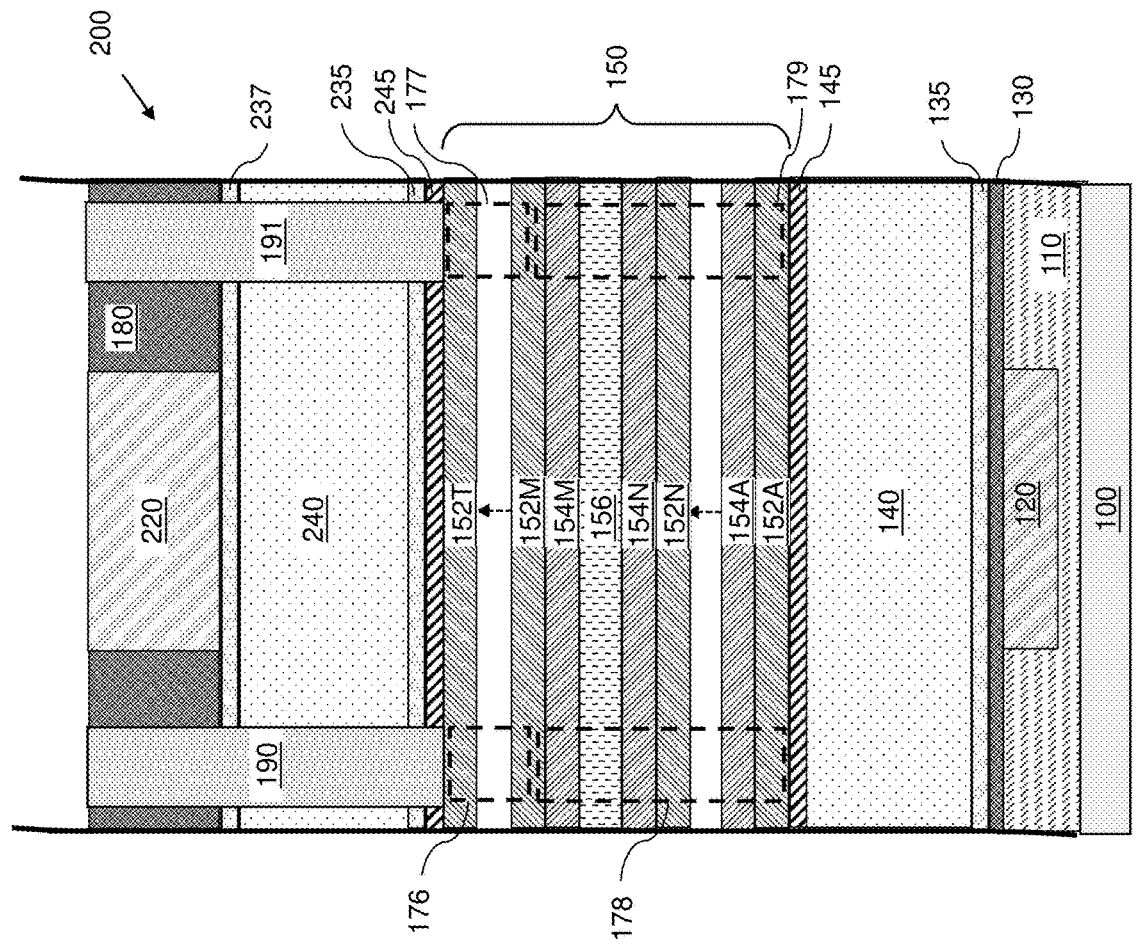
FIG. 21 is a vertical cross-section view of an exemplary structure of a FeFET device including a double-gate structure according to an embodiment of the present disclosure.

FIG. 21 is a vertical cross-section view of an exemplary structure of a FeFET device 200 including an upper gate electrode 220 formed in an opening in the dielectric material layer 180. The upper gate electrode 220 may be composed of a suitable electrically conductive material, including any of the electrically materials of the bottom gate electrode 120 described above with reference to FIG. 3. Other suitable materials for the upper gate electrode 220 are within the contemplated scope of disclosure. In some embodiments, the upper gate electrode 220 may be composed of the same material(s) as the bottom gate electrode 120. Alternatively, the upper gate electrode 220 may be composed of different material(s) than the bottom gate electrode 120.

In some embodiments, the material of the upper gate electrode layer 220 may optionally have a lower coefficient of thermal expansion (CTE) than the CTE of the second FE material layer 240. For example, in embodiments in which the second FE material layer 240 includes hafnium zirconium oxide (HZO), which has a CTE of $14\times10^{-6}$/K, the upper gate electrode layer 220 may include material(s) having a CTE that is less than $14\times10^{-6}$/K. Suitable electrically conductive materials having a comparatively lower CTE include, without limitation, platinum (Pt), titanium (Ti), titanium nitride (TiN), tungsten (W), tantalum (Ta), tantalum nitride (TaN), iron (Fe), nickel (Ni), beryllium (Be), chromium (Cr), cobalt (Co), antimony (Sb), iridium (Ir), molybdenum (Mo), osmium (Os), thorium (Th), vanadium (V), alloys thereof, and combinations of the same. In various embodiments, tensile strain may be induced in the second FE material layer 240 by subjecting the structure shown in FIG. 21 to an annealing process, which may include annealing the structure at a temperature between 400° C. and 700° C. for between 30 seconds and 5 minutes, followed by a cool down period. During the cool down period, the second FE material layer 240 may shrink to a greater extent than the upper gate electrode 220 due to the differential in CTE. This may stretch the second FE material layer 240 and subject the second FE material layer 240 to a permanent tensile strain.

The upper gate electrode 220 may be deposited using any suitable deposition method, such as physical vapor deposition (PVD), sputtering, chemical vapor deposition (CVD), atomic layer deposition (ALD), plasma-enhanced chemical vapor deposition (PECVD), or combinations thereof. In various embodiments, the upper gate electrode 220 may be formed by depositing a layer of an electrically conductive material over the upper surfaces of the dielectric material layer 180 and the source electrode 190 and drain electrode 191 and within the opening 193 in the dielectric material layer 180. Then, a planarization process, such as a chemical mechanical planarization (CMP) process, may be used to remove portions of the electrically conductive material from above the upper surfaces of the dielectric material layer 180, the source electrode 190 and drain electrode 191 and provide a discrete upper gate electrode 220. In embodiments, the dielectric material layer 180 may contact the side surfaces of the upper gate electrode layer 220 and may laterally separate the upper gate electrode layer 220 from the source electrode 190 and drain electrode 191 located on opposite sides of the upper gate electrode 220. In embodiments, the upper surfaces of the source electrode 190 and drain electrode 191 and the dielectric material layer 180 may be co-planar with the upper surface of the upper gate electrode 220. In some embodiments, the upper gate electrode 220 may have thickness between lower and upper surfaces of the upper gate electrode that is between about 50 nm and about 1000 nm.

The exemplary FeFET device 200 shown in FIG. 21 includes a double-gate structure, including a bottom gate electrode 120 disposed on a first side of a semiconductor channel 150, and an upper gate electrode 220 disposed on a second side of the semiconductor channel 150. A first FE material layer 140 is located between the bottom gate electrode 120 and the semiconductor channel 150, and a second FE material layer 240 is located between the upper gate electrode 220 and the semiconductor channel 150. Source and drain electrodes 190, 191 contact the upper surface of the semiconductor channel 150.

Figure 22:
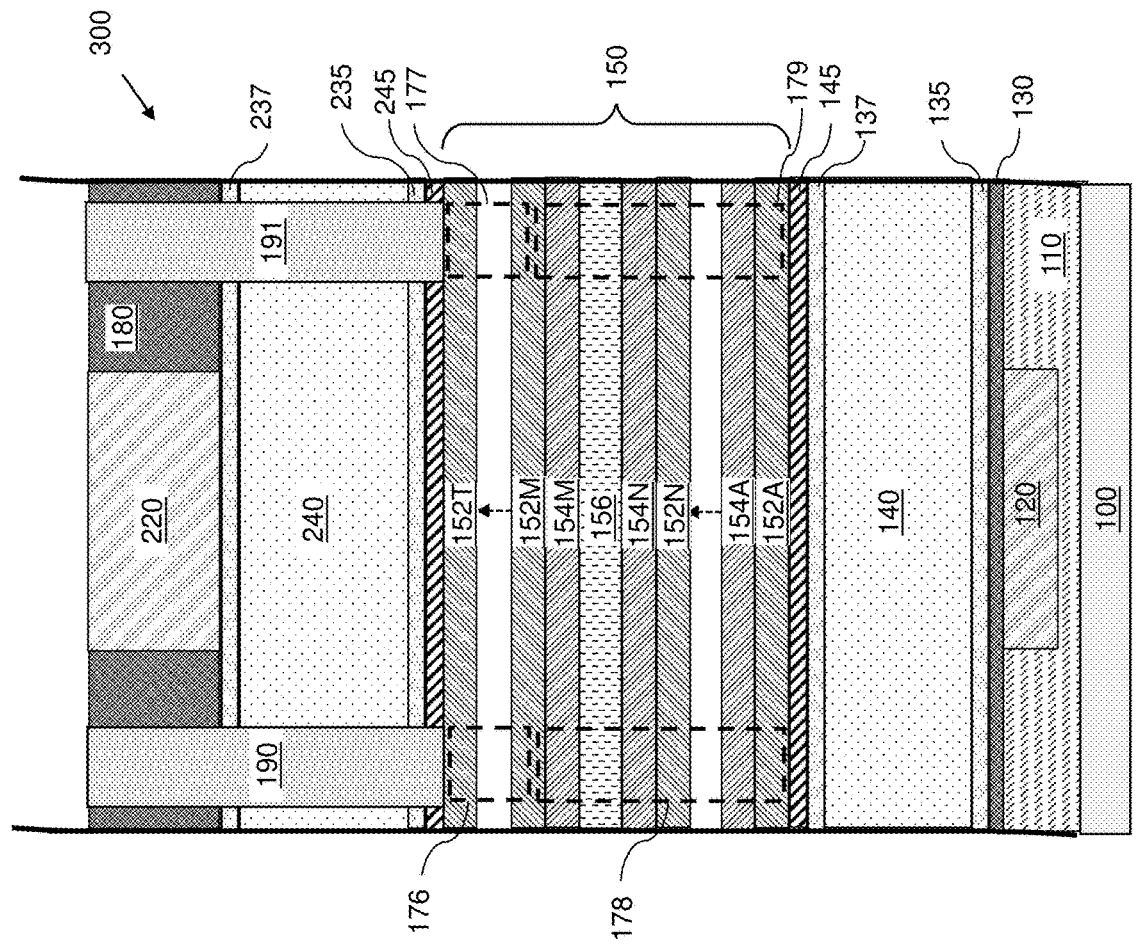
FIG. 22 is a vertical cross-section view of an exemplary structure of a FeFET device including a double-gate structure according to another embodiment of the present disclosure.

FIG. 22 is a vertical cross-section view of an alternative exemplary structure of a double-gate FeFET device 300 including an optional fourth seed layer 137 disposed between the FE material layer 140 and the optional insulting layer 145. The alternative exemplary structure shown in FIG. 22 may be derived from the exemplary intermediate structure shown in FIG. 6 by depositing the optional fourth seed layer 137 over the upper surface of the FE material layer 140. The optional fourth seed layer 137 may have the same or similar composition and structure as optional seed layer 135, optional second seed layer 235 and/or optional third seed layer 237 described above. The optional fourth seed layer 137 may include a material configured to promote the formation and maintenance of a desired crystal structure in the underlying FE material layer 140. The optional fourth seed layer 137 may be deposited using a suitable deposition process as described above. Following the deposition of the optional fourth seed layer 137, the process steps described above with reference to FIGS. 7-21 may be performed to provide a FeFET device 300 as shown in FIG. 22.

Figure 23:
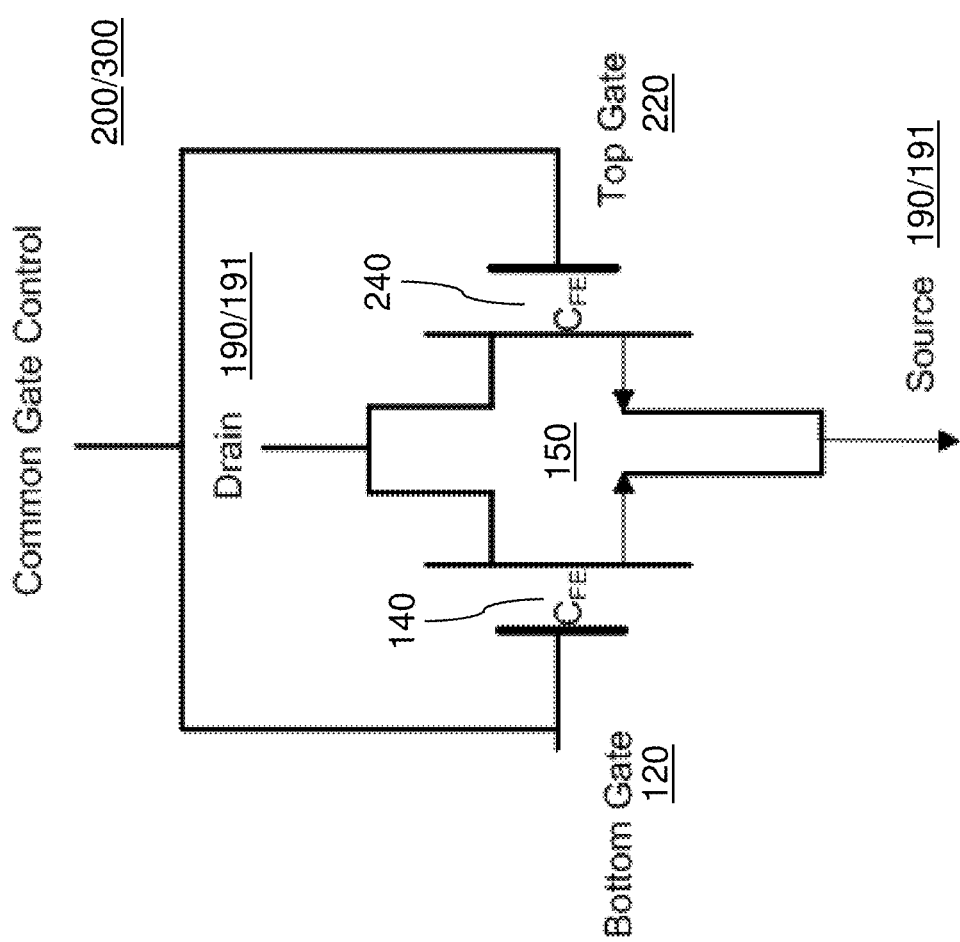
FIG. 23 is a circuit diagram schematically illustrating a FeFET device including a double-gate structure operated in a common gate control mode according to various embodiments of the present disclosure.

FIG. 23 is a circuit diagram schematically illustrating a FeFET device 200, 300 having a double-gate structure operated in a common gate control mode. Referring to FIG. 23, the bottom gate electrode 120 and the upper gate electrode 220 may be connected to a common supply line, such that the same voltage may be applied to both the bottom gate electrode 120 and the upper gate electrode 220. The FE material layers 140, 240 may function as a gate insulating layers between the respective bottom and upper gate electrodes 120, 220 and the semiconductor channel 150. By providing gate electrodes 120, 220 and FE material layers 140, 240 on two opposing sides of the semiconductor channel 150, the polarization, memory window and on-current ($I_{on}$) of the double-gate FeFET device 200, 300 may be increased relative to a FeFET device having a single gate electrode and a single FE material layer on one side of the semiconductor channel 150 (i.e., a single-gate FeFET structure). In some embodiments, the polarization, memory window and/or on-current may be effectively doubled in comparison to a single-gate FeFET structure.

FIGS. 24-37 are sequential vertical cross-sectional views of an exemplary structure during a process of forming a FeFET device according to another alternative embodiment of the present disclosure. The FeFET device according to the alternative embodiment of FIGS. 24-37 may include a double-gate structure as shown in the FeFET devices 200, 300 of FIGS. 21 and 22. In addition, the FeFET device according to the alternative embodiment of FIGS. 24-37 may also include a first pair of source and drain electrodes contacting a first side of the semiconductor channel, and a second pair of source and drain electrodes contacting a second side of the semiconductor channel. This may enable a FeFET device having a double gate structure that may be operated in a separated gate control mode, as described in further detail below.

Figure 24:
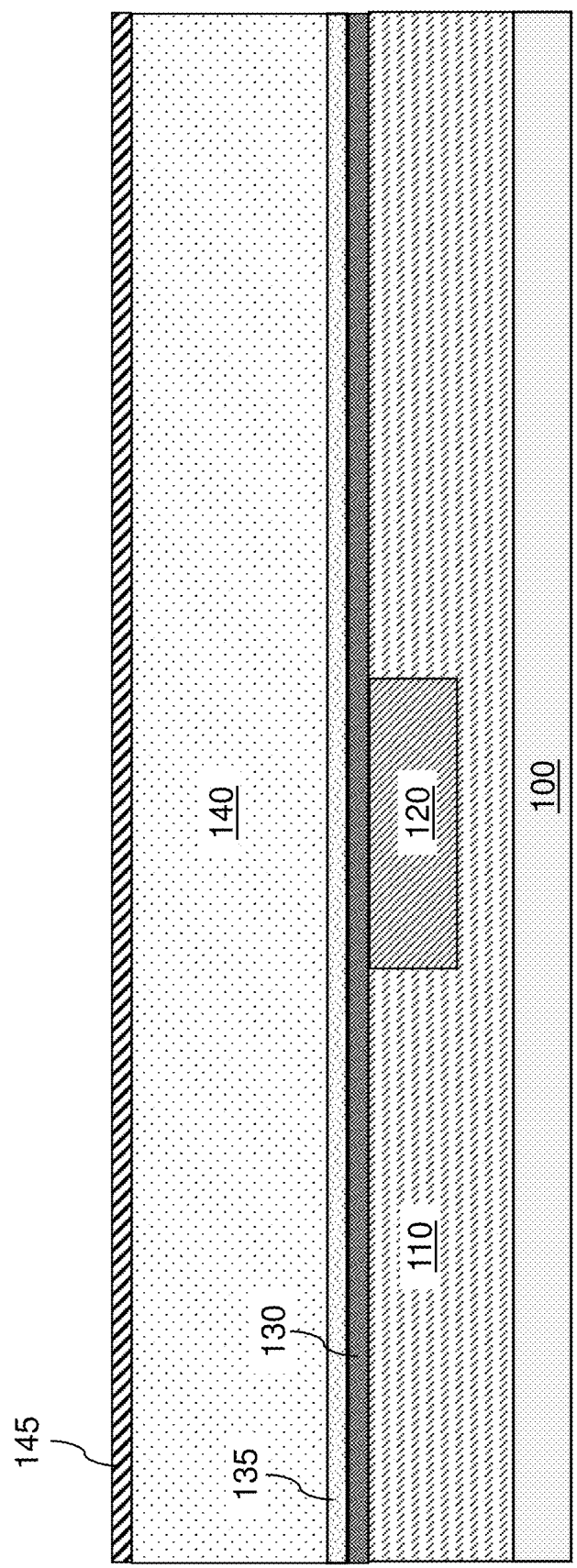
FIG. 24 is a vertical cross-section view of an exemplary intermediate structure during a process of forming a FeFET device that includes a substrate, a first dielectric layer over the substrate, a bottom gate electrode embedded in the first dielectric layer, an optional stress layer over the first dielectric layer and the bottom gate electrode, an optional seed layer over the optional stress layer, a ferroelectric (FE) material layer over the optional seed layer, and an optional insulting layer over the FE material layer.

FIG. 24 is a vertical cross-section view of an exemplary intermediate structure during a process of forming a FeFET device that includes a substrate 100, a first dielectric layer 110 over the substrate 100, a bottom gate electrode 120 embedded in the first dielectric layer 110, an optional stress layer 130 over the first dielectric layer 110 and the bottom gate electrode 120, an optional seed layer 135 over the optional stress layer 130, a ferroelectric (FE) material layer 140 over the optional seed layer 135, and an optional insulting layer 145 over the FE material layer 140. The exemplary intermediate structure shown in FIG. 24 may be derived from the exemplary intermediate structure shown in FIG. 7, thus repeated discussion of the structure and details of the substrate 100, the first dielectric layer 110, the bottom gate electrode 120, the optional stress layer 130, the optional seed layer 135, the FE material layer 140 and the optional insulting layer 145 are omitted. In some embodiments, an additional seed layer (not shown in FIG. 24) may be located over the FE material layer 140, such as the optional fourth seed layer 137 disposed between the FE material layer 140 and the optional insulating layer 145 as shown in FIG. 22.

Figure 25:
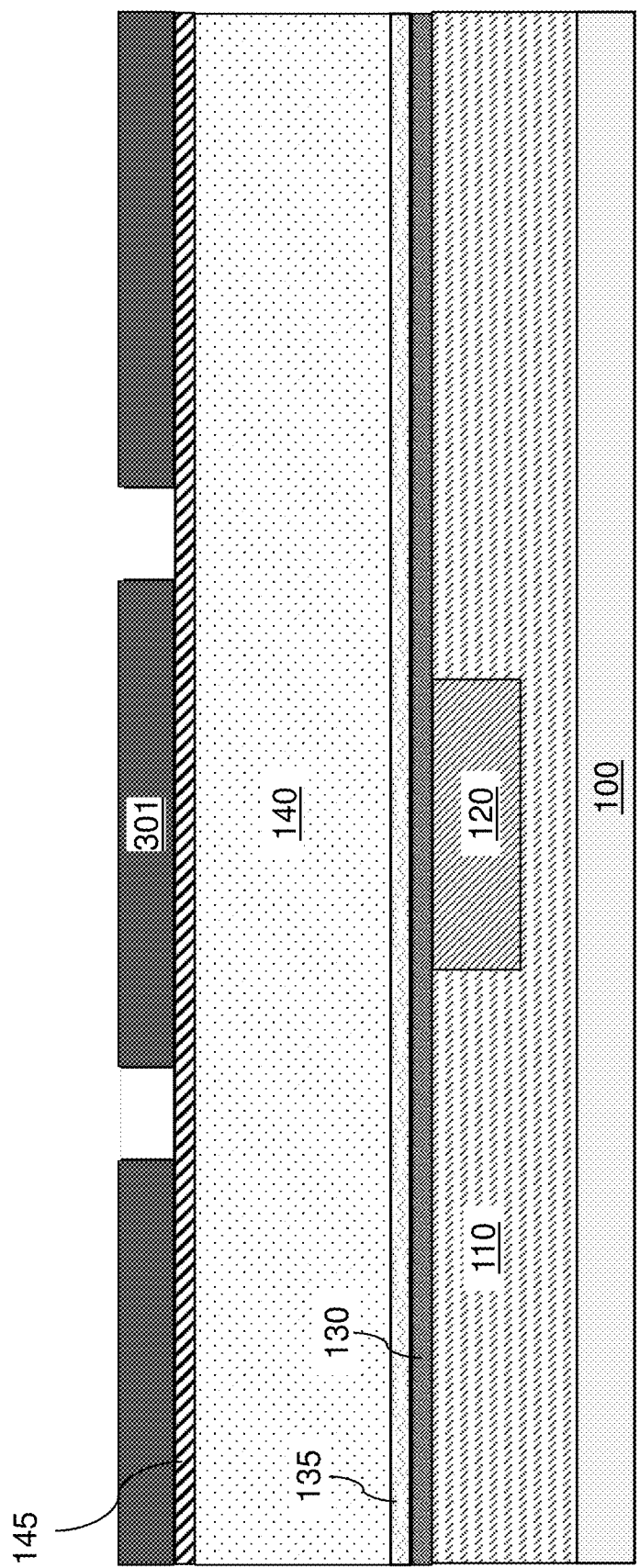
FIG. 25 is a vertical cross-section view of an exemplary intermediate structure during a process of forming a FeFET device illustrating a patterned mask over the upper surface of an optional insulating layer.

FIG. 25 is a vertical cross-section view of an exemplary intermediate structure during a process of forming a FeFET device showing a patterned mask 301 over the upper surface of the optional insulating layer 145. In embodiments in which the optional insulating layer 145 is not present, the patterned mask 301 may be formed over the upper surface of the FE material layer 140 or, if present, an optional seed layer located over the FE material layer 140. The patterned mask 301 may be patterned using photolithography to remove portions of the mask material and expose portions of the optional insulating layer 145. The openings through the patterned mask 301 may correspond to the locations of bottom source and drain electrodes that may be subsequently formed.

Figure 26:
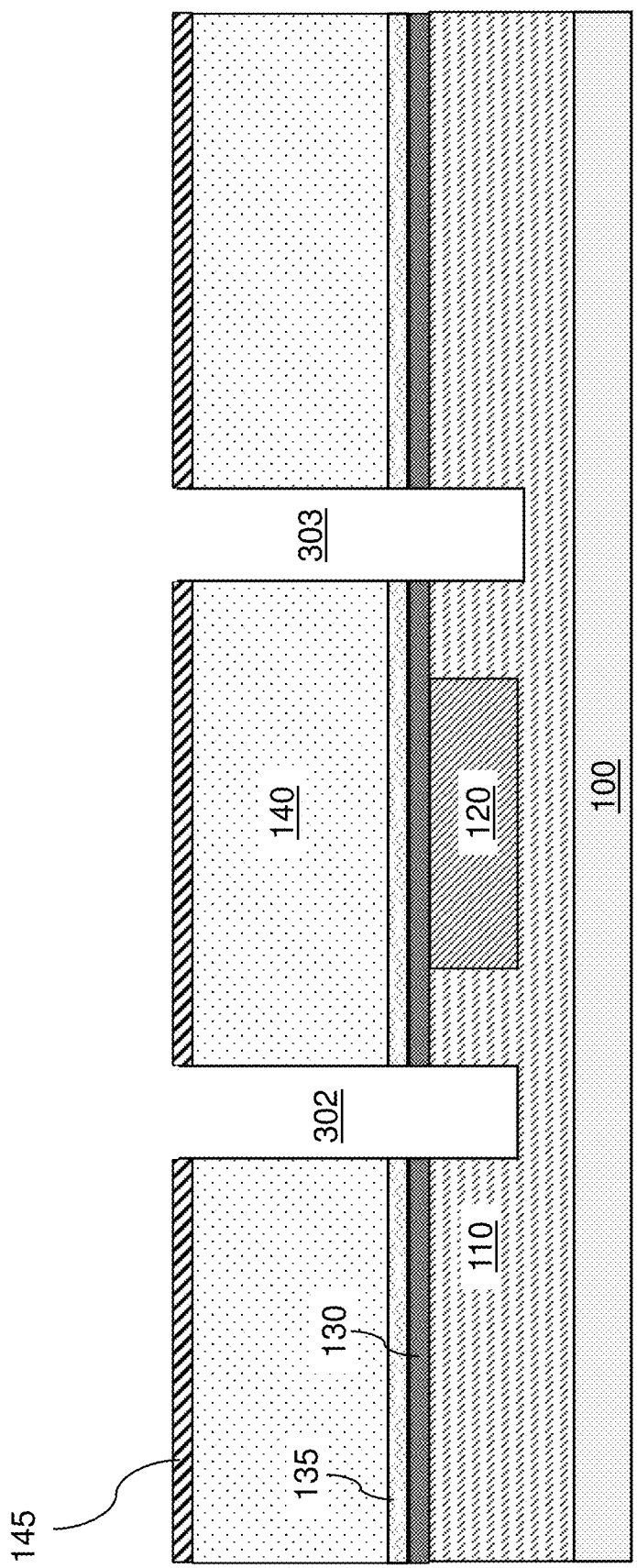
FIG. 26 is a vertical cross-section view of an exemplary intermediate structure during a process of forming a FeFET device illustrating openings formed through an optional insulating layer, a FE material layer, an optional seed layer, and an optional stress layer and extending into a first dielectric material layer.

FIG. 26 is a vertical cross-section view of an exemplary intermediate structure during a process of forming a FeFET device showing openings 302 and 303 formed through the optional insulating layer 145, the FE material layer 140, the optional seed layer 135, and the optional stress layer 130 and extending into the first dielectric material layer 110. Referring to FIG. 26, the exemplary intermediate structure may be etched through the patterned mask 301 to remove portions of the optional insulating layer 145, the FE material layer 140, the optional seed layer 135, and the optional stress layer 130, and the first dielectric material layer 110 to form openings 302 and 303. The openings 302 and 303 may correspond to the locations of bottom source and drain electrodes that may be subsequently formed. Following the etching process, the patterned mask 301 may be removed using a suitable process, such as by ashing or by dissolution using a solvent.

Figure 27:
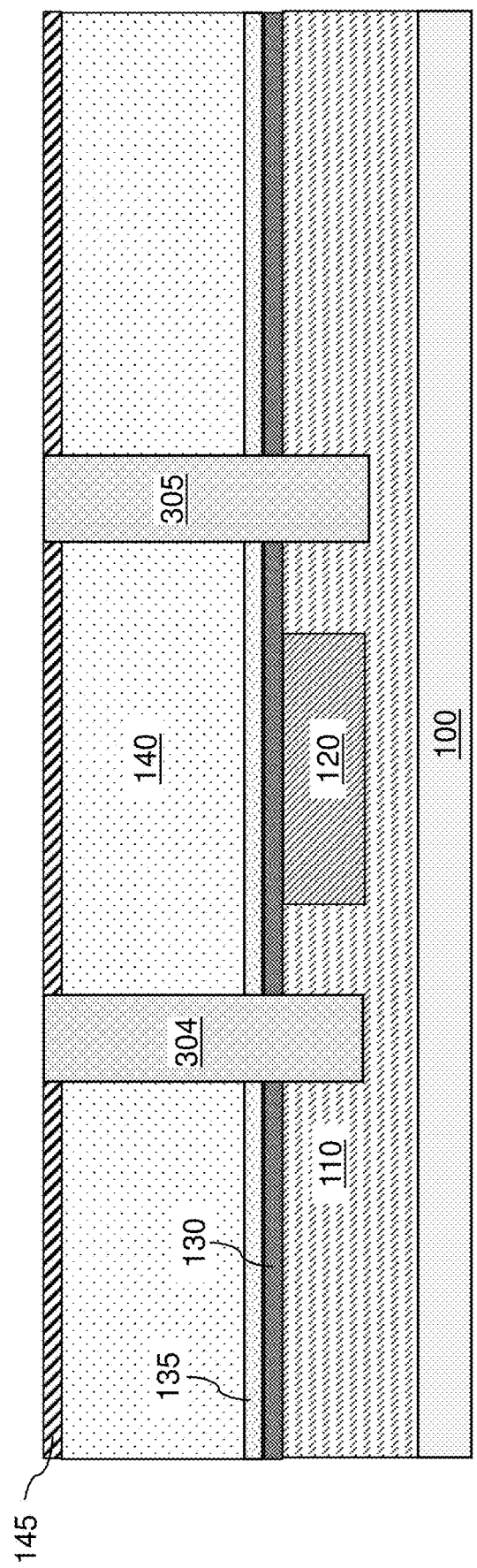
FIG. 27 is a vertical cross-section view of an exemplary intermediate structure during a process of forming a FeFET device including bottom source and drain electrodes formed within openings.

FIG. 27 is a vertical cross-section view of an exemplary intermediate structure during a process of forming a FeFET device including bottom source and drain electrodes 304 and 305 formed within the openings 302 and 303. Referring to FIG. 27, the bottom source and drain electrodes 304 and 305 may include any suitable electrically conductive material, such as titanium nitride (TiN), molybdenum (Mo), copper (Cu), aluminum (Al), zirconium (Zr), titanium (Ti), tungsten (W), tantalum (Ta), tantalum nitride (TaN), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. Other suitable electrode materials are within the scope of disclosure. The bottom source and drain electrodes 304 and 305 may be deposited using any suitable deposition method, such as physical vapor deposition (PVD), sputtering, chemical vapor deposition (CVD), atomic layer deposition (ALD), plasma-enhanced chemical vapor deposition (PECVD), or combinations thereof. In various embodiments, the bottom source and drain electrodes 304 and 305 may be formed by depositing a layer of an electrically conductive material over the upper surface of the optional insulating layer 145 and within the openings 302, 303 through the optional insulating layer 145, the FE material layer 140, the optional seed layer 135, and the optional stress layer 130 and into the first dielectric material layer 110. Then, a planarization process, such as a chemical mechanical planarization (CMP) process, may be used to remove portions of the electrically conductive material from above the upper surface of the optional insulating layer 145 and provide discrete bottom source and drain electrodes 304 and 305. As shown in FIG. 27, the bottom source and drain electrodes 304 and 305 may extend into the first dielectric material layer 110 and may be laterally spaced from the bottom gate electrode 120 embedded within the first dielectric material layer 110. In various embodiments, the upper surfaces of the bottom source and drain electrodes 304 and 305 may be co-planar with the upper surface of the optional insulating layer 145. In embodiments in which the optional insulating layer 145 is not present, the upper surfaces of the bottom source and drain electrodes 304 and 305 may be co-planar with the upper surface of the FE material layer 140.

Figure 28:
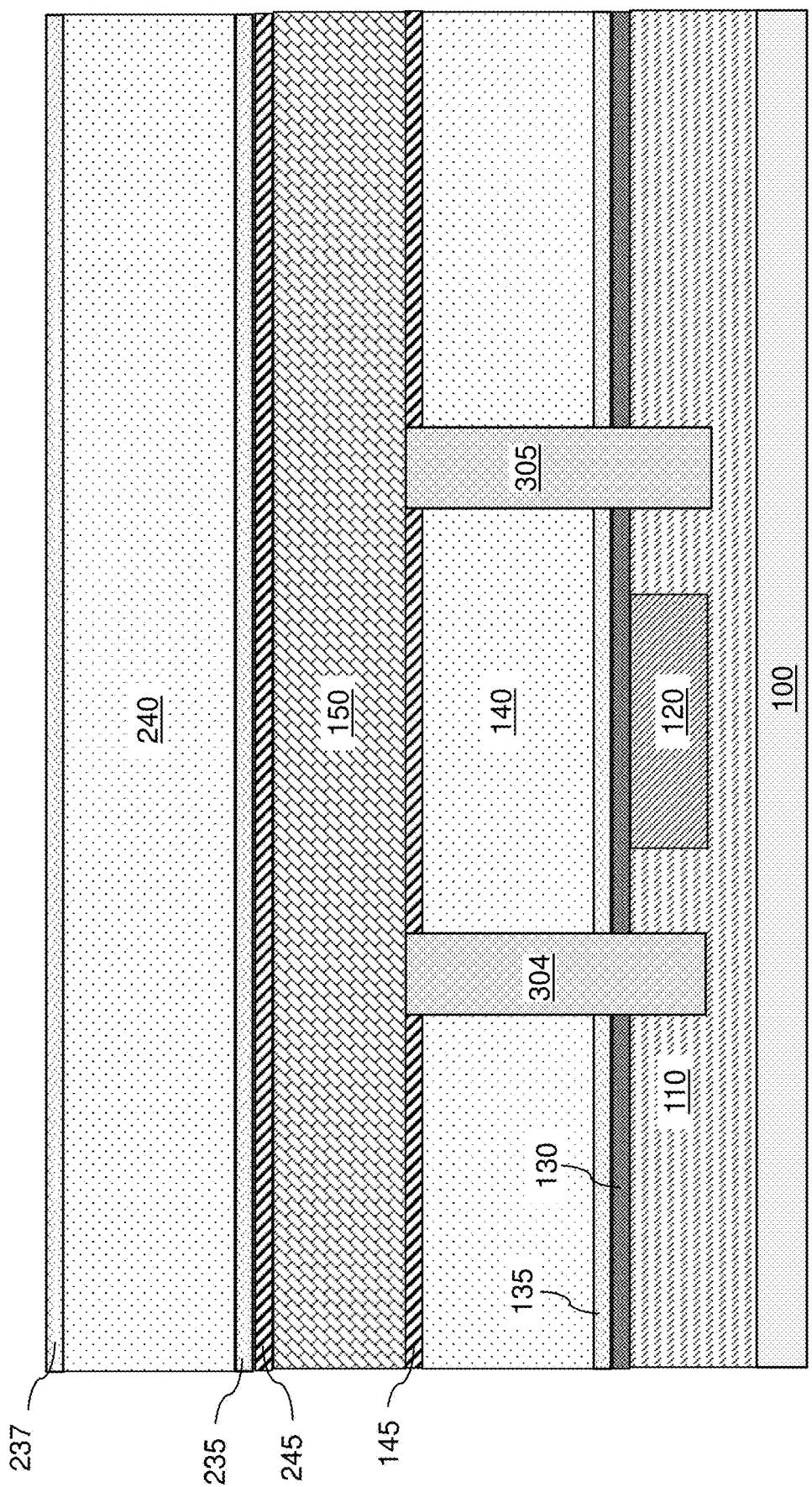
FIG. 28 is a vertical cross-section view of an exemplary intermediate structure during a process of forming a FeFET device including a channel layer over the upper surfaces of an optional insulating layer and bottom source and drain electrodes, an optional second insulating layer over the channel layer, an optional second seed layer over the optional second insulating layer, a second FE material layer over the optional second seed layer, and an optional third seed layer over the second FE material layer.

FIG. 28 is a vertical cross-section view of an exemplary intermediate structure during a process of forming a FeFET device including a channel layer 150 over the upper surfaces of the optional insulating layer 145 and the bottom source and drain electrodes 304, 305, an optional second insulating layer 245 over the channel layer 150, an optional second seed layer 235 over the optional second insulating layer 245, a second FE material layer 240 over the optional second seed layer 235, and an optional third seed layer 237 over the second FE material layer 240. The exemplary intermediate structure shown in FIG. 28 may be derived from the exemplary intermediate structure shown in FIG. 13, thus repeated discussion of the structure and details of the channel layer 150, the optional second insulating layer 245, the optional second seed layer 235, the second FE material layer 240, and the optional third seed layer 237 are omitted. Referring to FIG. 28, the bottom source electrode 304 and drain electrode 305 may contact the bottom surface of the channel layer 150. In various embodiments, the channel layer 150 may be an oxide semiconductor channel layer as described above with reference to FIGS. 8-10B.

Figure 29:
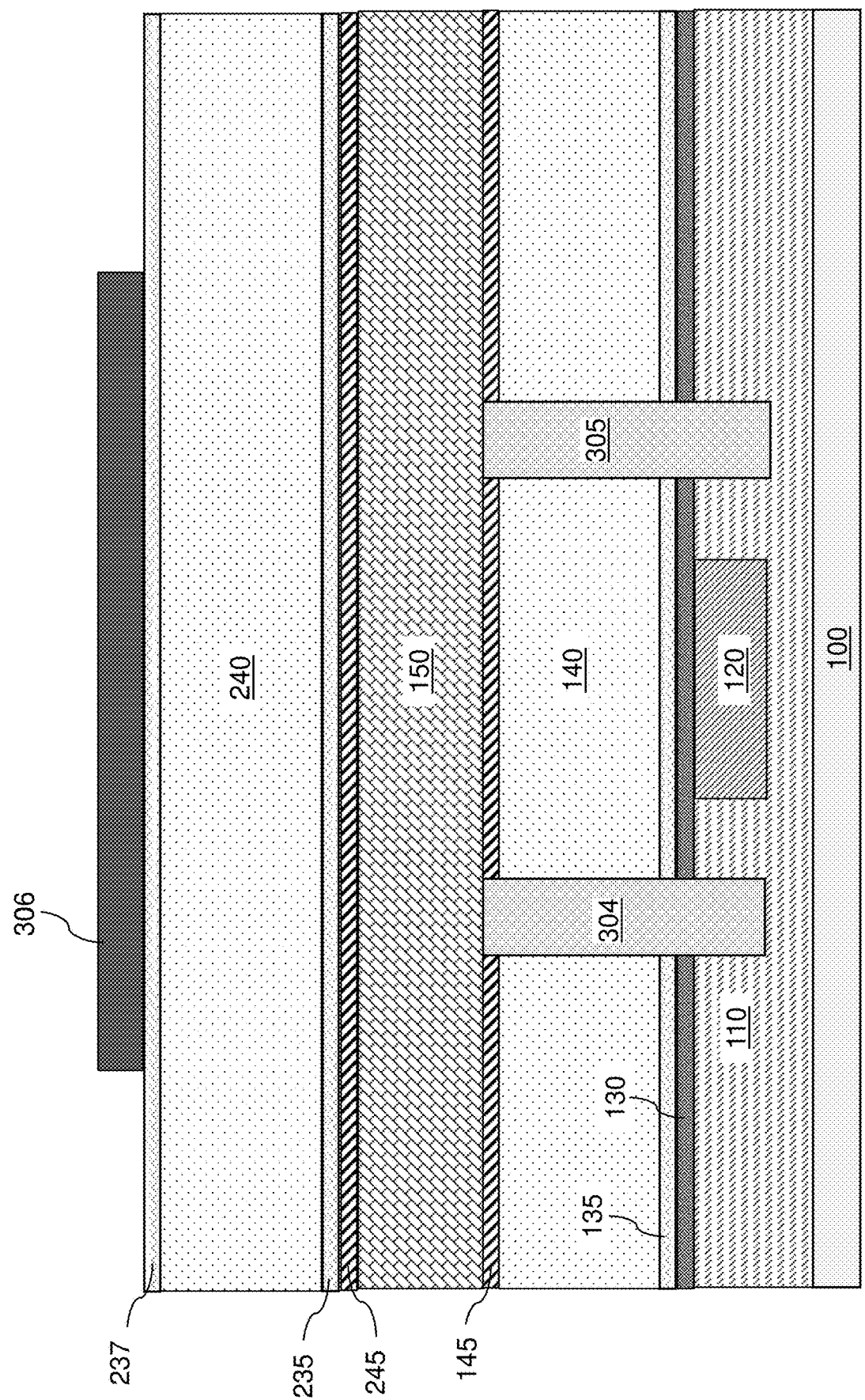
FIG. 29 is a vertical cross-section view of an exemplary intermediate structure during a process of forming a FeFET device showing a patterned mask over the upper surface of an optional third seed layer.

FIG. 29 is a vertical cross-section view of an exemplary intermediate structure during a process of forming a FeFET device showing a patterned mask 306 over the upper surface of the optional third seed layer 237. In embodiments in which the optional third seed layer 237 is not present, the patterned mask 306 may be formed over the upper surface of the second FE material layer 240. The patterned mask 306 may be patterned using photolithography to remove portions of the mask material and expose portions of the optional third seed layer 237. The patterned mask 306 may cover the optional third seed layer 237 in a region overlying the bottom gate electrode 120 and the bottom source and drain electrodes 304 and 305.

Figure 30:
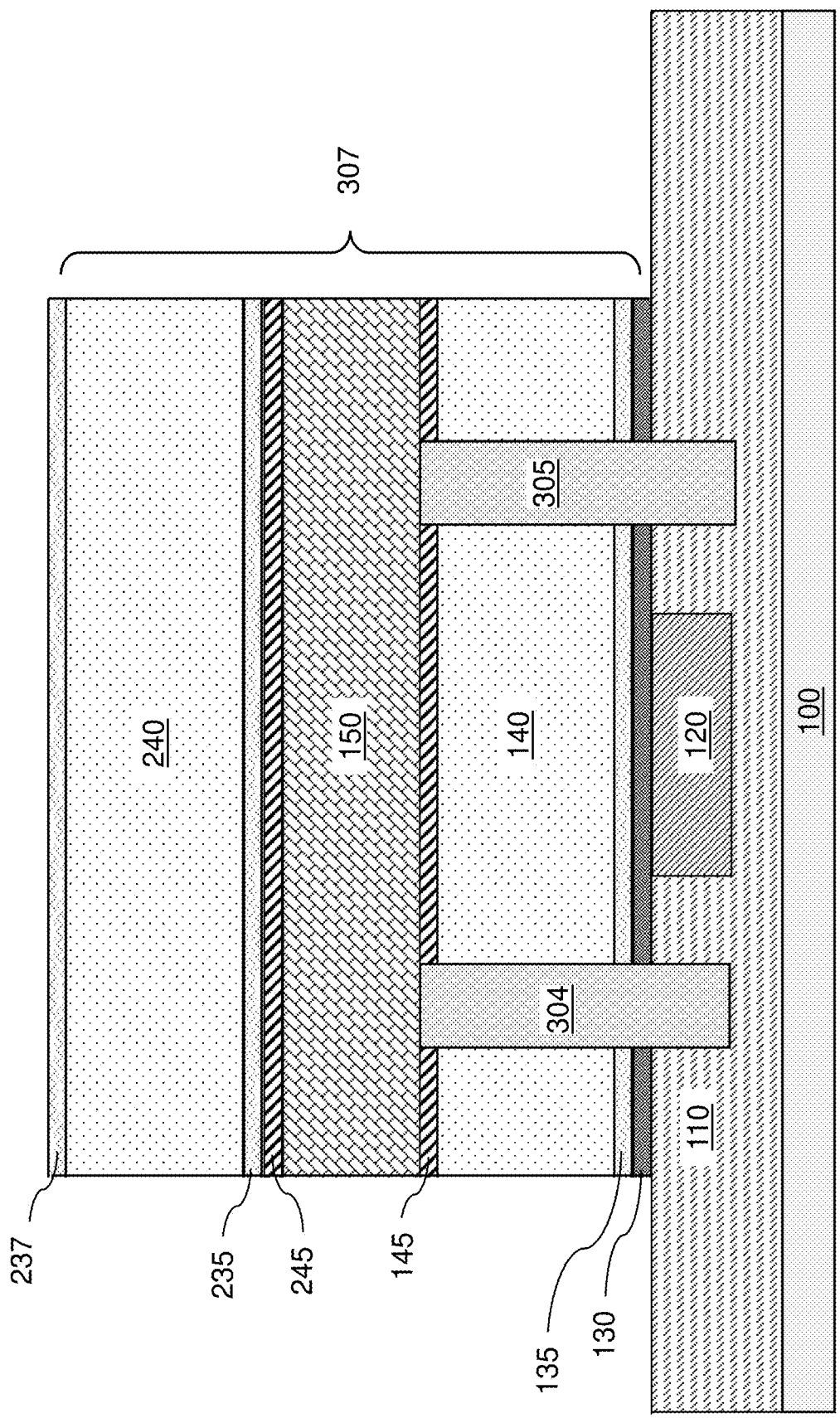
FIG. 30 is a vertical cross-section view of an exemplary intermediate structure during a process of forming a FeFET device following an etching process that forms a multilayer structure over a first dielectric material layer.

FIG. 30 is a vertical cross-section view of an exemplary intermediate structure during a process of forming a FeFET device following an etching process that forms a multilayer structure 307 over the first dielectric material layer 110. Referring to FIG. 30, an etching process may be performed through the patterned mask 306 to remove portions of the optional third seed layer 237, the second FE material layer 240, the optional second seed layer 235, the optional second insulating layer 245, the channel layer 150, the optional insulating layer 145, the FE material layer 140, the optional seed layer 135, and the optional stress layer 130. Following the etching process, the remaining portions of the optional third seed layer 237, the second FE material layer 240, the optional second seed layer 235, the optional second insulating layer 245, the channel layer 150, the optional insulating layer 145, the FE material layer 140, the optional seed layer 135, and the optional stress layer 130 may form a multilayer structure 307. In some embodiments, the etching process may produce a plurality of discrete multilayer structures 307 over the first dielectric material layer 110. The upper surface of the first dielectric material layer 110 may be exposed between respective multilayer structures 307. Each multilayer structure 307 may include a bottom source electrode 304/305 and a bottom drain electrode 305/304. A bottom gate electrode 120 may be located within the first dielectric material layer 110 underlying each multilayer structure 307 and located between respective bottom source and drain electrodes 304, 305. Following the etching process, the patterned mask 306 may be removed using a suitable process, such as by ashing or by dissolution with a solvent.

Figure 31:
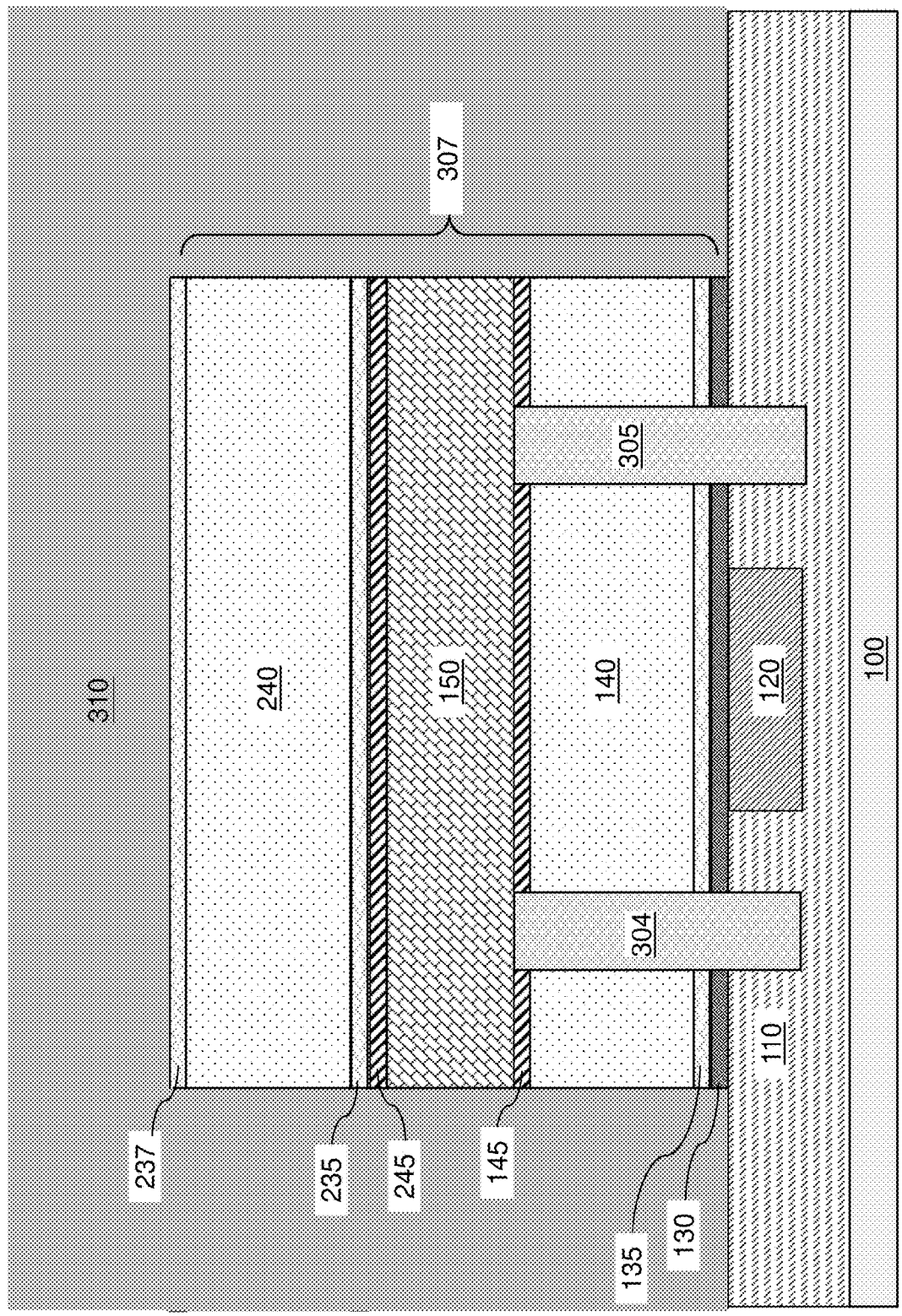
FIG. 31 is a vertical cross-section view of an exemplary intermediate structure during a process of forming a FeFET device that includes a second dielectric material layer formed over the upper surface and side surfaces of a multilayer structure 307 and over the exposed upper surface of a first dielectric material layer.

FIG. 31 is a vertical cross-section view of an exemplary intermediate structure during a process of forming a FeFET device that includes a second dielectric material layer 310 formed over the upper surface and side surfaces of the multilayer structure 307 and over the exposed upper surface of the first dielectric material layer 110. The second dielectric material layer 310 may be composed of a suitable dielectric material, such as silicon oxide, aluminum oxide, etc. Other materials are within the contemplated scope of disclosure. In some embodiments, the second dielectric material layer 310 may be a low-k dielectric material. The dielectric material layer 310 may be deposited using a suitable deposition method as described above.

Figure 32:
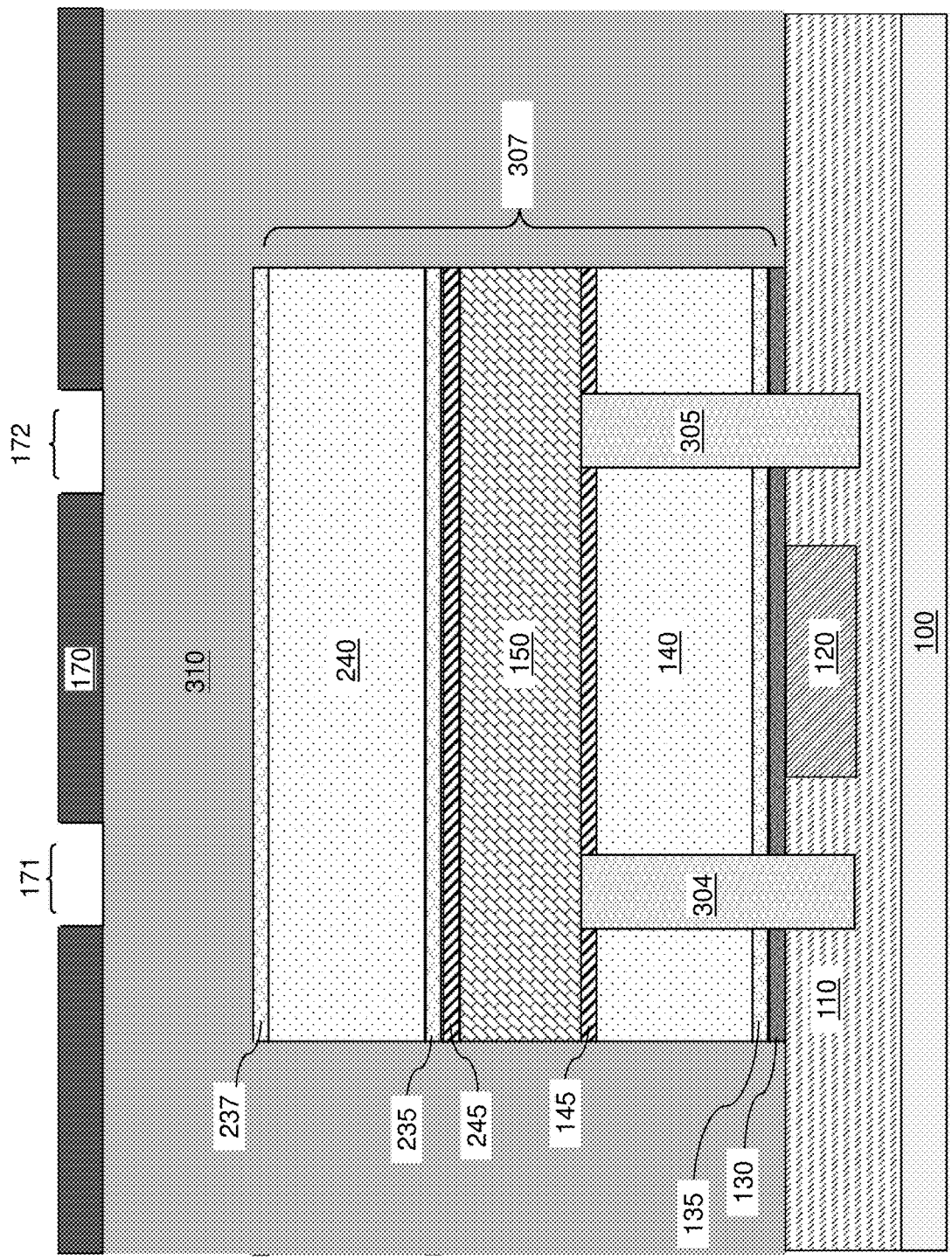
FIG. 32 is a vertical cross-section view of an exemplary intermediate structure during a process of forming a FeFET device that includes a patterned mask over the upper surface of a second dielectric material layer.

FIG. 32 is a vertical cross-section view of an exemplary intermediate structure during a process of forming a FeFET device that includes a patterned mask 170 over the upper surface of the second dielectric material layer 310. The patterned mask 170 may be patterned using photolithography to remove portions of the mask material and expose regions 171 and 172 of the upper surface of second dielectric material layer 310. The exposed regions 171 and 172 of the second dielectric material layer 310 may correspond to the locations of upper source and drain regions, respectively, that may be subsequently formed in the multilayer structure 307.

Figure 33:
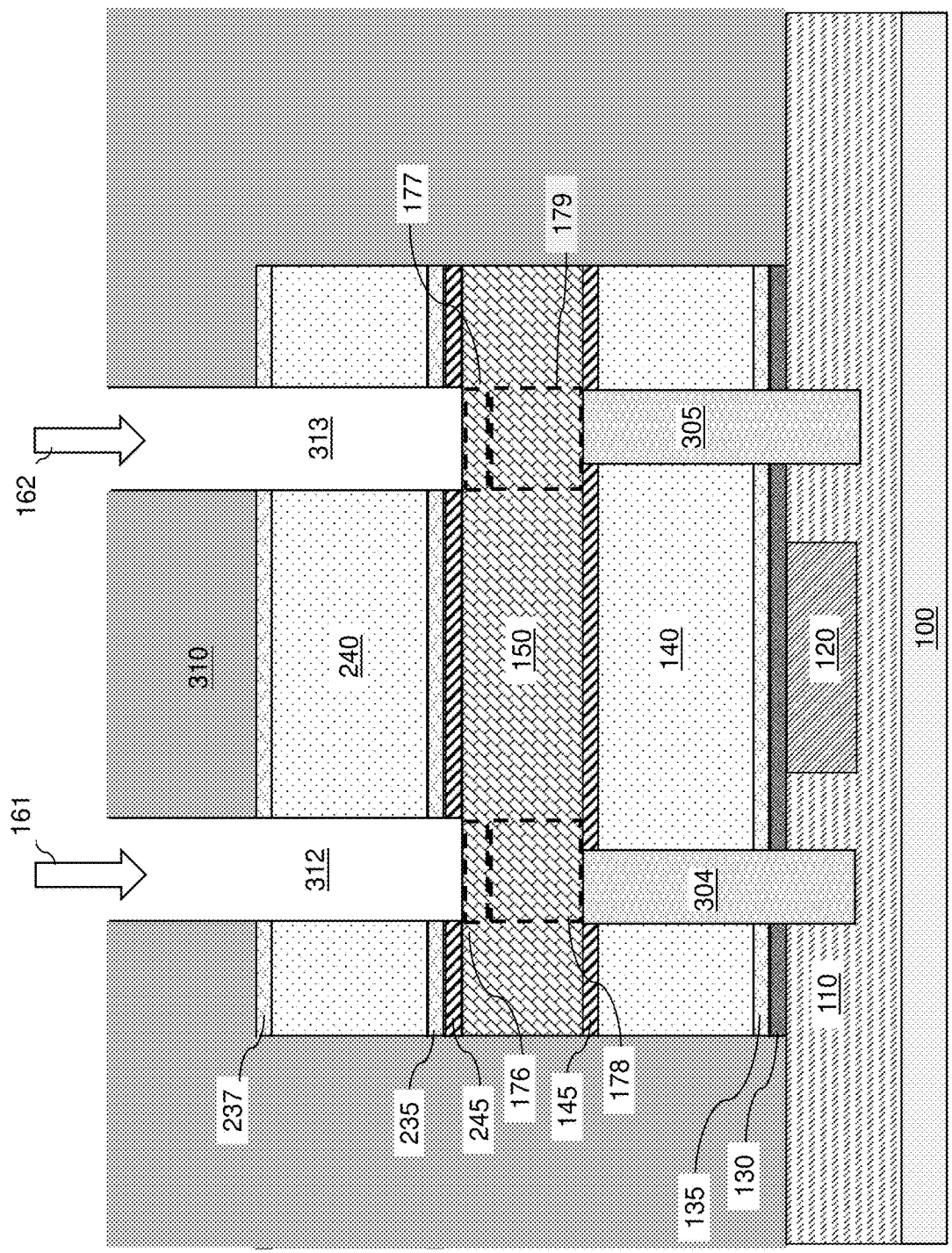
FIG. 33 is a vertical cross-section view of an exemplary intermediate structure during a process of forming a FeFET device showing openings formed through a second dielectric material layer, an optional third seed layer, a second FE material layer, an optional second seed layer, and an optional second insulating layer to expose the upper surface of a channel layer.

FIG. 33 is a vertical cross-section view of an exemplary intermediate structure during a process of forming a FeFET device showing openings 312 and 313 formed through the second dielectric material layer 310, the optional third seed layer 237, the second FE material layer 240, the optional second seed layer 235, and the optional second insulating layer 245 to expose the upper surface of the channel layer 150. Referring to FIG. 33, the exemplary intermediate structure may be etched through the patterned mask 170 to remove portions of the second dielectric material layer 310, the optional third seed layer 237, the second FE material layer 240, the optional second seed layer 235, and the optional second insulating layer 245 and expose the upper surface of the channel layer 150. The regions of the channel layer 150 exposed through the openings 312 and 313 may correspond to source and drain regions, respectively, of the FeFET device. Following the etching process, the patterned mask 170 may be removed using a suitable process, such as by ashing or by dissolution using a solvent.

Referring again to FIG. 33, the source region 176 and drain region 177 of the channel layer 150 may be subjected to a plasma treatment (indicated schematically by arrows 161 and 162). In embodiments, the plasma treatment may be equivalent to the plasma treatment described above with reference to FIG. 17. Thus, repeated discussion of the plasma treatment is omitted. In embodiments, the plasma treatment may lower the contact resistance at the source region 176 and drain region 177. In various embodiments, the plasma treatment may also produce regions 178, 179 of the channel layer 150 beneath the source region 176 and drain region 177 that may be comparatively rich in oxygen vacancies. The oxygen-vacancy rich regions 178, 179 of the channel layer 150 may reduce the source-gate and drain-gate resistance of the channel layer 150.

Figure 34:
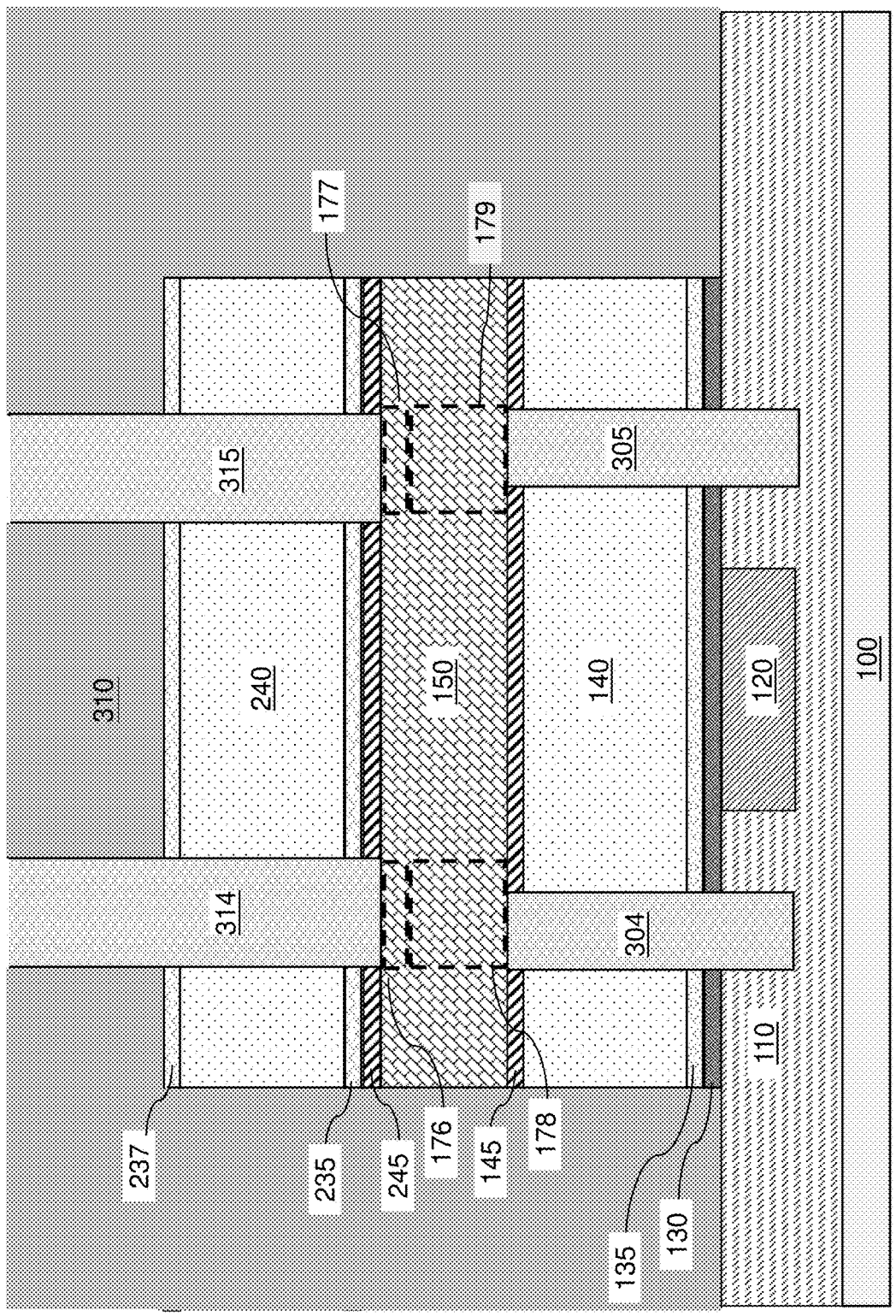
FIG. 34 is a vertical cross-section view of an exemplary intermediate structure during a process of forming a FeFET device including upper source and drain electrodes formed over source and drain regions of a channel layer.

FIG. 34 is a vertical cross-section view of an exemplary intermediate structure during a process of forming a FeFET device including upper source and drain electrodes 314 and 315 formed over the source region 176 and drain region 177 of the channel layer 150. Referring to FIG. 34, the upper source and drain electrodes 314 and 315 may include any suitable electrically conductive material, including any of the materials of the source and drain electrodes 190 and 191 described above with reference to FIG. 18. In some embodiments, the upper source and drain electrodes 314, 315 may be composed of the same material(s) as the bottom source and drain electrodes 304, 305. Alternatively, the upper source and drain electrodes 314, 315 may be composed of different material(s) than the bottom source and drain electrodes 304, 305.

The upper source and drain electrodes 314, 315 may be deposited using any suitable deposition method, such as physical vapor deposition (PVD), sputtering, chemical vapor deposition (CVD), atomic layer deposition (ALD), plasma-enhanced chemical vapor deposition (PECVD), or combinations thereof. In various embodiments, the upper source and drain electrodes 314, 315 may be formed by depositing a layer of an electrically conductive material over the upper surface of the second dielectric material layer 310 and within the openings 312, 313. Then, a planarization process, such as a chemical mechanical planarization (CMP) process, may be used to remove portions of the electrically conductive material from above the upper surface of the second dielectric material layer 310 and provide discrete source and drain electrodes 314, 315 contacting the source and drain regions 176, 177 of the channel layer 150.

Figure 35:
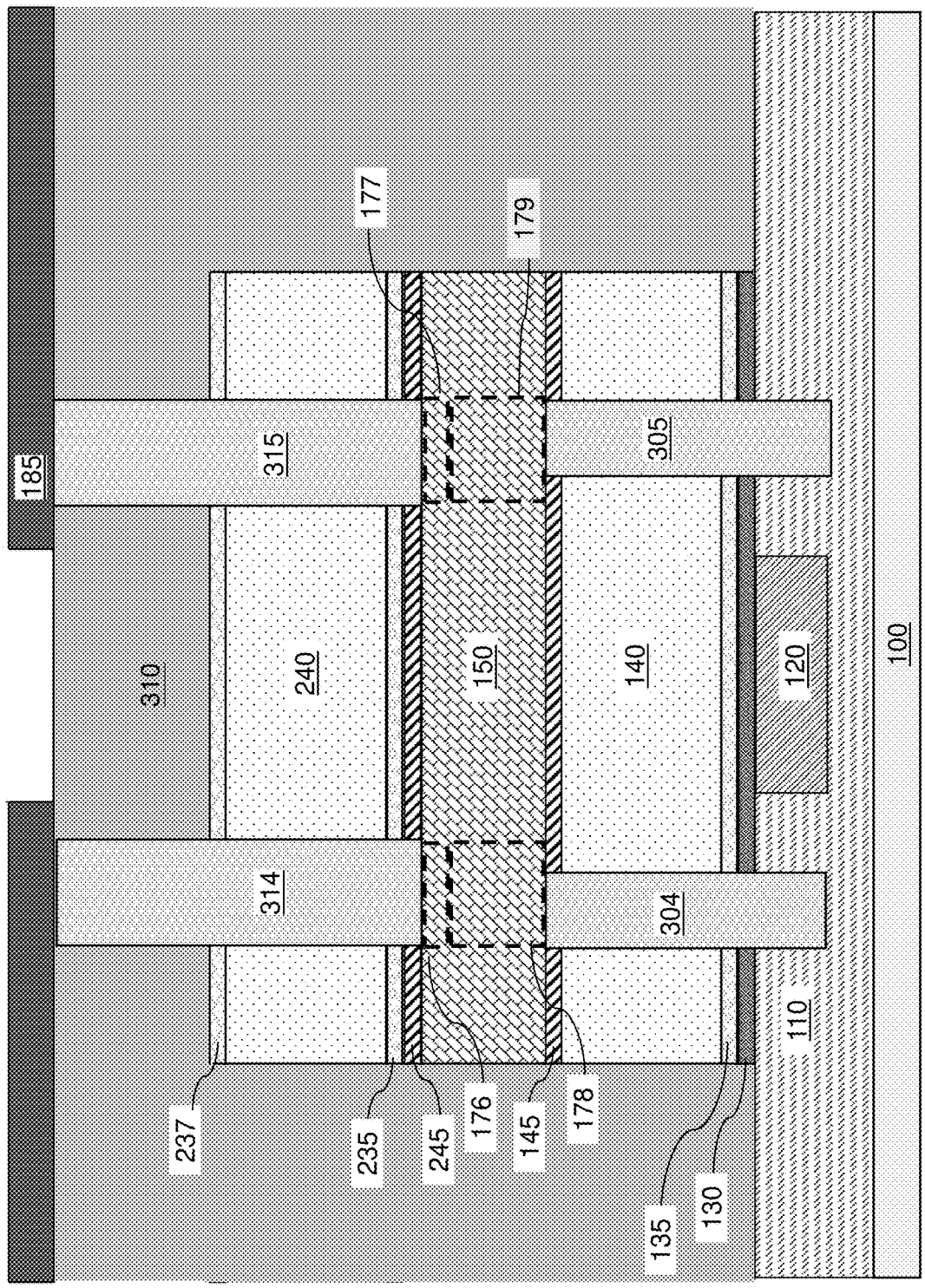
FIG. 35 is a vertical cross-section view of an exemplary intermediate structure during a process of forming a FeFET device illustrating a patterned mask over the upper surfaces of a second dielectric material layer and upper source and drain electrodes.

FIG. 35 is a vertical cross-section view of an exemplary intermediate structure during a process of forming a FeFET device showing a patterned mask 185 over the upper surfaces of the second dielectric material layer 310 and the upper source and drain electrodes 314, 315. The patterned mask 185 may be patterned using photolithography to remove portions of the mask material and expose a portion of the upper surface of the second dielectric material layer 310. The exposed portion of the upper surface of the second dielectric material layer 310 may correspond to the location of an upper gate electrode that may be subsequently formed.

Figure 36:
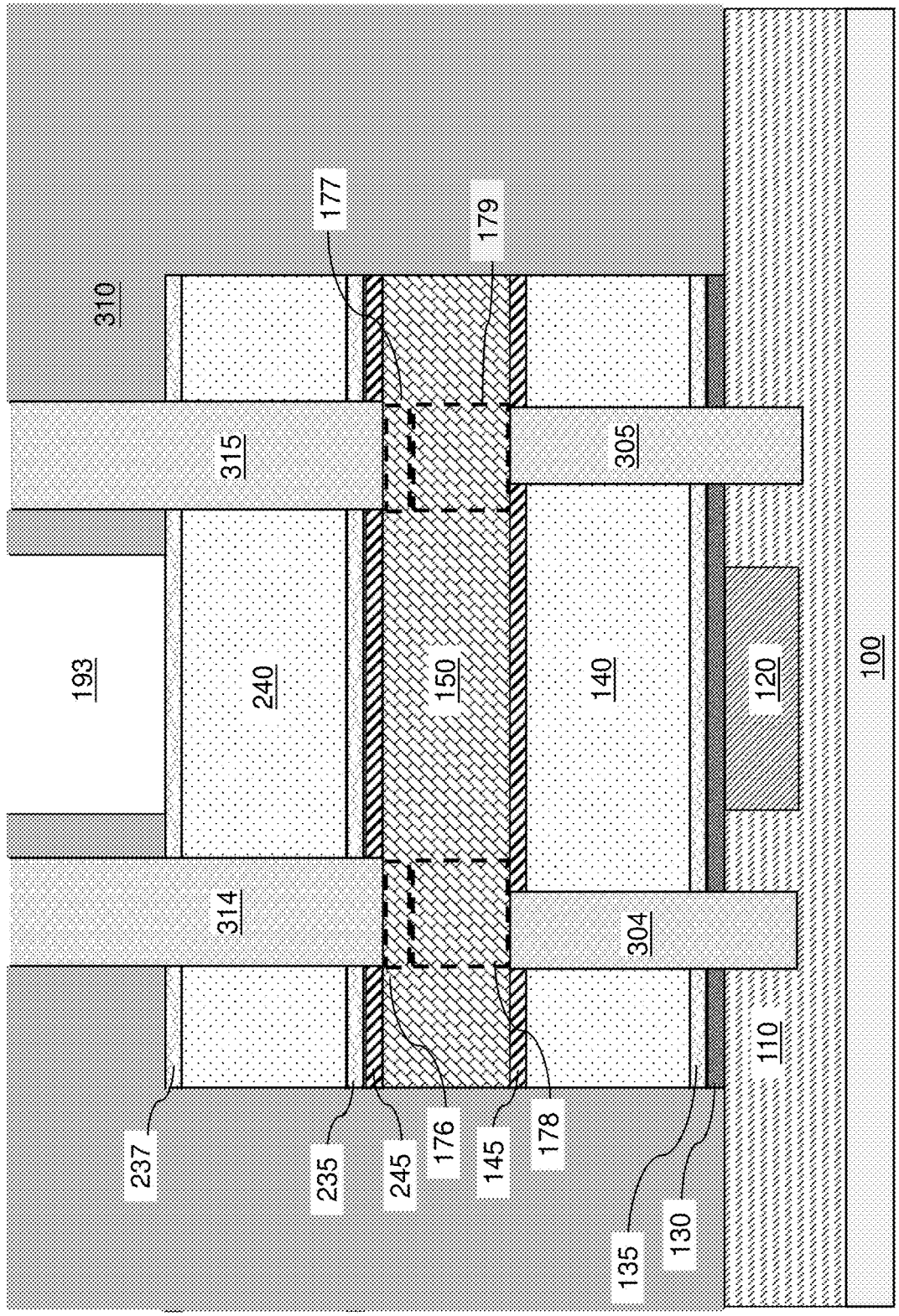
FIG. 36 is a vertical cross-section view of an exemplary intermediate structure during a process of forming a FeFET device illustrating an opening formed through a second dielectric material layer to expose the upper surface of an optional third seed layer.

FIG. 36 is a vertical cross-section view of an exemplary intermediate structure during a process of forming a FeFET device showing an opening 193 formed through the second dielectric material layer 310 to expose the upper surface of the optional third seed layer 237. Referring to FIG. 36, the exemplary intermediate structure may be etched through the patterned mask 185 to remove portions of the second dielectric material layer 310 and expose the upper surface of the optional third seed layer 237. In embodiments in which the optional third seed layer 237 is not present, the etching process may expose the upper surface of the second FE material layer 240. Following the etching process, the patterned mask 185 may be removed using a suitable process, such as by ashing or by dissolution using a solvent.

Figure 37:
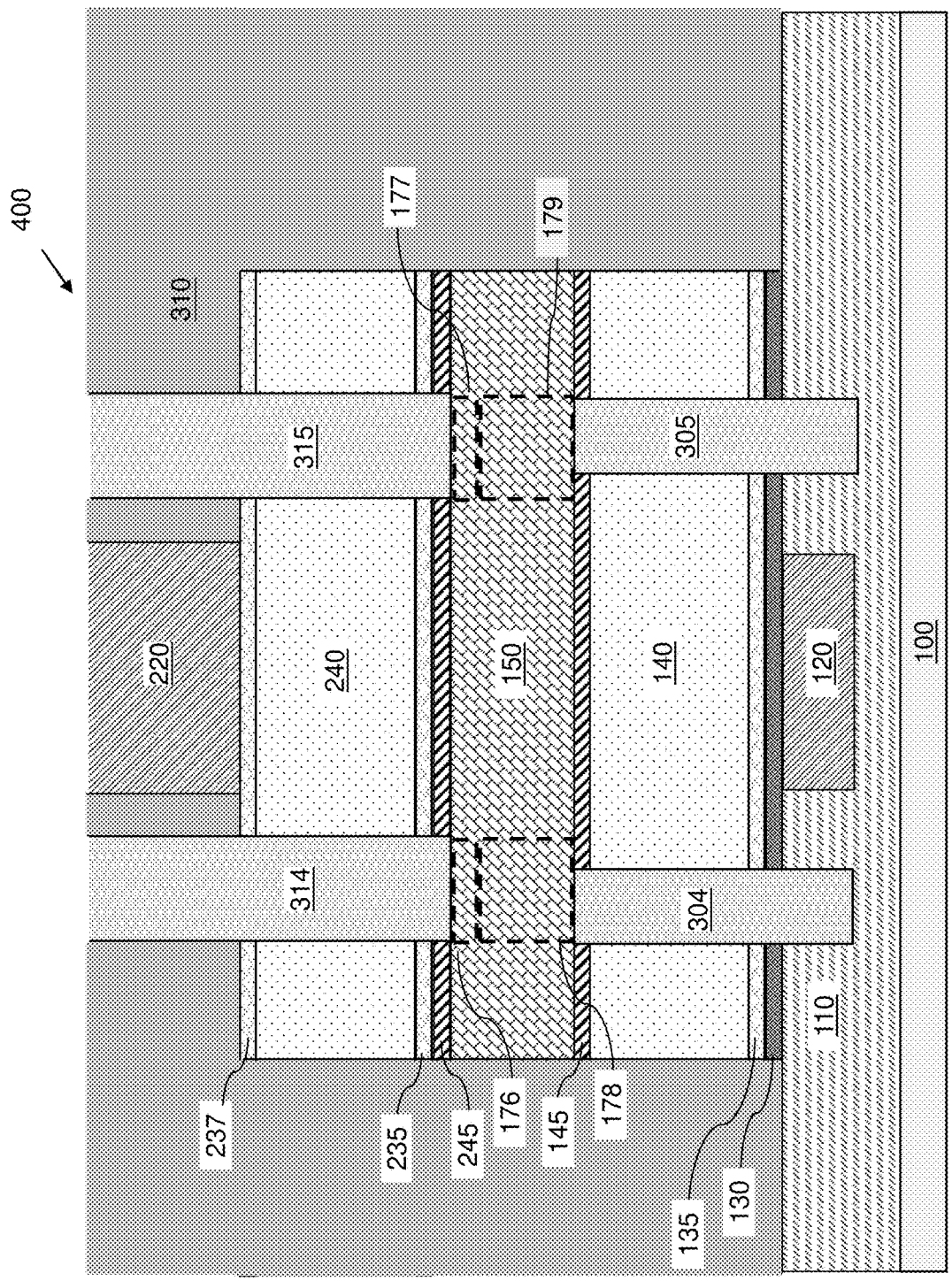
FIG. 37 is a vertical cross-section view of an exemplary structure of a FeFET device including a double gate structure and upper and bottom source and drain electrodes.

FIG. 37 is a vertical cross-section view of an exemplary intermediate structure of a FeFET device 400 including an upper gate electrode 220 formed in an opening in the second dielectric material layer 310. The upper gate electrode 220 may include an equivalent composition and structure and may be formed by the same process as the upper gate electrode 220 described above with reference to FIG. 22. Thus, repeated discussion of the upper gate electrode 220 is omitted.

The exemplary FeFET device 400 shown in FIG. 37 includes a double-gate structure, including a bottom gate electrode 120 disposed on a first side of a semiconductor channel 150, and an upper gate electrode 220 disposed on a second side of the semiconductor channel 150. A first FE material layer 140 may be located between the bottom gate electrode 120 and the semiconductor channel 150, and a second FE material layer 240 may be located between the upper gate electrode 220 and the semiconductor channel 150. Upper source and drain electrodes 314, 315 extend through the second FE material layer 240 and contact the upper surface of the semiconductor channel 150. In addition, bottom source and drain electrodes 304, 305 extend through the first FE material layer 140 and contact the bottom surface of the semiconductor channel 150.

Figure 38:
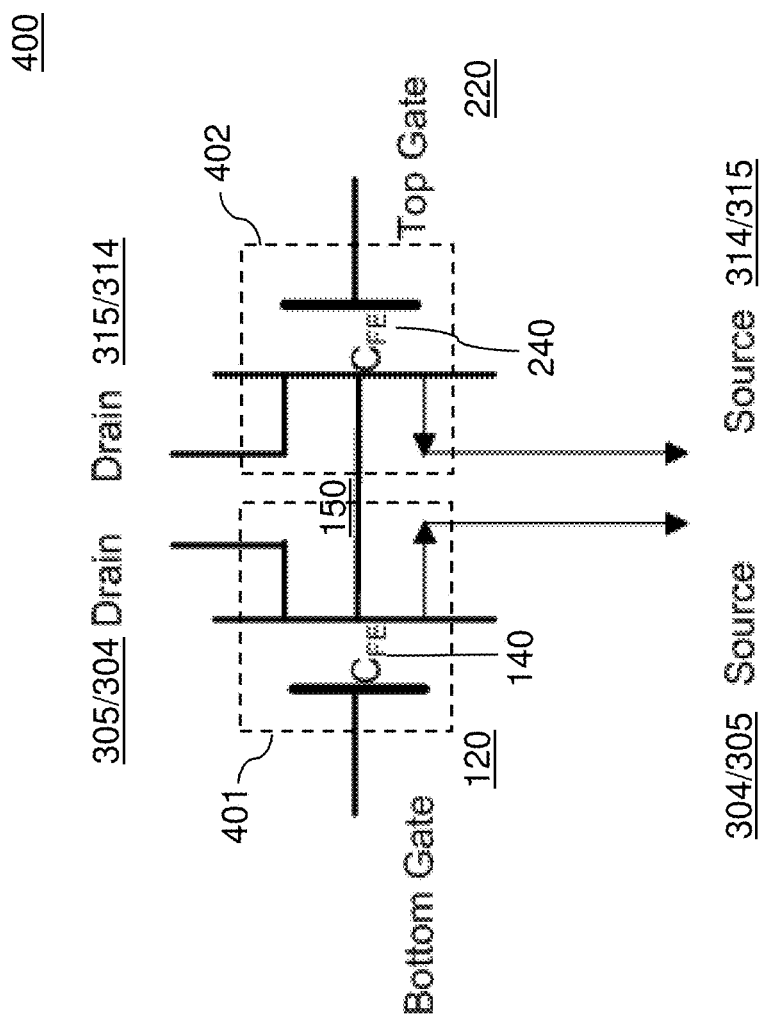
FIG. 38 is a circuit diagram schematically illustrating a FeFET device including a double-gate structure and upper and bottom source and drain electrodes operated in a separated gate control mode according to various embodiments of the present disclosure.

An exemplary FeFET device 400 having a double-gate structure such as shown in FIG. 37 may be operated in a common gate control mode, such as described above with reference to FIG. 23. In addition, the exemplary FeFET device 400 having a double gate structure and upper and lower source and drain electrodes 304, 305, 314, 315 may also be operated in a separated gate control mode. FIG. 38 is a circuit diagram schematically illustrating a FeFET device 400 having a double-gate structure and upper and lower source and drain electrodes 304, 305, 314, 315 operated in a separated gate control mode. Referring to FIGS. 37 and 38, the bottom gate electrode 120 and the upper gate electrode 220 may be connected to different supply lines, such that different voltages may be selectively applied to the bottom gate electrode 120 and the upper gate electrode 220. The FE material layers 140, 240 may function as a gate insulating layers between the respective bottom and upper gate electrodes 120, 220 and the semiconductor channel 150. Bottom source and drain electrodes 304, 305 are electrically connected to a first (i.e., bottom) side of the channel layer 150, and upper source and drain electrodes 314, 315 are electrically connected to a second (i.e., upper) side of the channel layer 150. In embodiments, the combination of the bottom gate electrode 120, the FE material layer 140, the bottom source and drain electrodes 304, 305 and the channel layer 150 may provide a first FeFET structure 401 (e.g., a FeFET-based memory cell), and the combination of the upper gate electrode 220, the second FE material layer 240, the upper source and drain electrodes 314, 315 and the channel layer 150 may provide a second FeFET structure 402 (e.g., a FeFET-based memory cell). The first and second FeFET structures 401, 402 may function independently of one another by applying suitable voltages and/or currents to the respective gate electrodes 120, 220 and source and drain electrodes 304, 305, 314, 315. In some embodiments, one of the first and second FeFET structures 401, 402 may function as a primary device (e.g., a primary memory cell) and the other of the first and second FeFET structures 401, 402 may function as a secondary or back-up device (e.g., back-up memory cell). In instances in which the primary device fails or loses functionality, the secondary or back-up device may be utilized (e.g., for read, write and/or erase operations). This may provide a memory device having improved reliability and performance.

Figure 39:
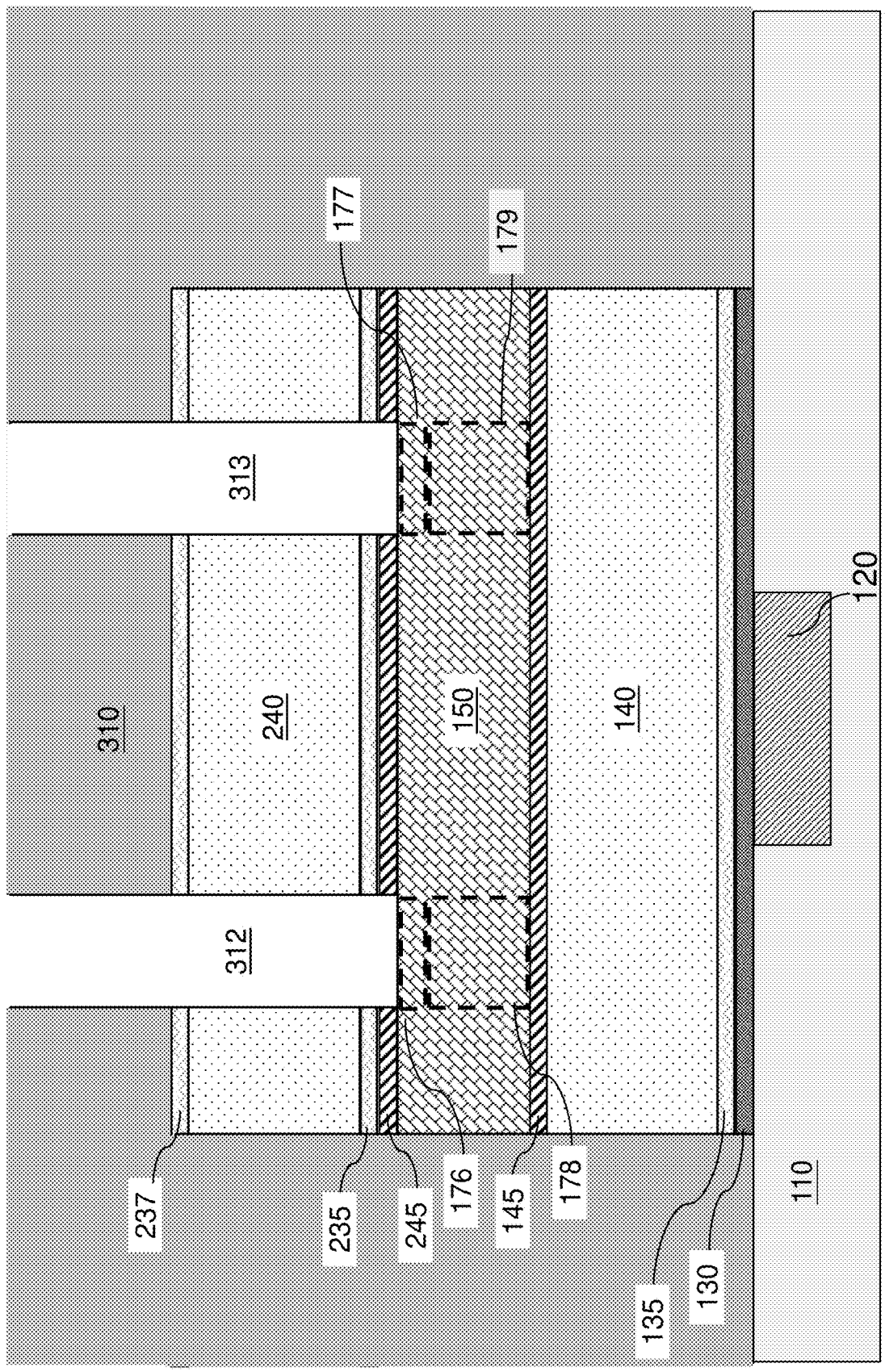
FIG. 39 is a vertical cross-section view of an exemplary intermediate structure during a process of forming a FeFET device showing openings formed through a second dielectric material layer, an optional third seed layer, a second FE material layer, an optional second seed layer, and an optional second insulating layer to expose the upper surface of a channel layer.

FIGS. 39-43 are sequential vertical cross-sectional views of an exemplary structure during a process of forming a FeFET device according to another alternative embodiment of the present disclosure. FIG. 39 is a vertical cross-section view of an exemplary intermediate structure during a process of forming a FeFET device showing openings 312 and 313 formed through a second dielectric material layer 310, an optional third seed layer 237, a second FE material layer 240, an optional second seed layer 235, and an optional second insulating layer 245 to expose the upper surface of a channel layer 150. The exemplary intermediate structure shown in FIG. 39 may be derived from the exemplary intermediate structure shown in FIG. 33, thus repeated discussion of the structure and details of the exemplary intermediate structure of FIG. 39 are omitted. The exemplary intermediate structure shown in FIG. 39 differs from the intermediate structure shown in FIG. 33 in that the exemplary intermediate structure shown in FIG. 39 does not include bottom source and drain electrodes 304, 305. However, it will be understood that the method steps illustrated in FIGS. 39-43 may be performed on an exemplary intermediate structure that includes bottom source and drain electrodes 304, 305.

Figure 40:
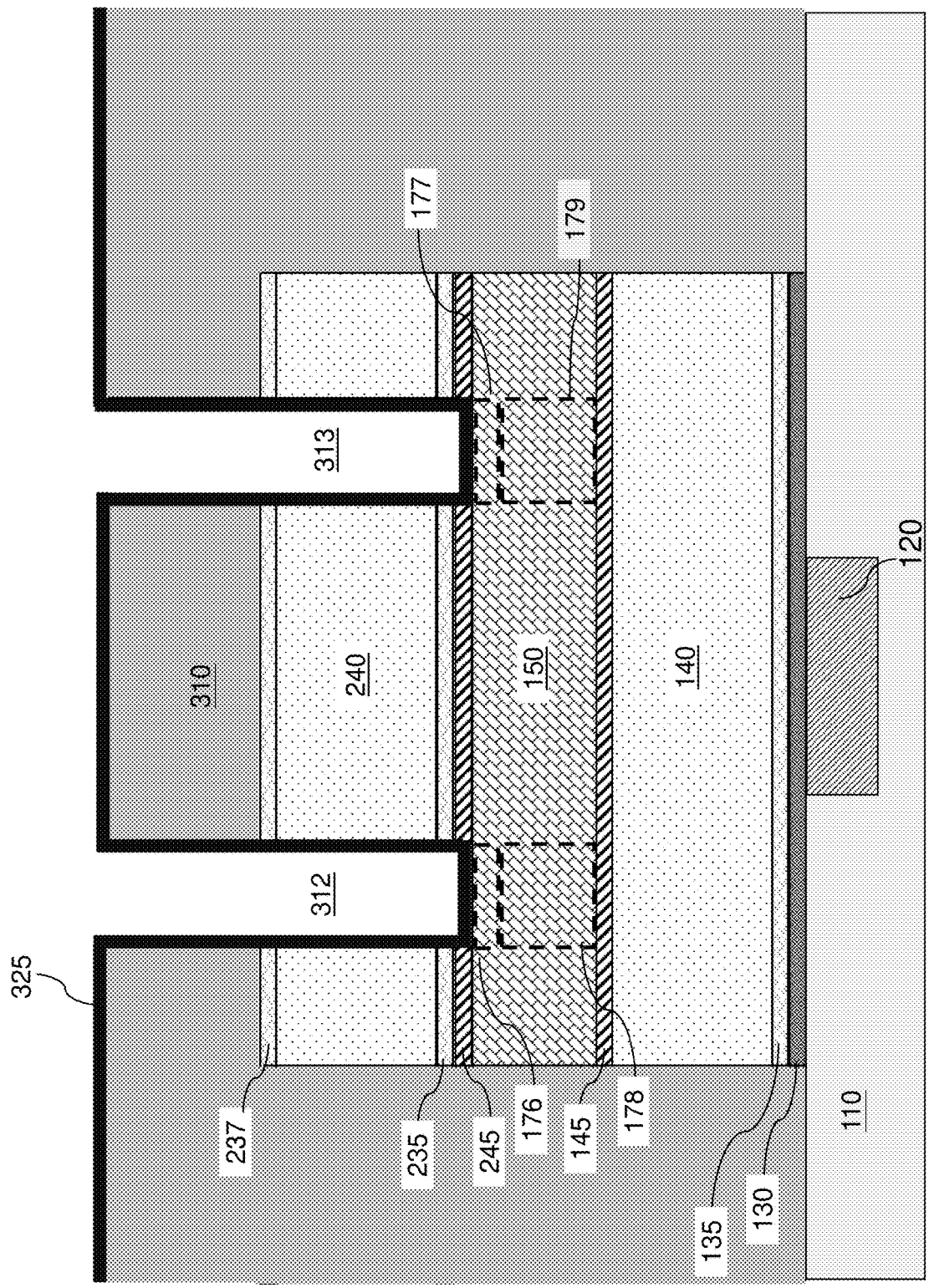
FIG. 40 is a vertical cross-section view of an exemplary intermediate structure during a process of forming a FeFET device showing a dielectric material spacer layer formed over the upper surface of a second dielectric material layer and over the side surfaces and bottom surfaces of openings.

FIG. 40 is a vertical cross-section view of an exemplary intermediate structure during a process of forming a FeFET device showing a dielectric material spacer layer 325 formed over the upper surface of the second dielectric material layer 310 and over the side surfaces and bottom surfaces of the openings 312 and 313. Referring to FIG. 40, a dielectric material spacer layer 325 may be conformally deposited over the upper surface of the second dielectric material layer 310, over the side surfaces and the bottom surface of opening 312 and over the side surfaces and the bottom surface of opening 313. The dielectric material spacer layer 325 may be composed of a suitable dielectric material, such as silicon oxide, silicon nitride, and/or aluminum oxide. In some embodiments, the dielectric material spacer layer 325 may be composed of a low-k dielectric material, such as fluorinated silicon glass (FSG), hydrogen silsesquioxane (HSQ), benzocyclobutene (BCB), organic polymers (e.g., SiLK™ material from Dow Chemical Co., FLARE™ material from Allied Signal Corp., etc.), carbon-doped silicon oxide, porous silica, polymer foams, and the like. Other suitable dielectric materials are within the contemplated scope of disclosure. The dielectric material spacer layer 325 may be deposited using a suitable deposition process as described above.

Figure 41:
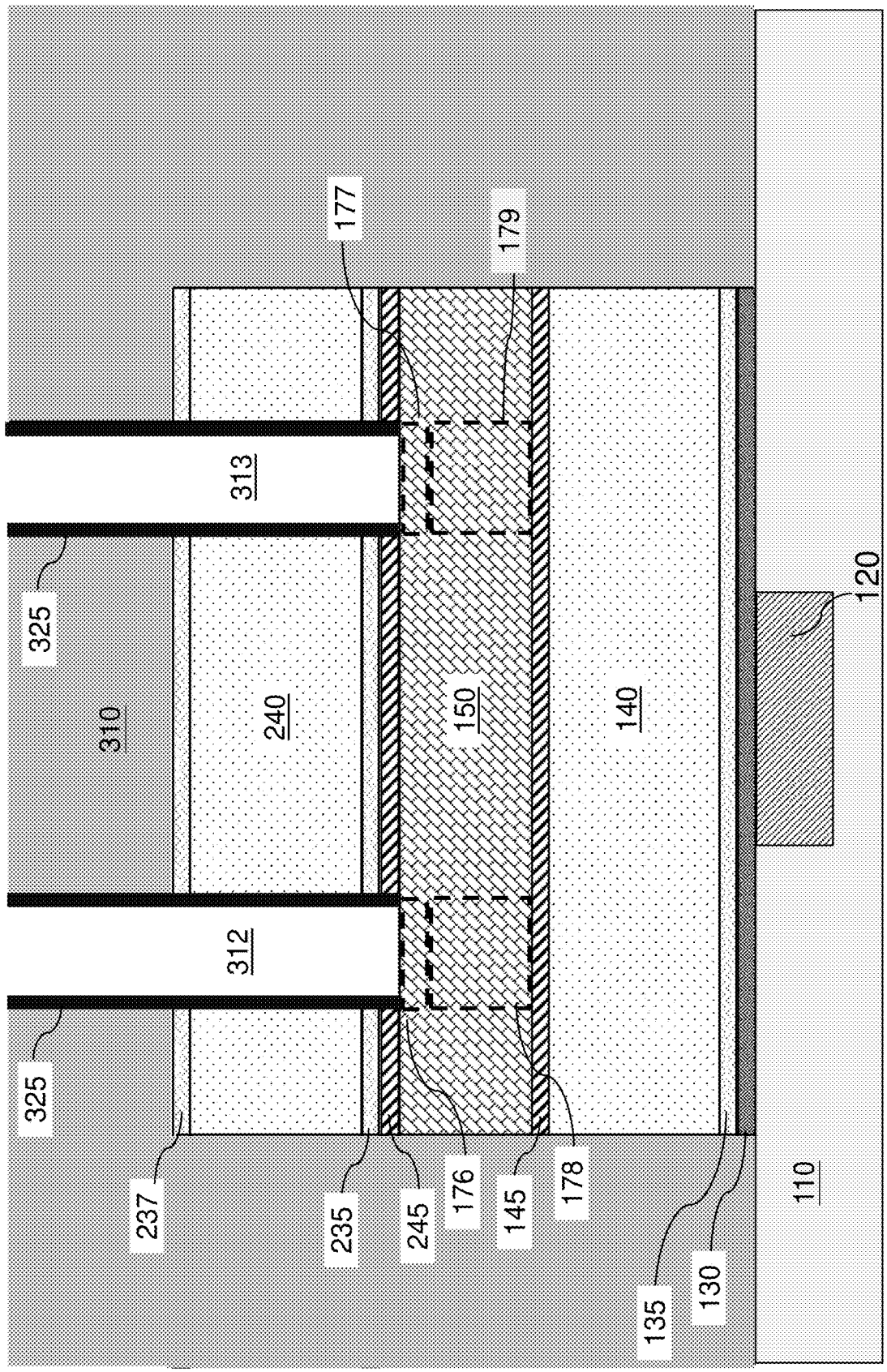
FIG. 41 is a vertical cross-section view of an exemplary intermediate structure during formation of a FeFET device following an etching process to remove portions of a dielectric material spacer layer from over the upper surface of a second dielectric material layer and bottom surfaces of openings.

FIG. 41 is a vertical cross-section view of an exemplary intermediate structure during formation of a FeFET device following an etching process to remove the dielectric material spacer layer 325 from over the upper surface of the second dielectric material layer 310 and the bottom surfaces of the openings 312 and 313. Referring to FIG. 41, an anisotropic etch process, such as a dry etch process, may be used to remove horizontally-extending portions of the dielectric material spacer layer 325 from over the upper surface of the second dielectric material layer 310 and from over the bottom surfaces of the openings 312 and 313 to expose the source region 176 and drain region 177 of the channel layer 150 at the bottom of the openings 312, 313. Following the etching process, the remaining portions of the dielectric material spacer layers 325 may be located over the vertically-extending side surfaces of the respective openings 312, 313.

Figure 42:
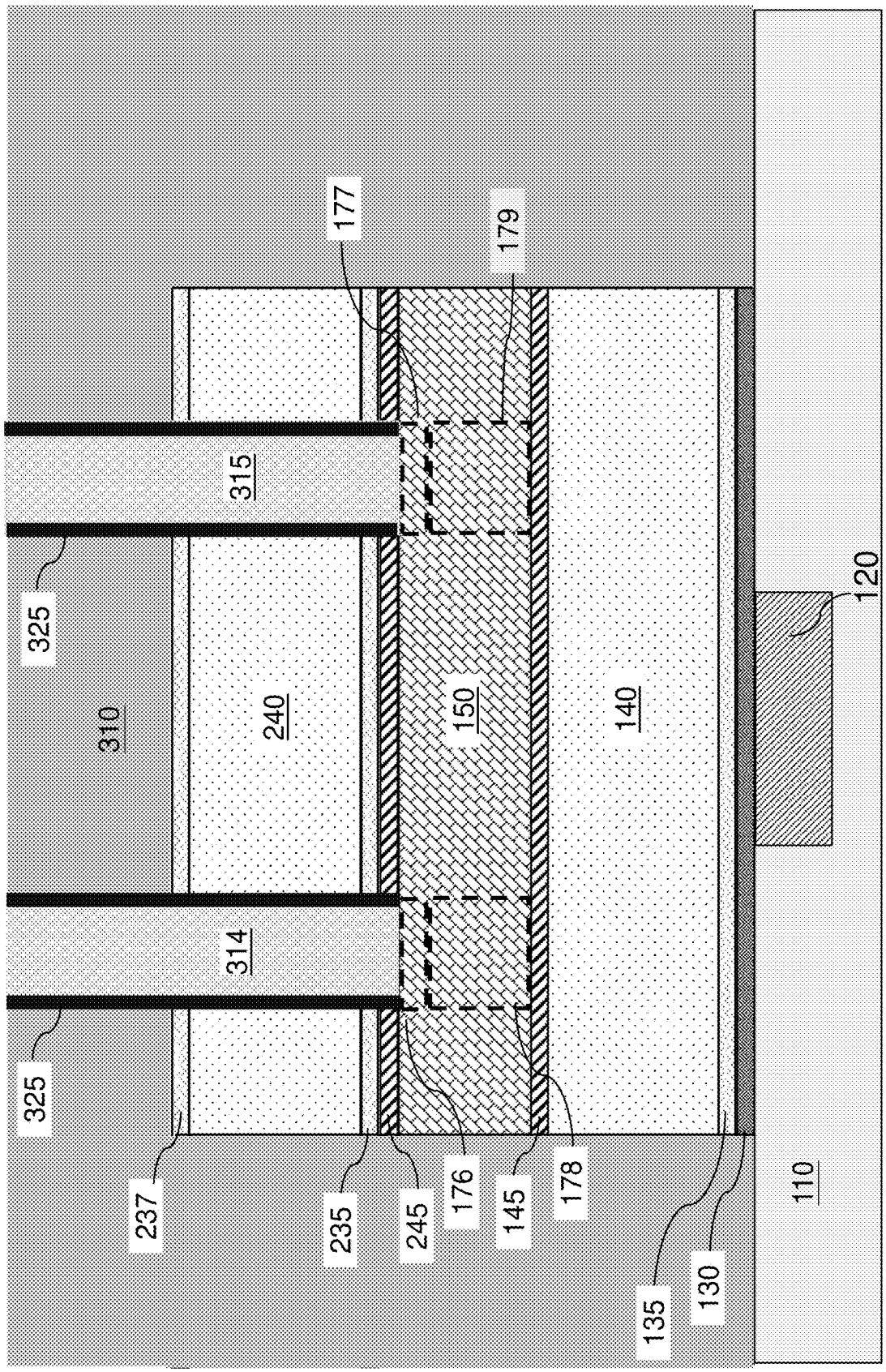
FIG. 42 is a vertical cross-section view of an exemplary intermediate structure during a process of forming a FeFET device including source and drain electrodes formed over source and drain regions of a channel layer.

FIG. 42 is a vertical cross-section view of an exemplary intermediate structure during a process of forming a FeFET device including source electrode 314 and drain electrode 315 formed over the source region 176 and drain region 177 of the channel layer 150. Referring to FIG. 42, the source electrode 314 and drain electrode 315 may include an equivalent composition and structure and may be formed using the same process as the upper source and drain electrodes 314 and 315 described above with reference to FIG. 34. Thus, repeated discussion of the source and drain electrodes 314 and 315 is omitted. As shown in FIG. 42, the source and drain electrodes 314 and 315 may each be laterally surrounded by a dielectric material spacer layer 325. The dielectric material spacer layers 325 may separate the respective source and drain electrodes 314 and 315 from the optional second insulating layer 245, the optional second seed layer 235, the second FE material layer 240 and the optional third seed layer 237.

Figure 43:
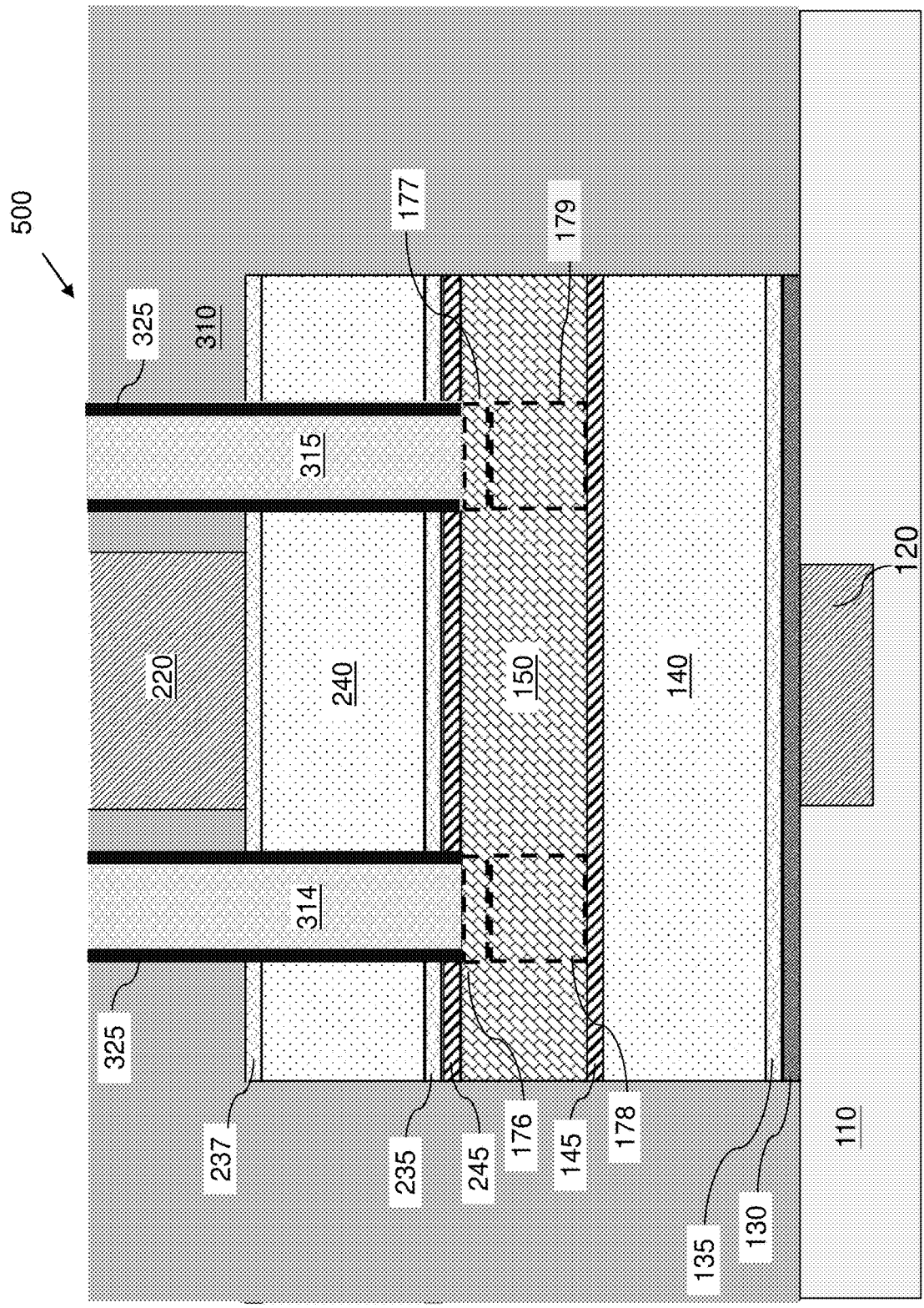
FIG. 43 is a vertical cross-section view of an exemplary structure of a FeFET device including a double-gate structure and dielectric spacer layers laterally surrounding source and drain electrodes.

FIG. 43 is a vertical cross-section view of an exemplary structure of a FeFET device 500 including an upper gate electrode 220 formed in the second dielectric material layer 310. Referring to FIG. 43, the upper gate electrode 220 may include an equivalent composition and structure and may be formed by the same process as the upper gate electrode 220 described above with reference to FIG. 35-38. Thus, repeated discussion of the upper gate electrode 220 is omitted. As shown in FIG. 43, a dielectric material spacer layer 325 may be located between the upper gate electrode 220 and each of the source and drain electrodes 314, 315.

Figure 44:
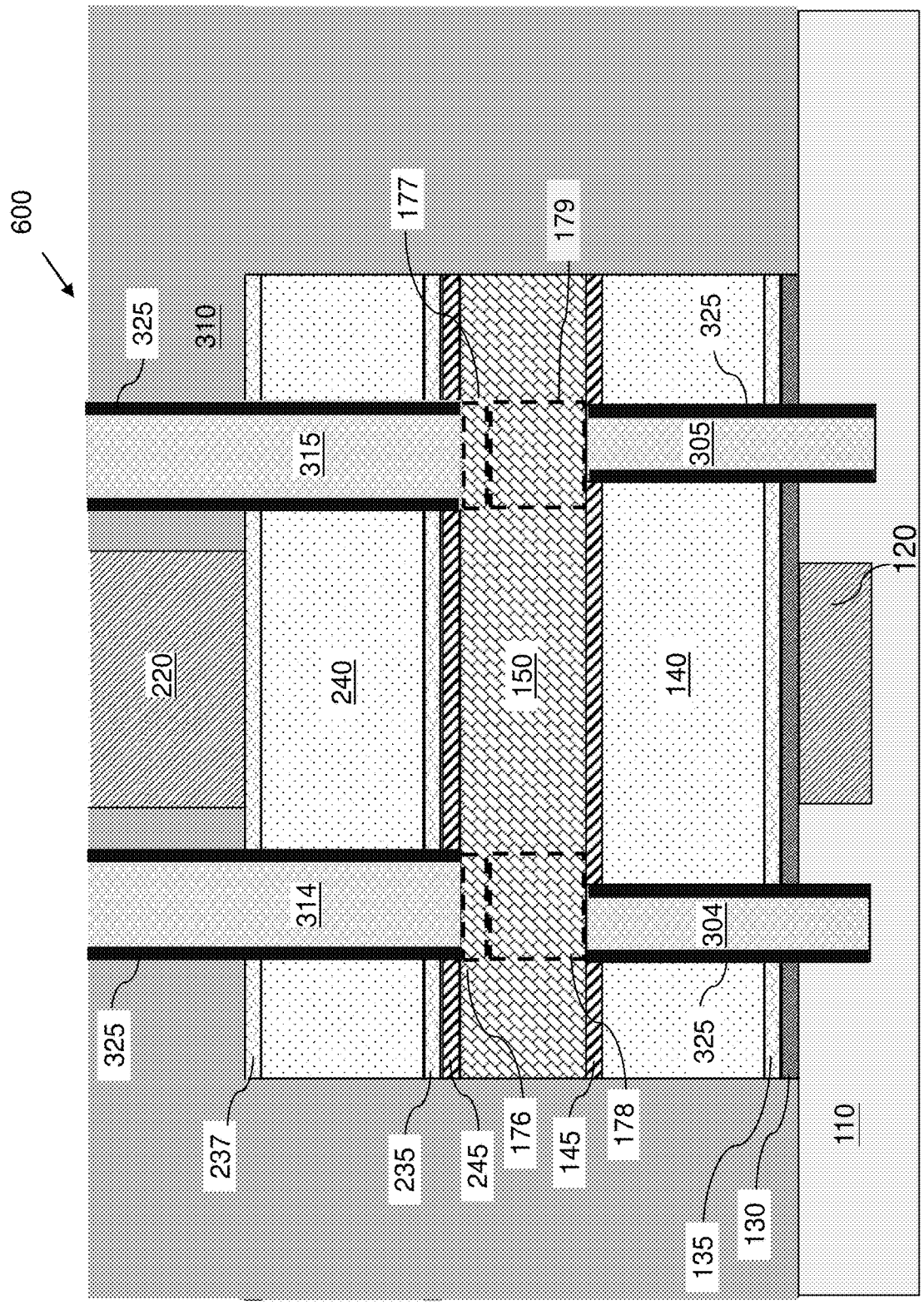
FIG. 44 is a vertical cross-section view of another embodiment exemplary structure of a FeFET device including a double-gate structure and dielectric spacer layers laterally surrounding upper source and drain electrodes and bottom source and drain electrodes.

FIG. 44 is a vertical cross-section view of an alternative exemplary structure of a double-gate FeFET device 600 including dielectric material spacer layers 325 laterally surrounding upper source and drain electrodes 314, 315 and bottom source and drain electrodes 304, 305. Referring to FIG. 44, the alternative exemplary structure of a double-gate FeFET device 600 may be derived from the exemplary intermediate structure shown in FIG. 26 by conformally depositing a dielectric material spacer layer 325 over the optional insulating layer 145 and over the side surfaces and bottom surfaces of openings 302 and 303, and performing an anisotropic etching process to remove horizontally-extending portions of the dielectric material spacer layer 325 from over the optional insulating layer 145 and the bottom surfaces of the openings 302, 303, such that the remaining portions of the dielectric material spacer layer 325 are located over the vertically-extending side surfaces of the respective openings 302 and 303. Then, the method steps illustrated in FIGS. 27-33 and 39-43 may be performed to provide a FeFET device 500 as shown in FIG. 44.

Figure 45:
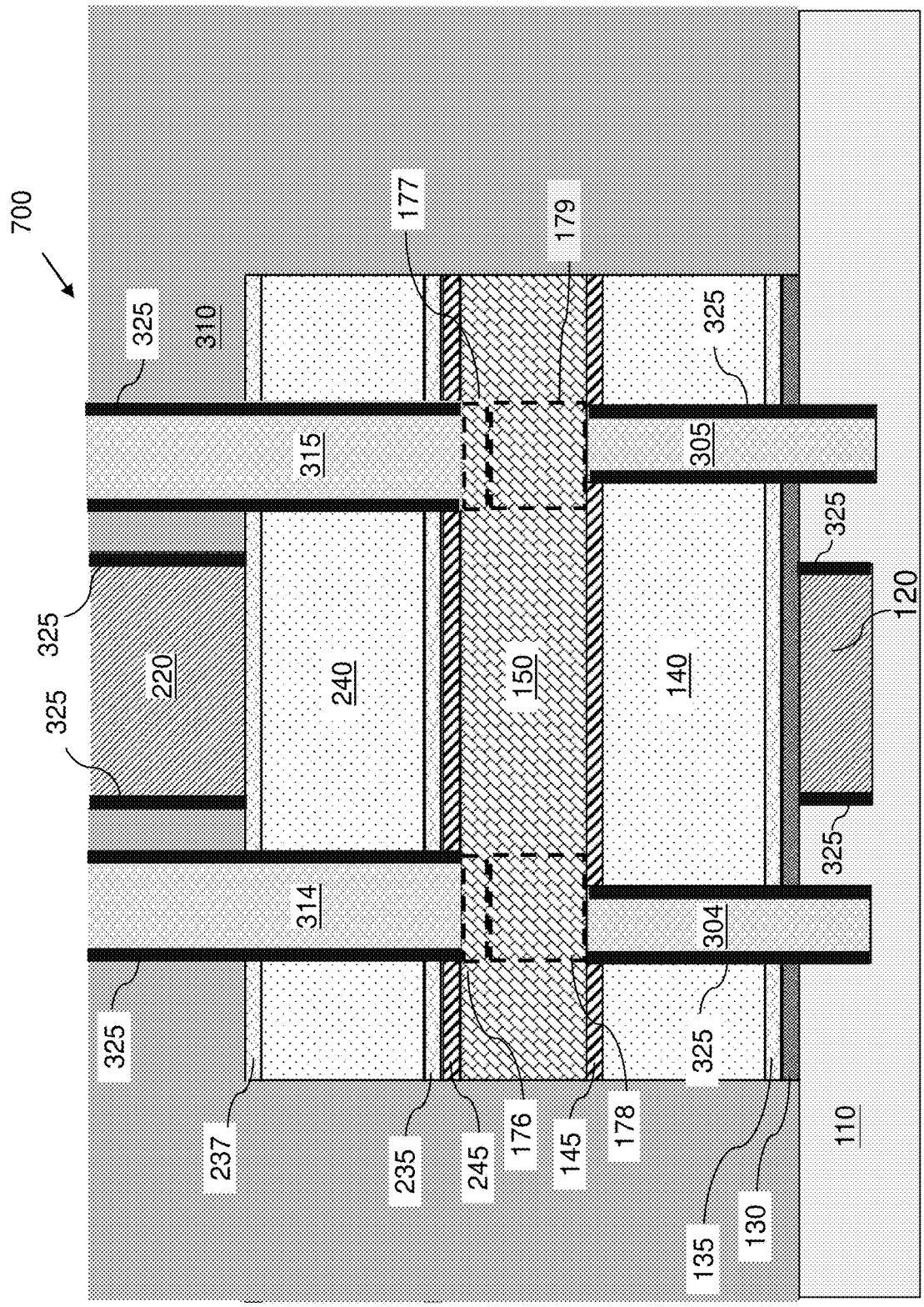
FIG. 45 is a vertical cross-section view of another embodiment exemplary structure of a FeFET device including a double-gate structure and dielectric spacer layers laterally surrounding an upper gate electrode, a bottom gate electrode, upper source and drain electrodes, and bottom source and drain electrodes.

FIG. 45 is a vertical cross-section view of an alternative exemplary structure of a double-gate FeFET device 700 including dielectric material spacer layers 325 laterally surrounding an upper gate electrode 220, upper source and drain electrodes 314, 315, a bottom gate electrode 120, and bottom source and drain electrodes 304, 305. The dielectric material spacer layers 325 laterally surrounding the upper gate electrode 220 and the bottom gate electrode 120 may be formed using the process described above with reference to FIGS. 39-44.

Figure 46:
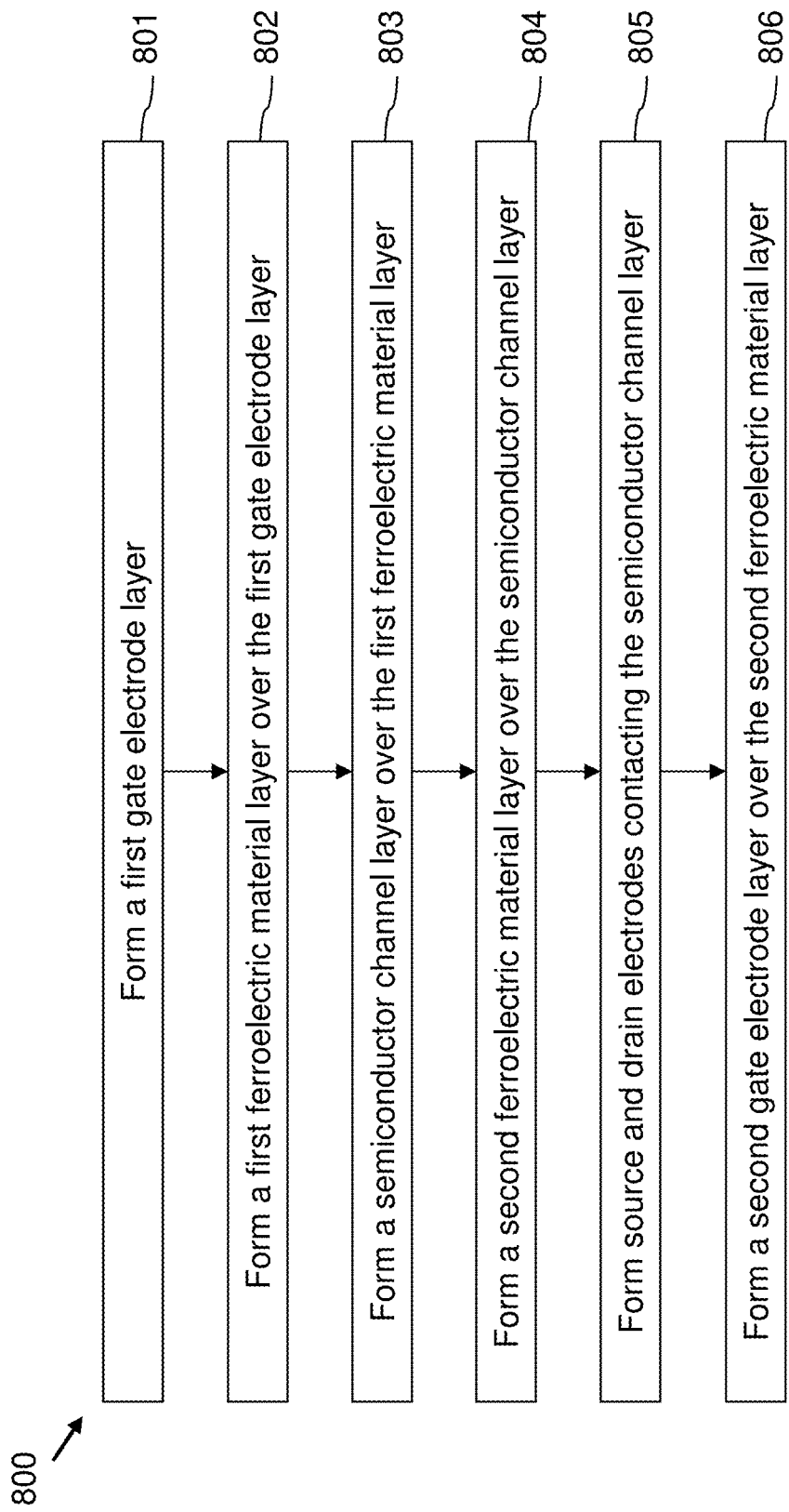
FIG. 46 is a flow chart illustrating steps of a method of forming a FeFET device having a double-gate structure according to various embodiments of the present disclosure.

FIG. 46 is a flow chart illustrating steps of a method 800 of forming a FeFET device, such as the FeFET devices 200, 300, 400, 500, 600 and 700 shown in FIGS. 21, 22, 37, 43, 44 and 45, according to various embodiments of the present disclosure. Referring to FIGS. 3 and 46, in step 801, a first gate electrode 120 may be formed. The first gate electrode 120 may be a buried electrode that is embedded within a dielectric layer. In embodiments, the first gate electrode 120 may be made of an electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same.

The first gate electrode 120 may be formed using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof.

Referring to FIGS. 6 and 46, in step 802, a first ferroelectric (FE) material layer 140 may be formed over the first gate electrode 120. In embodiments, the first FE material layer 140 may be formed directly on the first gate electrode 120. In other embodiments, one or more intervening layers 130, 135 may be disposed between the first FE material layer 140 and the first gate electrode 120. In various embodiments, the first FE material layer 140 may be hafnium oxide-based ferroelectric material, such as $Hf_xZr_{1-x}O_y$, where $0 \leq x \leq 1$ and $y>0$ (e.g., $Hf_{0.5}Zr_{0.5}O_2$), $HfO_2$, HfSiO, HfLaO, etc. In various embodiments, the first FE material layer 140 may be hafnium zirconium oxide (HZO) doped with atoms having a smaller ionic radius than hafnium (e.g., Al, Si, etc.) and/or doped with atoms having a larger ionic radius than hafnium (e.g., La, Sc, Ca, Ba, Gd, Y, Sr, etc.). The first FE material layer 140 may be deposited using any suitable deposition process, such as via atomic layer deposition (ALD).

Referring to FIGS. 8, 9, 10A, 10B, 28 and 46, in step 803, a semiconductor channel layer 150 may be formed over the first FE material layer 140. In embodiments, the semiconductor channel layer 150 may be formed directly on the first FE material layer 140. In other embodiments, one or more intervening layers 137, 145 may be disposed between the first FE material layer 140 and the semiconductor channel layer 150. In embodiments, the semiconductor channel layer 150 may be composed of an oxide semiconductor material.

The step 803 of forming the semiconductor channel layer 150 may include forming a first alternating stack 151 of first and second sublayers 152, 154, including a set of first sublayers 152 that each include a combination of a first metal oxide material, MOx, and a second metal oxide material, $M'O_x$, and a set of second sublayers 154 that include zinc oxide. In embodiments, M may at least one of indium (In) and tin (Sn), and M' may be at least one of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof.

In various embodiments, the step 803 of forming the semiconductor channel layer 150 may further include forming a third sublayer 156 over the first alternating stack 151 of first and second sublayers 152, 154. The third sublayer 156 may include a combination of a first metal oxide material, $MO_x$, a second metal oxide material, $M'O_x$, and zinc oxide, where M is one of indium (In) and tin (Sn), and M' is at least one of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof.

In various embodiments, the step 803 of forming the semiconductor channel layer 150 may further include forming a second alternating stack 153 of first and second sublayers 152, 154 over the third sublayer 156. The second alternating stack 153 may include a set of first sublayers 152 that each include a combination of a first metal oxide material, $MO_x$, and a second metal oxide material, $M'O_x$, and a set of second sublayers 154 that include zinc oxide. In embodiments, M may at least one of indium (In) and tin (Sn), and M' may be at least one of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof.

In various embodiments, the uppermost and lowermost sublayers of the semiconductor channel layer 150 may include first sublayers including a combination of a first metal oxide material, $MO_x$, and a second metal oxide material, $M'O_x$. The third sublayer 156 may contact a second sublayer 154 including zinc oxide on the upper and lower surfaces of the third sublayer 156.

Referring to FIGS. 13, 28 and 46, in step 804, a second ferroelectric (FE) material layer 240 be formed over the semiconductor channel layer 150. In embodiments, the second FE material layer 240 may be formed directly on the semiconductor channel layer 150. In other embodiments, one or more intervening layers 245, 235 may be disposed between the second FE material layer 240 and the semiconductor channel layer 150. In various embodiments, the second FE material layer 240 may be hafnium oxide-based ferroelectric material, such as $Hf_xZr_{1-x}O_y$ where $0 \le x \le 1$ and $y > 0$ (e.g., $Hf_{0.5}Zr_{0.5}O_2$), $HfO_2$, HfSiO, HfLaO, etc. In various embodiments, the second FE material layer 240 may be hafnium zirconium oxide (HZO) doped with atoms having a larger smaller ionic radius than hafnium (e.g., Al, Si, etc.) and/or doped with atoms having a smaller larger ionic radius than hafnium (e.g., La, Sc, Ca, Ba, Gd, Y, Sr, etc.). The second FE material layer 240 may be deposited using any suitable deposition process, such as via atomic layer deposition (ALD).

Referring to FIGS. 15-18, 25-27, 32-34, 39-42 and 46, in step 805, source and drain electrodes 190, 191, 314, 315, 304, 305 may be formed contacting the semiconductor channel layer 150. In embodiments, the source and drain electrodes 190, 191, 314, 315, 304, 305 may be made of an electrically conductive material, such as titanium nitride (TiN), molybdenum (Mo), copper (Cu), aluminum (Al), zirconium (Zr), titanium (Ti), tungsten (W), tantalum (Ta), tantalum nitride (TaN), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same. The source and drain electrodes 190, 191, 314, 315, 304, 305 may be deposited using any suitable deposition process, such as via atomic layer deposition (ALD).

In some embodiments, the source and drain electrodes may include upper source and drain electrodes 190, 191, 314, 315 that contact an upper surface of the semiconductor channel layer 150. The upper source and drain electrodes 190, 191, 314, 315 may extend through the second FE material layer 240. Alternatively, or in addition, the source and drain electrodes may include bottom source and drain electrodes 304, 305 that contact a bottom surface of the semiconductor channel layer 150.

In some embodiments, the source and drain electrodes 190, 191, 314, 315, 304, 305 may be laterally surrounded by a dielectric material spacer layer 325.

In some embodiments, the source and drain electrodes may include upper source and drain electrodes 190, 191, 314, 315 that contact source and drain regions 176 and 177 of the semiconductor channel layer 150. The source and drain regions 176 and 177 of the semiconductor channel layer 150 may be subjected to a helium plasma treatment prior to forming the upper source and drain electrodes 190, 191, 314, 315.

Referring to FIGS. 19-21, 35-37, 43 and 46, in step 806, a second gate electrode 220 may be formed over the second FE material layer 240. In embodiments, the second gate electrode 220 may be formed directly on the second FE material layer 240. In other embodiments, one or more intervening layers 237 may be disposed between the second gate electrode 220 and the second FE material layer 240. In embodiments, the second gate electrode 220 may be made of an electrically conductive material, such as copper (Cu), aluminum (Al), zirconium (Zr), titanium (Ti), titanium nitride (TiN), tungsten (W), tantalum (Ta), tantalum nitride (TaN), molybdenum (Mo), ruthenium (Ru), palladium (Pd), platinum (Pt), cobalt (Co), nickel (Ni), iridium (Ir), iron (Fe), beryllium (Be), chromium (Cr), antimony (Sb), osmium (Os), thorium (Th), vanadium (V), alloys thereof, and combinations of the same.

The second gate electrode 220 may be formed using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), or combinations thereof.

Referring to all drawings and according to various embodiments of the present disclosure, a semiconductor structure 200, 300, 400, 500, 600, 700 includes a first gate electrode 120, a first ferroelectric material layer 140 over the first gate electrode 120, a semiconductor channel layer 150 over the first ferroelectric material layer 140, source and drain electrodes 190, 191, 304, 305, 314, 315 contacting the semiconductor channel layer 150, a second ferroelectric material layer 240 over the semiconductor channel layer, and a second gate electrode 220 over the second ferroelectric material layer 240.

In an embodiment, the source and drain electrodes include an upper source electrode 190, 314 that extends through the second ferroelectric material layer 240 and contacts an upper surface of the semiconductor channel layer 150, and an upper drain electrode 191,315 that extends through the second ferroelectric material layer 240 and contacts the upper surface of the semiconductor channel layer 150.

In another embodiment, each of the upper source electrode 190, 314 and the upper drain electrode 191, 315 are laterally surrounded by a dielectric material spacer layer 325.

In another embodiment, the semiconductor structure further includes a first dielectric material layer 110 that underlies the first ferroelectric material layer 140 and laterally surrounds the first gate electrode 120, and a second dielectric material layer 180, 310 over the second ferroelectric material layer 240 and laterally surrounding the second gate electrode 220, the upper source electrode 190, 314 and the upper drain electrode 191, 315 extending through the second dielectric material layer 180, 310.

In another embodiment, the source electrode and drain electrode further include a bottom source electrode 304 that extends from the first dielectric material layer 110 through the first ferroelectric material layer 140 and contacts a bottom surface of the semiconductor channel layer 150, and a bottom drain electrode 305 that extends from the first dielectric material layer 110 through the first ferroelectric material layer 140 and contacts the bottom surface of the semiconductor channel layer 150.

In another embodiment, each of the bottom source electrode 304 and the bottom drain electrode 305 are laterally surrounded by a dielectric material spacer layer 325.

In another embodiment, the semiconductor channel layer 150 includes an oxide semiconductor material having a formula $M_xM'_yZn_zO$ where $0<(x, y, z)<1$, M is a first metal selected from a group consisting of indium (In) and tin (Sn) and combinations thereof, M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof.

In another embodiment, the first ferroelectric material layer 140 and the second ferroelectric material layer 240 include hafnium oxide-based ferroelectric materials.

In another embodiment, at least one of a seed layer 135 and a stress layer 130 are located between the first gate electrode 120 and a bottom surface of the first ferroelectric material layer 140.

In another embodiment, at least one of a seed layer 137 and an insulating layer 145 are located between an upper surface of the first ferroelectric material layer 140 and a bottom surface of the semiconductor channel layer 150, and at least one of an insulating layer 245 and a seed layer 235 are located between an upper surface of the semiconductor channel layer 150 and a bottom surface of the second ferroelectric material layer 240.

In another embodiment, a seed layer 237 may be located between an upper surface of the second ferroelectric material layer 240 and a bottom surface of the second gate electrode 220.

In another embodiment, the first gate electrode 120 and the second gate electrode 220 are coupled to a common voltage in a common gate control mode.

In another embodiment, the first gate electrode 120 and the second gate electrode 220 are coupled to different voltages in a separated gate control mode.

An additional embodiment is drawn to a semiconductor structure including a gate electrode 120, 220, a semiconductor channel layer 150, where the semiconductor channel layer 150 includes a first alternating stack 151 of first and second sublayers 152, 154, the first sublayers 152 having a different composition than the second sublayers 154, a third sublayer 156 over the first alternating stack 151 of first and second sublayers 152, 154, the third sublayer 156 having a different composition than the first sublayers 152 and the second sublayers 154, and a second alternating stack 153 of the first and second sublayers 152, 154 over the third sublayer 156, where each of the first sublayers 152 of the first alternating stack 151 and the second alternating stack 153 includes a combination of a first metal oxide material, $MO_x$, and a second metal oxide material, $M'O_x$, and each second sublayer 154 of the first alternating stack 151 and the second alternating stack 153 includes zinc oxide, and the third sublayer 156 includes a combination of a first metal oxide material $MO_x$, a second metal oxide material, $M'O_x$, and zinc oxide, and where M is a first metal selected from a group consisting of indium (In) and tin (Sn) and combinations thereof, and M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof, a ferroelectric material layer 140, 240 located between the gate electrode 120, 220 and a surface of the semiconductor channel layer 150, and source and drain electrodes 190, 191, 304, 305, 314, 315 contacting the semiconductor channel layer 150.

In an embodiment, a lowermost sublayer of the semiconductor channel layer 150 is a first sublayer 152 of the first alternating stack 151 of first sublayers 152 and second sublayers 154, and an uppermost sublayer of the semiconductor channel layer 150 is a first sublayer 152 of the second alternating stack 153 of first sublayers 152 and second sublayers 154, and wherein the third sublayer 156 is contacted by a second sublayer 154 of the second alternating stack 153 of first sublayers 152 and second sublayers 154 on an upper surface of the third sublayer 156, and the third sublayer 156 is contacted by a second sublayer 154 of the first alternating stack 151 of first sublayers 152 and second sublayers 154 on a bottom surface of the third sublayer 156.

In another embodiment, the gate electrode is a first gate electrode 120 and the ferroelectric material layer is a first ferroelectric material layer 140 located between the first gate electrode 120 and a first surface of the semiconductor channel layer 150, and the semiconductor structure further includes a second gate electrode 220, and a second ferroelectric material layer 240 located between the second gate electrode 220 and a second surface of the semiconductor channel layer 150.

An additional embodiment is drawn to a method of fabricating a semiconductor structure that includes forming a first gate electrode 120, forming a first ferroelectric material layer 140 over the first gate electrode 120, forming a semiconductor channel layer 150 over the first ferroelectric material layer 140, forming source and drain electrodes 190, 191, 304, 305, 314, 315 contacting the semiconductor channel layer 150, forming a second ferroelectric material layer 240 over the semiconductor channel layer, and forming a second gate electrode 220 over the second ferroelectric material layer 240.

In an embodiment, forming source and drain electrodes contacting the semiconductor channel layer includes forming upper source and drain electrodes 190, 191, 314, 315 contacting an upper surface of the semiconductor channel layer 150, the method further including forming bottom source and drain electrodes 304, 305 contacting a bottom surface of the semiconductor channel layer 150.

In another embodiment, the method further includes forming dielectric material spacer layers 325 laterally surrounding at least one of the upper source and drain electrodes 190, 191, 314, 315 and the bottom source and drain electrodes 304, 305.

In another embodiment, forming the semiconductor channel layer 150 includes forming a first alternating stack 151 of first and second sublayers 152, 154 including a set of first sublayers 152 that each include a combination of a first metal oxide material, $MO_x$, and a second metal oxide material, $M'O_x$, and a set of second sublayers 154 including zinc oxide, forming a third sublayer 156 over the first alternating stack 151, where the third sublayer 156 includes a combination of a first metal oxide material, $MO_x$, a second metal oxide material, $M'O_x$, and zinc oxide, and forming a second alternating stack 153 of first and second sublayers 152, 154 over the third sublayer 156 including a set of first sublayers 152 that each include a combination of a first metal oxide material, $MO_x$, and a second metal oxide material, $M'O_x$, and a set of second sublayers 154 including zinc oxide, where M is a first metal selected from a group consisting of indium (In) and tin (Sn) and combinations thereof, M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A semiconductor structure, comprising:
 a first gate electrode;
 a first ferroelectric material layer over the first gate electrode;
 a seed layer over the first ferroelectric material layer;
 a semiconductor channel layer over the seed layer;
 source and drain electrodes contacting the semiconductor channel layer;
 a second ferroelectric material layer over the semiconductor channel layer; and
 a second gate electrode over the second ferroelectric material layer, wherein the first ferroelectric material layer, the seed layer, the semiconductor channel layer, and the second ferroelectric material layer each have a width dimension that is greater than a width dimension of the first gate electrode.

2. The semiconductor structure of claim 1, wherein the source and drain electrodes comprise:
 an upper source electrode that extends through the second ferroelectric material layer and contacts an upper surface of the semiconductor channel layer; and
 an upper drain electrode that extends through the second ferroelectric material layer and contacts the upper surface of the semiconductor channel layer.

3. The semiconductor structure of claim 2, wherein each of the upper source electrode and the upper drain electrode are laterally surrounded by a dielectric material spacer layer.

4. The semiconductor structure of claim 2, further comprising:
 a first dielectric material layer that underlies the first ferroelectric material layer and laterally surrounds the first gate electrode; and
 a second dielectric material layer over the second ferroelectric material layer and laterally surrounding the second gate electrode, the upper source electrode and the upper drain electrode extending through the second dielectric material layer.

5. The semiconductor structure of claim 4, wherein the source and drain electrodes further comprise:
 a bottom source electrode that extends from the first dielectric material layer through the first ferroelectric material layer and the seed layer and contacts a bottom surface of the semiconductor channel layer; and
 a bottom drain electrode that extends from the first dielectric material layer through the first ferroelectric material layer and the seed layer and contacts the bottom surface of the semiconductor channel layer.

6. The semiconductor structure of claim 5, wherein each of the bottom source electrode and the bottom drain electrode are laterally surrounded by a dielectric material spacer layer.

7. The semiconductor structure of claim 1, wherein the semiconductor channel layer comprises an oxide semiconductor material having a formula $M_xM'_yZn_zO$ where $0<(x, y, z)<1$, M is a first metal selected from a group consisting of indium (In) and tin (Sn) and combinations thereof, M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof.

8. The semiconductor structure of claim 1, wherein the first ferroelectric material layer and the second ferroelectric material layer comprise hafnium oxide-based ferroelectric materials.

9. The semiconductor structure of claim 1, wherein at least one of an additional seed layer and a stress layer are located between the first gate electrode and a bottom surface of the first ferroelectric material layer.

10. The semiconductor structure of claim 1, wherein an insulating layer is located between an upper surface of the seed layer and a bottom surface of the semiconductor channel layer, and at least one of an insulating layer and an additional seed layer are located between an upper surface of the semiconductor channel layer and a bottom surface of the second ferroelectric material layer.

11. The semiconductor structure of claim 1, further comprising an additional seed layer located between an upper surface of the second ferroelectric material layer and a bottom surface of the second gate electrode.

12. The semiconductor structure of claim 1, wherein the seed layer comprises at least one of zirconium oxide ($ZrO_2$), zirconium-yttrium oxide ($ZrO_2$—$Y_2O_3$), hafnium oxide ($HfO_2$), aluminum oxide ($Al_2O_3$), and hafnium zirconium oxide ($Hf_xZr_{1-x}O_2$, where $0 \leq x \leq 1$).

13. The semiconductor structure of claim 12, wherein the seed layer has a thickness of 5 nm or less.

14. A semiconductor structure, comprising:
 a gate electrode;
 a dielectric material layer surrounding the gate electrode, the dielectric material layer having an upper surface that is coplanar with an upper surface of the gate electrode;
 a semiconductor channel layer, wherein the semiconductor channel layer comprises:
  a first alternating stack of first sublayers and second sublayers, the first sublayers having a different composition than the second sublayers,
  a third sublayer over the first alternating stack of first and second sublayers, the third sublayer having a different composition than the first sublayers and the second sublayers, and a second alternating stack of the first sublayers and the second sublayers over the third sublayer, wherein each of the first sublayers of the first alternating stack and the second alternating stack comprises a combination of a first metal oxide material, $MO_x$, and a second metal oxide material, $M'O_x$, and each second sublayer of the first alternating stack and the second alternating stack comprises zinc oxide, and the third sublayer comprises a combination of a first metal oxide material, $MO_x$, a second metal oxide material, $M'O_x$, and zinc oxide, and wherein M is a first metal selected from a group consisting of indium (In) and tin (Sn) and combinations thereof, and M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof;
 a ferroelectric material layer located between the gate electrode and a surface of the semiconductor channel layer;
 a seed layer located between the ferroelectric material layer and the surface of the semiconductor channel layer, wherein the semiconductor channel layer, the ferroelectric material layer and the seed layer extend over the upper surface of the dielectric material layer; and source and drain electrodes contacting the semiconductor channel layer.

15. The semiconductor structure of claim 14, wherein a lowermost sublayer of the semiconductor channel layer is a first sublayer of the first alternating stack of first sublayers and second sublayers, and an uppermost sublayer of the semiconductor channel layer is a first sublayer of the second alternating stack of first sublayers and second sublayers, and wherein the third sublayer is contacted by a second sublayer of the second alternating stack of first sublayers and second sublayers on an upper surface of the third sublayer, and the third sublayer is contacted by a second sublayer of the first alternating stack of first sublayers and second sublayers on a bottom surface of the third sublayer.

16. The semiconductor structure of claim 14, wherein the gate electrode comprises a first gate electrode and the ferroelectric material layer comprises a first ferroelectric material layer located between the first gate electrode and a first surface of the semiconductor channel layer, the semiconductor structure further comprising:
a second gate electrode; and
a second ferroelectric material layer located between the second gate electrode and a second surface of the semiconductor channel layer.

17. A method of fabricating a semiconductor structure, comprising:
forming a first gate electrode;
forming a first ferroelectric material layer over the first gate electrode;
forming a seed layer over the first ferroelectric material layer;
forming a semiconductor channel layer over the seed layer;
forming a second ferroelectric material layer over the semiconductor channel layer;
removing, via an etching process, portions of the second ferroelectric material layer, the semiconductor channel layer, the seed layer, and the first ferroelectric material layer to provide a multilayer structure comprising the first ferroelectric material layer, the semiconductor channel layer, and the second ferroelectric material layer over the first gate electrode, wherein a width dimension of the multilayer structure is greater than a width dimension of the first gate electrode;
forming source and drain electrodes contacting the semiconductor channel layer; and
forming a second gate electrode over the second ferroelectric material layer.

18. The method of claim 17, wherein forming source and drain electrodes contacting the semiconductor channel layer comprises forming upper source and drain electrodes contacting an upper surface of the semiconductor channel layer, the method further comprising:
forming bottom source and drain electrodes contacting a bottom surface of the semiconductor channel layer.

19. The method of claim 18, further comprising:
forming dielectric material spacer layers laterally surrounding at least one of the upper source and drain electrodes and the bottom source and drain electrodes.

20. The method of claim 17, wherein forming the semiconductor channel layer comprises:
forming a first alternating stack of first and second sublayers including a set of first sublayers that each include a combination of a first metal oxide material, $MO_x$, and a second metal oxide material, $M'O_x$, and a set of second sublayers including zinc oxide;
forming a third sublayer over the first alternating stack, wherein the third sublayer includes a combination of a first metal oxide material, $MO_x$, a second metal oxide material, $M'O_x$, and zinc oxide; and
forming a second alternating stack of first and second sublayers over the third sublayer including a set of first sublayers that each include a combination of a first metal oxide material, $MO_x$, and a second metal oxide material, $M'O_x$, and a set of second sublayers including zinc oxide, wherein M is a first metal selected from a group consisting of indium (In) and tin (Sn) and combinations thereof, M' is a second metal selected from a group consisting of gallium (Ga), hafnium (Hf), zirconium (Zr), titanium (Ti), aluminum (Al), strontium (Sr), barium (Ba), scandium (Sc), magnesium (Mg), lanthanum (La), gadolinium (Gd), and combinations thereof.

* * * * *